US012795933B2

(12) United States Patent
Kwon et al.

(10) Patent No.: US 12,795,933 B2

(45) Date of Patent: Nov. 10, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Joonyoung Kwon, Suwon-si (KR); Jiyoung Kim, Suwon-si (KR); Junhyoung Kim, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 507 days.

(21) Appl. No.: 18/308,222

(22) Filed: Apr. 27, 2023

(65) Prior Publication Data

US 2024/0099012 A1 Mar. 21, 2024

(30) Foreign Application Priority Data

Sep. 20, 2022 (KR) ........................ 10-2022-0118712

(51) Int. Cl.

| | |
|---|---|
| ***H10B 43/40*** | (2023.01) |
| ***H10B 41/27*** | (2023.01) |
| ***H10B 41/41*** | (2023.01) |
| ***H10B 43/27*** | (2023.01) |
| ***H10B 80/00*** | (2023.01) |

(52) U.S. Cl.

CPC ............ *H10B 43/40* (2023.02); *H10B 41/27* (2023.02); *H10B 41/41* (2023.02); *H10B 43/27* (2023.02); *H10B 80/00* (2023.02)

(58) Field of Classification Search

CPC ........ H10B 43/40; H10B 41/27; H10B 41/41; H10B 43/27; H10B 80/00; H10B 43/50; H10B 43/10; H10B 41/50; H10B 41/35; H10B 41/40; H10B 43/35; H10B 51/20; H10B 53/20; H10B 20/40–65; H10B 41/20; H10B 43/20; H10B 63/84

See application file for complete search history.

(56) References Cited

U.S. PATENT DOCUMENTS

| | | | |
|---|---|---|---|
| 10,903,229 | B2 | 1/2021 | Baek et al. |
| 11,024,600 | B2 | 6/2021 | Liu et al. |

(Continued)

OTHER PUBLICATIONS

Extended European Search Report corresponding to EP 23191965.5; dated Feb. 14, 2024, (11 pages).

*Primary Examiner* — Cuong B Nguyen

(74) *Attorney, Agent, or Firm* — Wolf, Greenfield & Sacks, P.C.

(57) ABSTRACT

A semiconductor device includes a peripheral circuit structure including a plurality of circuit areas, a cell array structure including a pair of memory cell blocks overlapping the peripheral circuit structure in a first direction and spaced apart in a second direction, perpendicular to the first direction, with a peripheral circuit connection area therebetween, a first circuit area of the plurality of circuit areas that overlaps the peripheral circuit connection area in the first direction, and at least one contact plug extending in the first direction from the peripheral circuit connection area, and including a first end portion configured to connect to at least one circuit included in the first circuit area and facing the first circuit area and a second end portion configured to connect to an external connection terminal.

19 Claims, 49 Drawing Sheets

(56) References Cited

U.S. PATENT DOCUMENTS

| | | | | |
|---|---|---|---|---|
| 11,063,056 | B2 | 7/2021 | Oh | |
| 11,211,328 | B2 | 12/2021 | Oh et al. | |
| 2015/0129878 | A1* | 5/2015 | Shin | H10B 41/20 257/329 |
| 2016/0163386 | A1* | 6/2016 | Hwang | G11C 16/0466 365/185.12 |
| 2020/0066742 | A1* | 2/2020 | Kim | H10B 43/50 |
| 2020/0144242 | A1 | 5/2020 | Park | |
| 2021/0035965 | A1* | 2/2021 | Mizutani | H10B 43/27 |
| 2021/0043639 | A1 | 2/2021 | Yun et al. | |
| 2022/0102306 | A1 | 3/2022 | Ahn et al. | |
| 2022/0130782 | A1 | 4/2022 | Ahn et al. | |
| 2022/0173060 | A1 | 6/2022 | Ahn et al. | |

* cited by examiner

II-II'

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0118712, filed on Sep. 20, 2022, in the Korean Intellectual Property Office, the disclosure of which is incorporated by reference herein in its entirety.

BACKGROUND

The inventive concept relates to a semiconductor device and an electronic system including the same, and more particularly, to a semiconductor device including a nonvolatile vertical memory device and an electronic system including the same.

In an electronic system that requires data storage, a semiconductor device capable of storing high-capacity data may be required, and accordingly, techniques of increasing the data storage capacity of semiconductor devices are being studied. For example, as one of the techniques for increasing the data storage capacity of semiconductor devices, a semiconductor device including a vertical memory device having three-dimensionally memory cells instead of two-dimensionally arranged memory cells has been proposed.

SUMMARY

The inventive concept provides a semiconductor device having a structure that may contribute to improving the degree of integration of the semiconductor device by effectively utilizing idle spaces generated when the number of stacked word lines is increased. This may improve the degree of integration in a semiconductor device having three-dimensionally arranged memory cells.

The inventive concept also provides an electronic system including a semiconductor device having a structure that may contribute to improving the degree of integration of the semiconductor device by effectively utilizing idle spaces generated when the number of stacked word lines is increased. This may improve the degree of integration in a semiconductor device having three-dimensionally arranged memory cells.

According to an aspect of the inventive concept, there is provided a semiconductor device including a peripheral circuit structure including a plurality of circuit areas, a cell array structure including a pair of memory cell blocks overlapping the peripheral circuit structure in a first direction and spaced apart in a second direction, perpendicular to the first direction, with the peripheral circuit connection area therebetween, a first circuit area of the plurality of circuit areas that overlaps the peripheral circuit connection area in the first direction, and at least one contact plug extending in the first direction from the peripheral circuit connection area, and including a first end portion configured to connect to at least one circuit included in the first circuit area and facing the first circuit area and a second end portion configured to connect to an external connection terminal.

According to another aspect of the inventive concept, there is provided a semiconductor device including a peripheral circuit structure, and a cell array structure overlapping the peripheral circuit structure in a first direction, wherein the peripheral circuit structure includes a data input/output circuit area extending, from a center area in a second direction of the peripheral circuit structure, along a third direction orthogonal to the second direction, the first direction being orthogonal to the first and second directions, wherein the cell array structure includes a peripheral circuit connection area overlapping the data input/output circuit area in the first direction, a first memory cell block and a second memory cell block spaced apart in the second direction with the peripheral circuit connection area therebetween, and a plurality of contact plugs extending in the first direction from the peripheral circuit connection area, and including a first end portion configured to connect to at least one circuit included in the data input/output circuit area and facing the data input/output circuit area and a second end portion configured to connect to an external connection terminal.

According to another aspect of the inventive concept, there is provided an electronic system including a main board, a semiconductor device on the main board, and a controller electrically connected to the semiconductor device on the main board, wherein the semiconductor device includes a peripheral circuit structure including a plurality of circuit areas, a cell array structure including a pair of memory cell blocks overlapping the peripheral circuit structure in a first direction and spaced apart in a second direction, perpendicular to the first direction, with the peripheral circuit connection area therebetween, a first circuit area of the plurality of circuit areas and that overlaps the peripheral circuit connection area in the first direction, and at least one contact plug extending in the first direction from the peripheral circuit connection area, and including a first end portion configured to connect to at least one circuit included in the first circuit area and facing the first circuit area and a second end portion configured to connect to an external connection terminal.

BRIEF DESCRIPTION OF THE DRAWINGS

Embodiments of the inventive concept will be more clearly understood from the following detailed description taken in conjunction with the accompanying drawings in which:

FIGS. 21A to 30 are cross-sectional views illustrating a method of manufacturing a semiconductor device according to other embodiments of the inventive concept, FIGS. 21A, 22A, 23A, 24A, 25, 26, 27A, 28, 29, and 30 are cross-sectional views according to a process sequence of a connection area and a peripheral circuit connection area of a cell array structure, and partial areas of each of peripheral circuit structures overlapping the connection area and the peripheral circuit connection area in a vertical direction.

DETAILED DESCRIPTION OF THE EMBODIMENTS

Figure 1:
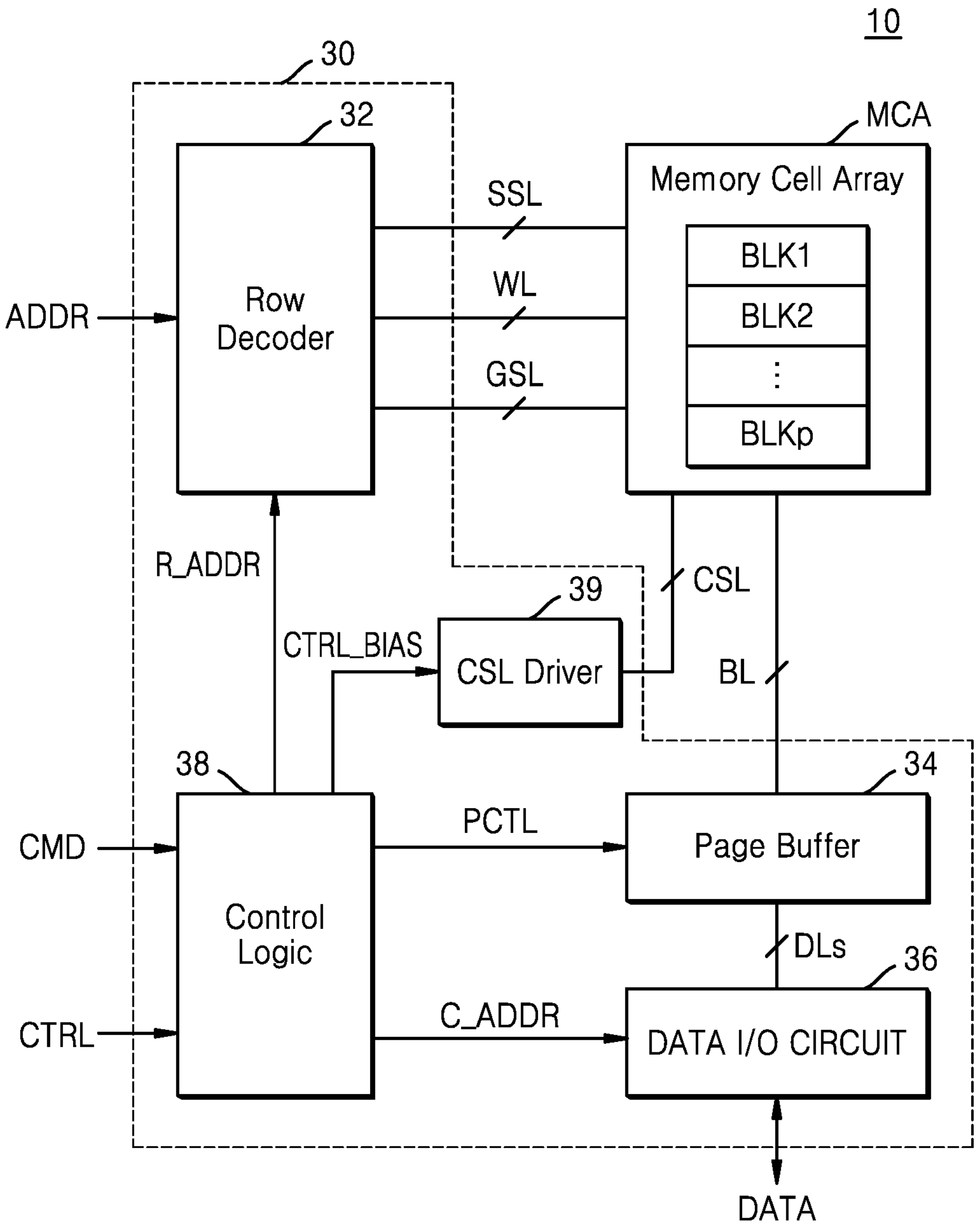
FIG. 1 is a block diagram of a semiconductor device according to example embodiments of the inventive concept.

Hereinafter, embodiments of the inventive concept will be described in detail with reference to the accompanying drawings. The same reference numerals are used for the same components in the drawings, and duplicate descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of a semiconductor device 10 according to embodiments according to the inventive concept.

Referring to FIG. 1, the semiconductor device 10 may include a memory cell array MCA and a peripheral circuit 30. The memory cell array MCA includes a plurality of memory cell blocks BLK1, BLK2, . . . , BLKp. Each of the plurality of memory cell blocks BLK1, BLK2, . . . , BLKp may include a plurality of memory cells. The memory cell blocks BLK1, BLK2, . . . , BLKp may be connected to the peripheral circuit 30 through a bit line BL, a word line WL, a string select line SSL, and a ground select line GSL.

The peripheral circuit 30 may include a row decoder 32, a page buffer 34, a data input/output (I/O) circuit 36, a control logic 38, and a common source line driver 39. The peripheral circuit 30 may further include various circuits, such as a voltage generation circuit, for generating various voltages used in the operation of the semiconductor device 10, an error correction circuit for correcting errors in data read from the memory cell array MCA, and an input/output interface.

The memory cell array MCA may be connected to the row decoder 32 through the word line WL, the string select line SSL, and the ground select line GSL, and may be connected to the page buffer 34 through the bit line BL. In the memory cell array MCA, each of the plurality of memory cells included in the plurality of memory cell blocks BLK1, BLK2, . . . , BLKp may be a flash memory cell. The memory cell array MCA may include a three-dimensional memory cell array. The three-dimensional memory cell array may include a plurality of NAND strings, and each of the plurality of NAND strings may include a plurality of memory cells connected to a plurality of vertically stacked word lines WL.

The peripheral circuit 30 may receive an address ADDR, a command CMD, and a control signal CTRL from an external source that is outside of the semiconductor device 10, and may transmit/receive data DATA to and from an external device of the semiconductor device 10.

The row decoder 32 may select at least one of the plurality of memory cell blocks BLK1, BLK2, . . . , BLKp in response to an address ADDR from the outside, and may select a word line WL, a string select line SSL, and a ground select line GSL of the selected memory cell block. The row decoder 32 may transmit a voltage for performing a memory operation corresponding to the word line WL of the selected memory cell block.

The page buffer 34 may be connected to the memory cell array MCA through the bit line BL. The page buffer 34 may operate as a write driver during a program operation to apply a voltage according to the data DATA to be stored in the memory cell array MCA to the bit line BL, and may operate as a sense amplifier during a read operation to sense data DATA stored in the memory cell array MCA. The page buffer 34 may operate according to a control signal PCTL provided from the control logic 38.

The data I/O circuit 36 may be connected to the page buffer 34 through a plurality of data lines DLs. The data I/O circuit 36 may receive data DATA from a memory controller (not shown) during a program operation, and may provide the program data DATA to the page buffer 34 based on the column address C_ADDR provided from the control logic 38. The data I/O circuit 36 may provide the read data DATA stored in the page buffer 34 to the memory controller based on the column address C_ADDR provided from the control logic 38 during a read operation.

The data I/O circuit 36 may transmit an input address or command to the control logic 38 or the row decoder 32. The peripheral circuit 30 may further include an Electro Static Discharge (ESD) circuit and a pull-up/pull-down driver.

The control logic 38 may receive a command CMD and a control signal CTRL from the memory controller. The control logic 38 may provide the row address R_ADDR to the row decoder 32 and provide the column address C_ADDR to the data I/O circuit 36. The control logic 38 may generate various internal control signals used in the semiconductor device 10 in response to the control signal CTRL. For example, the control logic 38 may adjust the voltage level provided to the word line WL and the bit line BL when a memory operation, such as a program operation or an erase operation, is performed.

The common source line driver 39 may be connected to the memory cell array MCA through a common source line CSL. The common source line driver 39 may apply a common source voltage (e.g., a power supply voltage) or a ground voltage to the common source line CSL based on the control signal CTRL_BIAS of the control logic 38.

Figure 2:
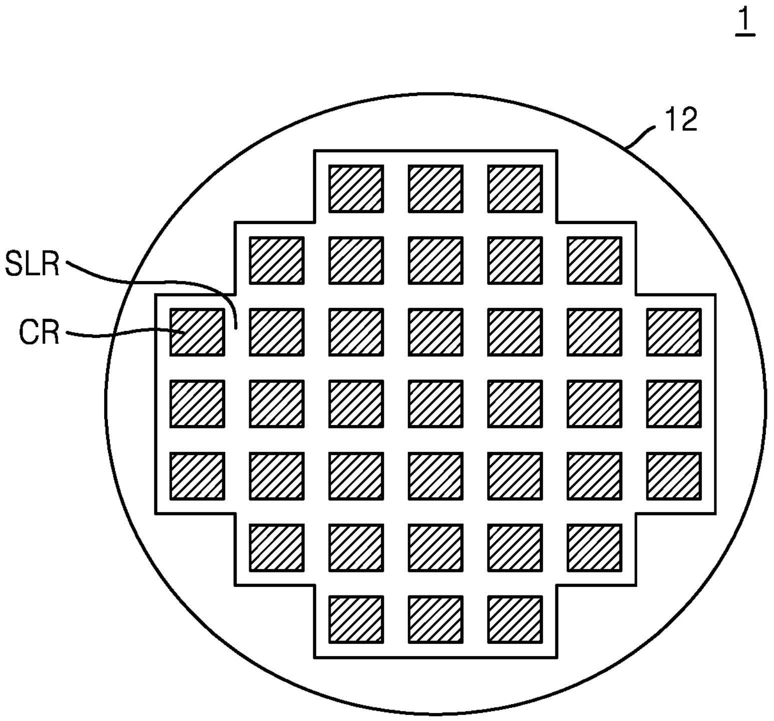
FIG. 2 is a schematic plan view of a semiconductor device according to example embodiments of the inventive concept.

FIG. 2 is a schematic plan view of a semiconductor device 1 according to example embodiments according to the inventive concept.

Referring to FIG. 2, the semiconductor device 1 may include a substrate 12 having a plurality of chip areas CR and a scribe lane area SLR bordering or surrounding each of the plurality of chip areas CR in the plan view. A plurality of chip areas CR may be arranged in a matrix form on the substrate 12. The scribe lane area SLR may include a cleavage region for individualizing a plurality of chip areas CR.

Each of the plurality of chip areas CR may be a high-density area having a relatively high pattern density, and the scribe lane area SLR may be a low-density area having a relatively low pattern density. The plurality of chip areas CR may include a cell array area of a semiconductor memory device, a peripheral circuit area including circuits configured to be electrically connected to cell arrays included in the cell array area, and a core area. In example embodiments, each of the plurality of chip areas CR may include at least one non-volatile memory device. In embodiments, the at least one non-volatile memory device may include a NAND flash memory, a vertical NAND (hereinafter referred to as 'VNAND'), a NOR flash memory, a resistive random access memory (RRAM), a Phase-Change Memory (PRAM), a Magnetoresistive Random Access Memory (MRAM), a Ferroelectric Random Access Memory (FRAM), a Spin Transfer Torque Random Access Memory (STT-RAM), or a combination thereof. The at least one nonvolatile memory device may be implemented as a three-dimensional array structure. For example, each of the plurality of chip areas CR may include the memory cell array MCA and the peripheral circuit 30 included in the semiconductor device 10 described with reference to FIG. 1. In other example embodiments, the at least one non-volatile memory device may further include a volatile memory device, such as dynamic random access memory (DRAM).

Figure 3A:
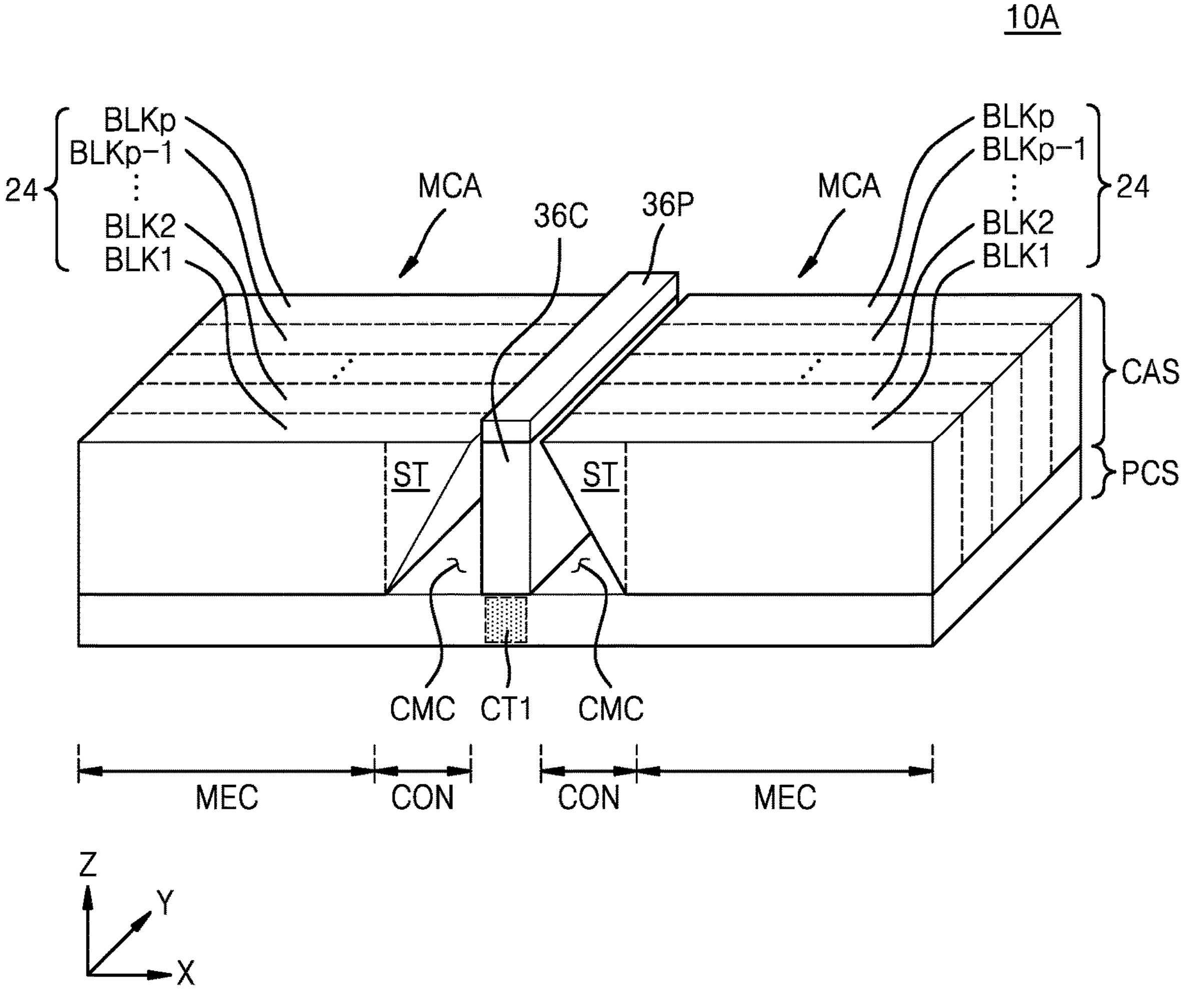
FIGS. 3A and 3B are schematic perspective views of a semiconductor device according to example embodiments of the inventive concept.

FIG. 3A is a schematic perspective view of a semiconductor device 10A according to example embodiments according to the inventive concept.

Referring to FIG. 3A, the semiconductor device 10A may include a cell array structure CAS and a peripheral circuit structure PCS overlapping each other in the vertical direction (Z direction). The cell array structure CAS may include the memory cell array MCA described with reference to FIG. 1. The peripheral circuit structure PCS may include the peripheral circuit 30 described with reference to FIG. 1.

The cell array structure CAS may include a plurality of mats 24. Each of the plurality of mats 24 may include a plurality of memory cell blocks BLK1, BLK2, . . . , BLKp. Each of the plurality of memory cell blocks BLK1, BLK2, . . . , BLKp may include three-dimensionally arranged memory cells.

In example embodiments, the semiconductor device 10A may have some components included in one chip area CR selected from among the plurality of chip areas CR illustrated in FIG. 2. One chip area CR may include four mats 24, but embodiments are not limited thereto.

The cell array structure CAS disposed on one peripheral circuit structure PCS includes a pair of mats 24 spaced apart in the first horizontal direction (X direction) with the peripheral circuit connection area 36C therebetween, and the pair of mats 24 may have a symmetrical shape around the peripheral circuit connection area 36C. In example embodiments, the plurality of memory cell blocks BLK1, BLK2, . . . , BLKp included in the mat 24 disposed on one side of the peripheral circuit connection area 36C may have a shape symmetrical to the plurality of memory cell blocks BLK1, BLK2, . . . , BLKp included in the mat 24 disposed on the other side of the peripheral circuit connection area 36C.

Each of the plurality of memory cell blocks BLK1, BLK2, . . . , BLKp may include a memory cell area MEC and a connection area CON. The connection area CON may include a stepped connection part ST composed of a plurality of conductive pad areas (e.g., the plurality of conductive pad areas 112 illustrated in FIG. 10) for connecting a plurality of gate lines disposed in the memory cell area MEC to a circuit included in the peripheral circuit structure PCS. As the connection area CON of each of the plurality of memory cell blocks BLK1, BLK2, . . . , BLKp approaches the peripheral circuit structure PCS, the planar area in the X-Y plane may decrease. A cell connection area CMC in which contact structures (e.g., the plurality of contact structures CTS illustrated in FIG. 10) for connecting the plurality of conductive pad areas to a peripheral circuit structure PCS are disposed may be defined between the plurality of conductive pad areas included in the stepped connection part ST and the peripheral circuit structure PCS. A pair of stepped connection parts ST spaced apart in the first horizontal direction (X direction) with the peripheral circuit connection area 36C therebetween may be spaced apart from the peripheral circuit connection area 36C with the cell connection area CMC therebetween.

The peripheral circuit connection area 36C may include a plurality of circuit areas, for example, a plurality of circuit areas composed of a plurality of circuits included in the peripheral circuit 30 of FIG. 1. The plurality of circuit areas may include a first circuit area CT1 overlapping a peripheral circuit connection area 36C in a vertical direction (Z direction). The first circuit area CT1 may include at least one circuit selected from a plurality of circuits included in the peripheral circuit 30 of FIG. 1. For example, the first circuit area CT1 may include the data I/O circuit 36 described with reference to FIG. 1.

The first circuit area CT1 and the peripheral circuit connection area 36C may be configured to be electrically connected to each other. A connection pad area 36P may be disposed on the peripheral circuit connection area 36C. The connection pad area 36P may include a plurality of connection pads (e.g., the plurality of connection pads 92 illustrated in FIG. 10) for transmitting a signal transmitted from the first circuit area CT1 through the peripheral circuit connection area 36C to the outside, or transmitting a signal input from the outside to the first circuit area CT1 through the peripheral circuit connection area 36C.

The first circuit area CT1, the peripheral circuit connection area 36C, and the connection pad area 36P may be disposed to overlap each other in the vertical direction (Z direction). The first circuit area CT1, the peripheral circuit connection area 36C, and the connection pad area 36P each may extend along a second horizontal direction (Y direction) orthogonal to the first horizontal direction (X direction) from the center area (e.g., the center area in the first horizontal direction (X direction) of the chip area CR illustrated in FIGS. 4 to 6) of one chip area CR (see FIG. 2).

Figure 3B:
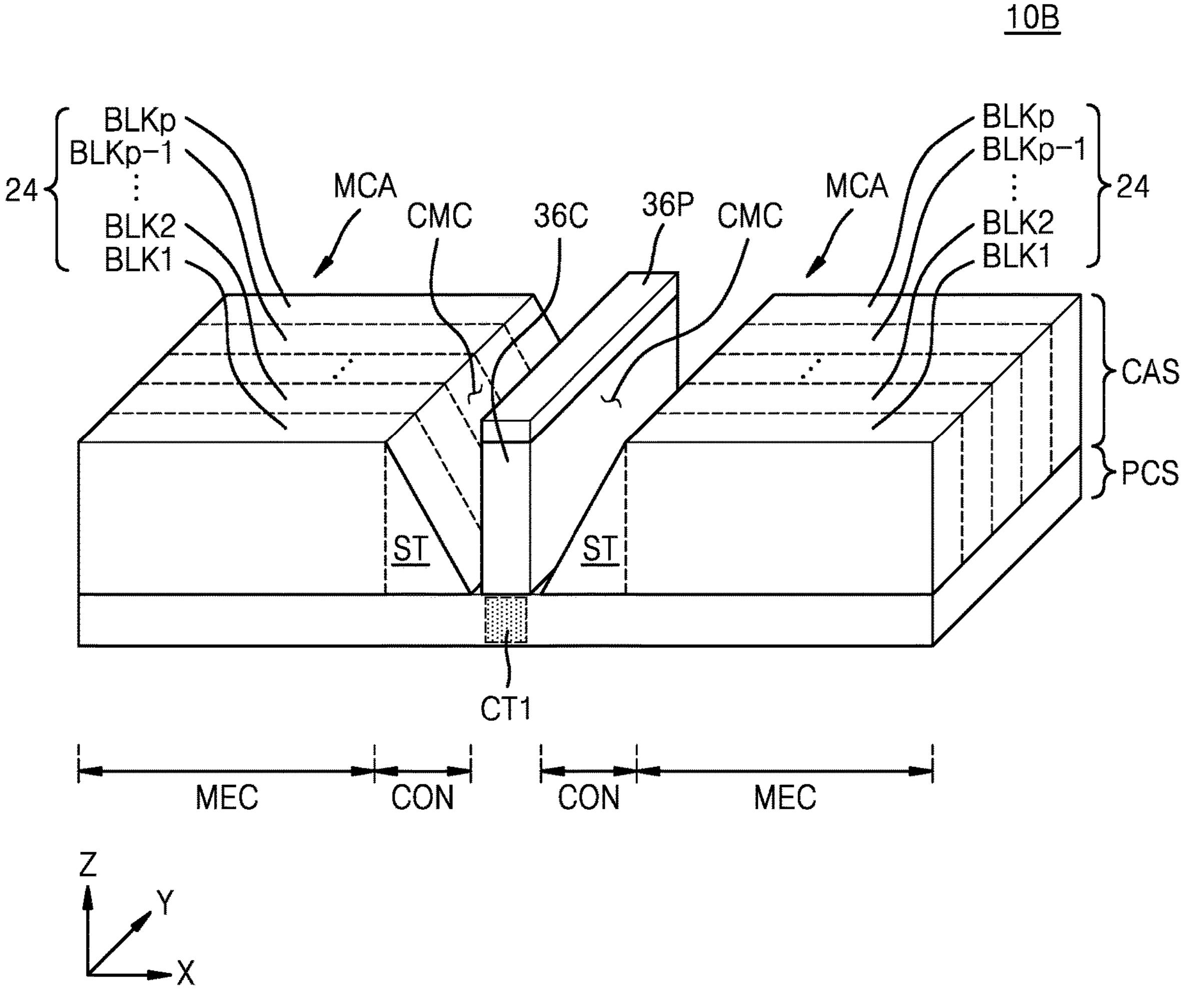

FIG. 3B is a schematic perspective view of a semiconductor device 10B according to other embodiments according to the inventive concept.

Referring to FIG. 3B, the semiconductor device 10B may have substantially the same configuration as the semiconductor device 10A described with reference to FIG. 3A. However, as the connection area CON of each of the plurality of memory cell blocks BLK1, BLK2, . . . , BLKp in the semiconductor device 10B approaches the peripheral circuit structure PCS, the planar area in the X-Y plane may increase. A cell connection area CMC in which contact structures for connecting the plurality of conductive pad areas (e.g., the plurality of conductive pad areas 112 illustrated in FIG. 10) to a peripheral circuit structure PCS are disposed may be defined between the plurality of conductive pad areas constituting the stepped connection part ST included in the connection area CON and the peripheral circuit connection area 36C. A pair of memory cell arrays MCA spaced apart in the first horizontal direction (X direction) with the peripheral circuit connection area 36C therebetween each may be spaced apart from the peripheral circuit connection area 36C with the cell connection area CMC therebetween.

Figure 4:
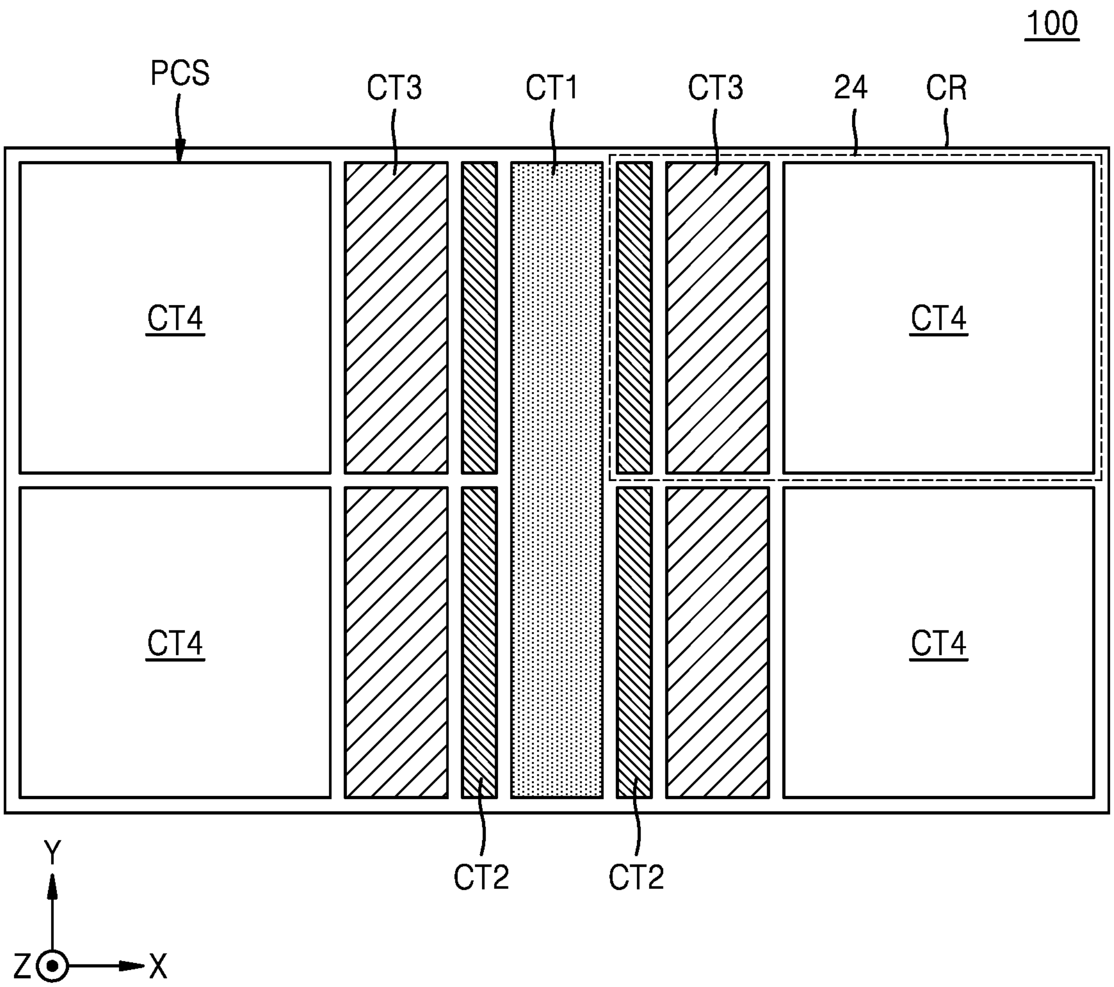
FIGS. 4 to 6 are plan views illustrating semiconductor devices according to example embodiments of the inventive concept.
Figure 5:
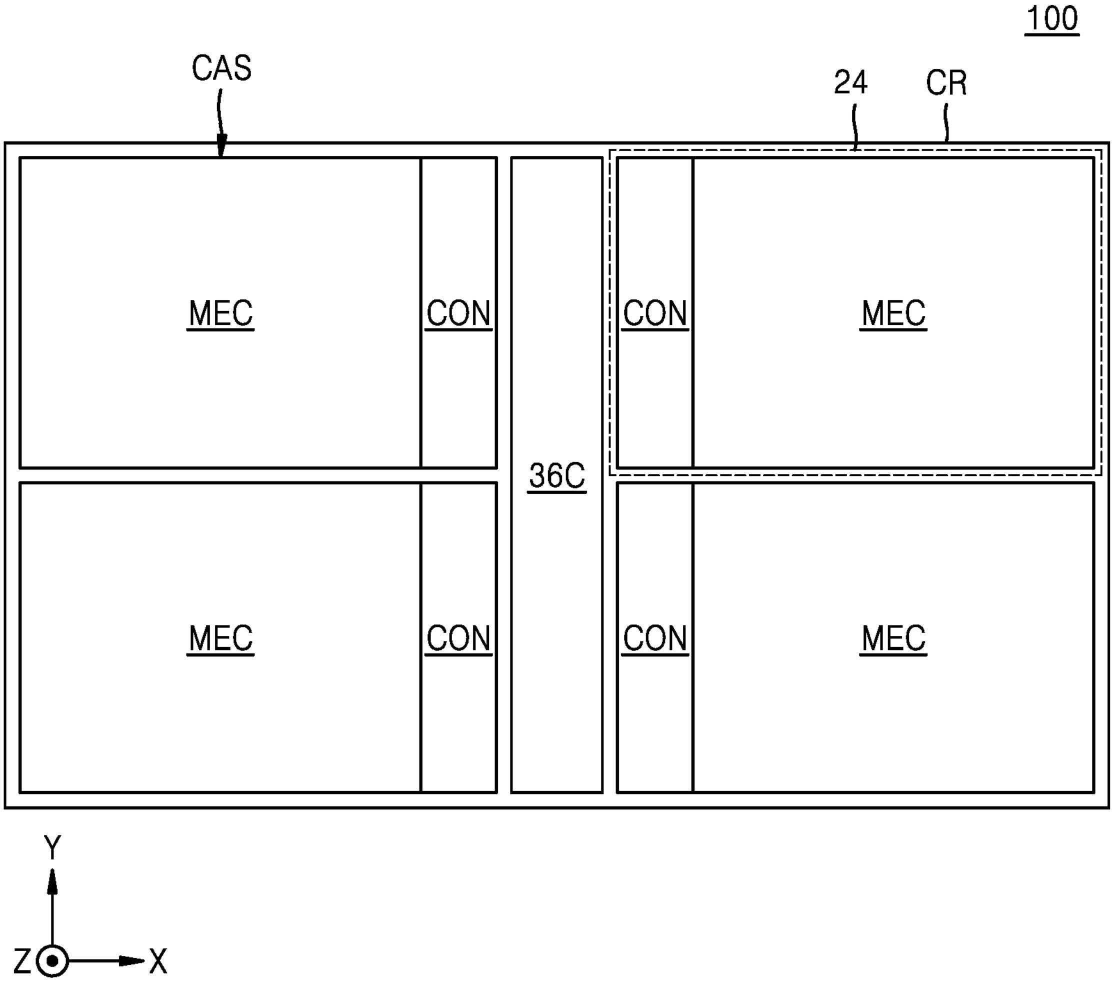
Figure 6:
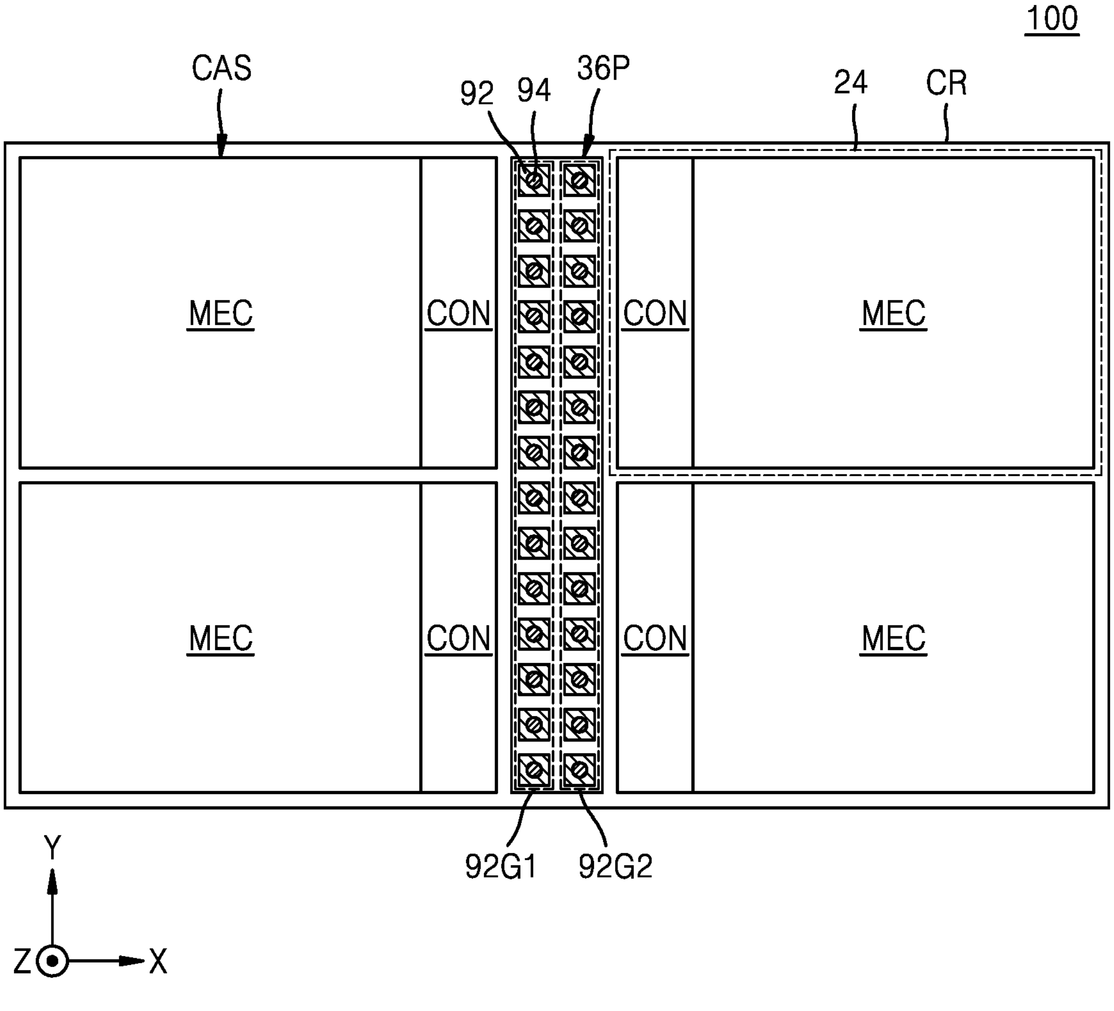

FIGS. 4 to 6 are plan views that illustrate the semiconductor device 100 according to example embodiments of the inventive concept. More specifically, FIG. 4 is a plan view of a peripheral circuit structure PCS included in a chip area CR of the semiconductor device 100, FIG. 5 is a plan view at a vertical level in which a peripheral circuit connection area 36C of a cell array structure CAS included in a chip area CR of the semiconductor device 100 is located, and FIG. 6 is a plan view of a cell array structure CAS included in a chip area CR of the semiconductor device 100 at a vertical level in which a connection pad area 36P is located.

Referring to FIGS. 4 to 6, the semiconductor device 100 may include a chip area CR including a cell array structure CAS and a peripheral circuit structure PCS overlapping each other in a vertical direction (Z direction). One chip area CR may include a plurality of mats 24. FIGS. 4 to 6 illustrate an example in which one chip area CR includes four mats 24, but embodiments of the inventive concept are not limited thereto.

In example embodiments, similar to the description with reference to FIGS. 3A and 3B, the cell array structure CAS may be disposed on the peripheral circuit structure PCS. In other embodiments, the cell array structure CAS may be disposed below the peripheral circuit structure PCS in the Z-direction.

As illustrated in FIG. 4, the peripheral circuit structure PCS may include a first circuit area CT1, a plurality of second circuit areas CT2, a plurality of third circuit areas CT3, and a plurality of fourth circuit areas CT4. In the peripheral circuit structure PCS included in one chip area CR, each of the plurality of mats 24 may include one second circuit area CT2, one third circuit area CT3, and one fourth circuit area CT4. The first circuit area CT1 may be shared by four mats 24.

The first circuit area CT1 may be disposed to extend along the second horizontal direction (Y direction) from the center area in the first horizontal direction (X direction) of the chip area CR (see FIG. 2). The plurality of second circuit areas CT2 are adjacent to the first circuit area CT1 in the first horizontal direction (X direction), and may include a pair of second circuit areas CT2 spaced apart in a first horizontal direction (X direction) with the first circuit area CT1 therebetween. The plurality of third circuit areas CT3 may include a pair of third circuit areas CT3 spaced apart in the first horizontal direction (X direction). The first circuit area CT1 and the pair of second circuit areas CT2 on both sides of the first circuit area CT3 may be disposed between the pair of third circuit areas CT3.

Each of the plurality of second circuit areas CT2 and the plurality of third circuit areas CT3 may overlap the connection area CON of one memory cell block, for example, one memory cell block selected from among the plurality of memory cell blocks BLK1, BLK2, . . . , BLKp illustrated in FIGS. 3A and 3B, in a vertical direction (Z direction).

In embodiments, one of the plurality of second circuit areas CT2 and the plurality of third circuit areas CT3 is a row decoder area, and another one of the plurality of second circuit areas CT2 and the plurality of third circuit areas CT3 may be a pass circuit area including a plurality of pass transistors. Circuits in the path circuit area may be configured to connect to a plurality of gate lines included in the plurality of memory cell blocks BLK1, BLK2, . . . , BLKp and a row decoder included in the row decoder area. For example, the plurality of second circuit areas CT2 may be row decoder areas, and the plurality of third circuit areas CT3 may be pass circuit areas, but embodiments are not limited thereto.

The plurality of second circuit areas CT2 and the plurality of third circuit areas CT3 may extend along the second horizontal direction (Y direction) between the first circuit area CT1 and the plurality of memory cell blocks BLK1, BLK2, . . . , BLKp. The first circuit area CT1, the plurality of second circuit areas CT2, and the plurality of third circuit areas CT3 may each extend along the second horizontal direction (Y direction) between two adjacent connection areas CON in the first horizontal direction (X direction).

The fourth circuit area CT4 may be disposed at a position overlapping the memory cell area MEC in a vertical direction (Z direction). The fourth circuit area CT4 may include various circuits constituting the peripheral circuit 30 described with reference to FIG. 1. For example, the fourth circuit area CT4 may include a page buffer area where the page buffer 34 is disposed.

As illustrated in FIGS. 5 and 6, the plurality of mats 24 may include a memory cell area MEC and a connection area CON constituting a plurality of memory cell blocks BLK1, BLK2, . . . , BLKp (see FIG. 3A or 3B), respectively. The peripheral circuit connection area 36C and the connection pad area 36P may extend along the second horizontal direction (Y direction) in the center area in the first horizontal direction (X direction) of each chip area CR.

As illustrated in FIG. 6, a plurality of connection pads 92 may be disposed in the connection pad area 36P. The connection pad area 36P may include a first connection pad group 92G1 and a second connection pad group 92G2 including a plurality of connection pads 92. The plurality of connection pads 92 included in each of the first connection pad group 92G1 and the second connection pad group 92G2 may be arranged in a line along the second horizontal direction (Y direction) in the center area in the first horizontal direction (X direction) of the chip area CR.

The plurality of connection pads 92 included in the first connection pad group 92G1 may be configured to connect to a plurality of memory cell blocks BLK1, BLK2, . . . , BLKp of the memory cell area MEC on one side of the peripheral circuit connection area 36C and the connection pad area 36P in the first horizontal direction (X direction) through the first circuit area CT1 of the peripheral circuit structure PCS. The plurality of connection pads 92 included in the second connection pad group 92G2 may be configured to connect to a plurality of memory cell blocks BLK1, BLK2, . . . , BLKp of the memory cell area MEC on the other side of the peripheral circuit connection area 36C and the connection pad area 36P in the first horizontal direction (X direction) through the first circuit area CT1 of the peripheral circuit structure PCS. An external connection terminal 94 may be connected to each of the plurality of connection pads 92 in the connection pad area 36P.

Figure 7:
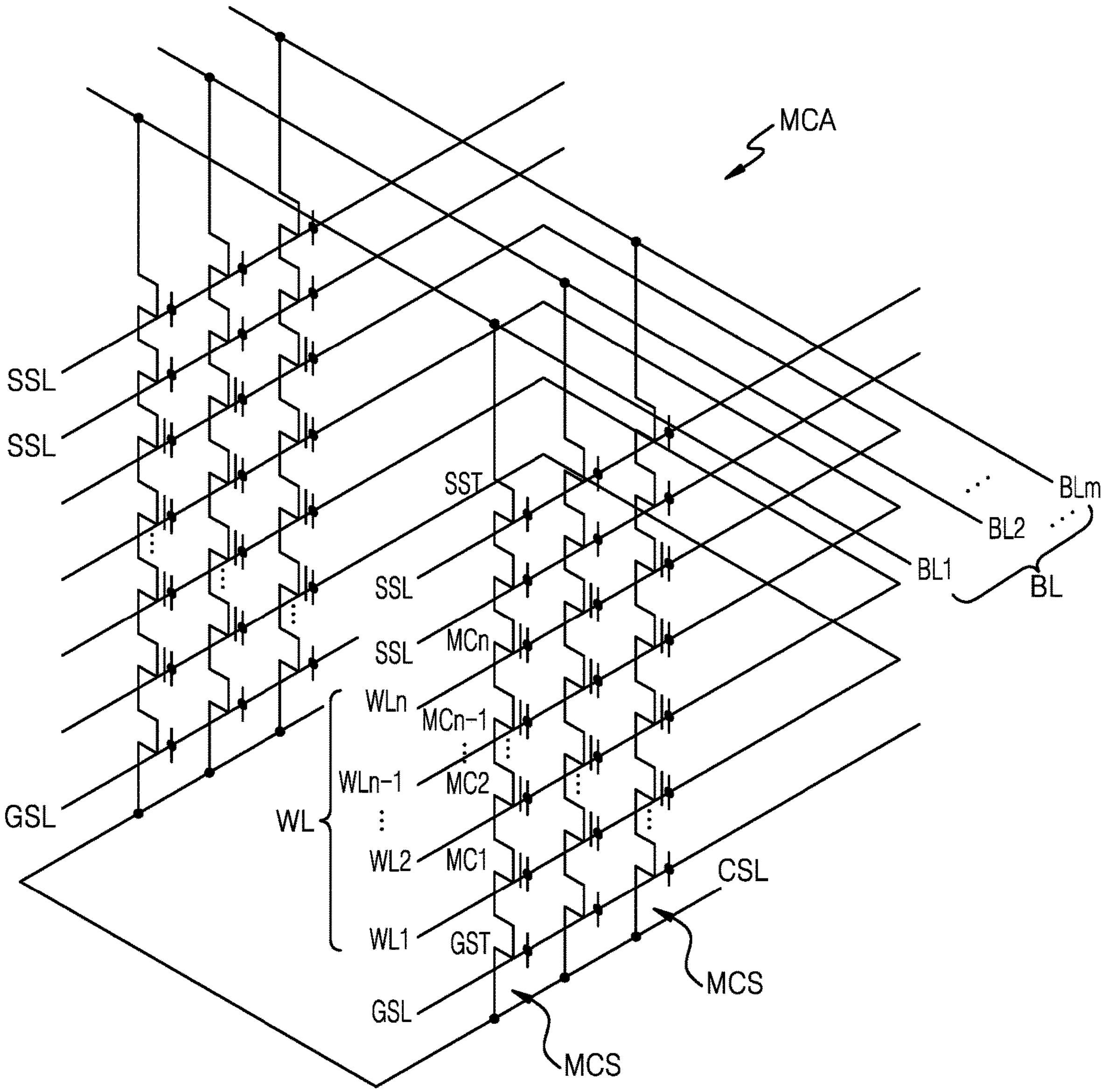
FIG. 7 is an equivalent circuit diagram of a memory cell array of a semiconductor device according to example embodiments of the inventive concept.

FIG. 7 is an equivalent circuit diagram of a memory cell array MCA of a semiconductor device according to embodiments of the inventive concept. FIG. 7 illustrates an equivalent circuit diagram of a vertical NAND flash memory device having a vertical channel structure. The plurality of memory cell blocks BLK1, BLK2, . . . , BLKp illustrated in FIGS. 3A and 3B may each include a memory cell array MCA having the circuit configuration illustrated in FIG. 7.

Referring to FIG. 7, the memory cell array MCA may include a plurality of memory cell strings MCS. The memory cell array MCA includes a plurality of bit lines BL: BL1, BL2, . . . , BLm, a plurality of word lines WL: WL1, WL2, . . . , WLn−1, WLn, at least one string select line SSL, at least one ground select line GSL, and a common source line CSL. A plurality of memory cell strings MCS may be formed between the plurality of bit lines BL and the common source line CSL. FIG. 7 illustrates a case in which each of the plurality of memory cell strings MCS includes one ground select line GSL and two string select lines SSL, but the technical idea of the inventive concept is not limited thereto. For example, each of the plurality of memory cell strings MCS may include one string select line SSL.

Each of the plurality of memory cell strings MCS may include a string select transistor SST, a ground select transistor GST, and a plurality of memory cell transistors MC1, MC2, . . . , MCn−1, MCn. A drain region of the string select transistor SST may be connected to the bit line BL, and a source region of the ground select transistor GST may be connected to the common source line CSL. The common source line CSL may be an area in which the source regions of the plurality of ground select transistors GST are commonly connected.

The string select transistor SST may be connected to the string select line SSL, and the ground select transistor GST may be connected to the ground select line GSL. The plurality of memory cell transistors MC1, MC2, . . . , MCn−1, MCn may be respectively connected to the word line WL.

Figure 8:
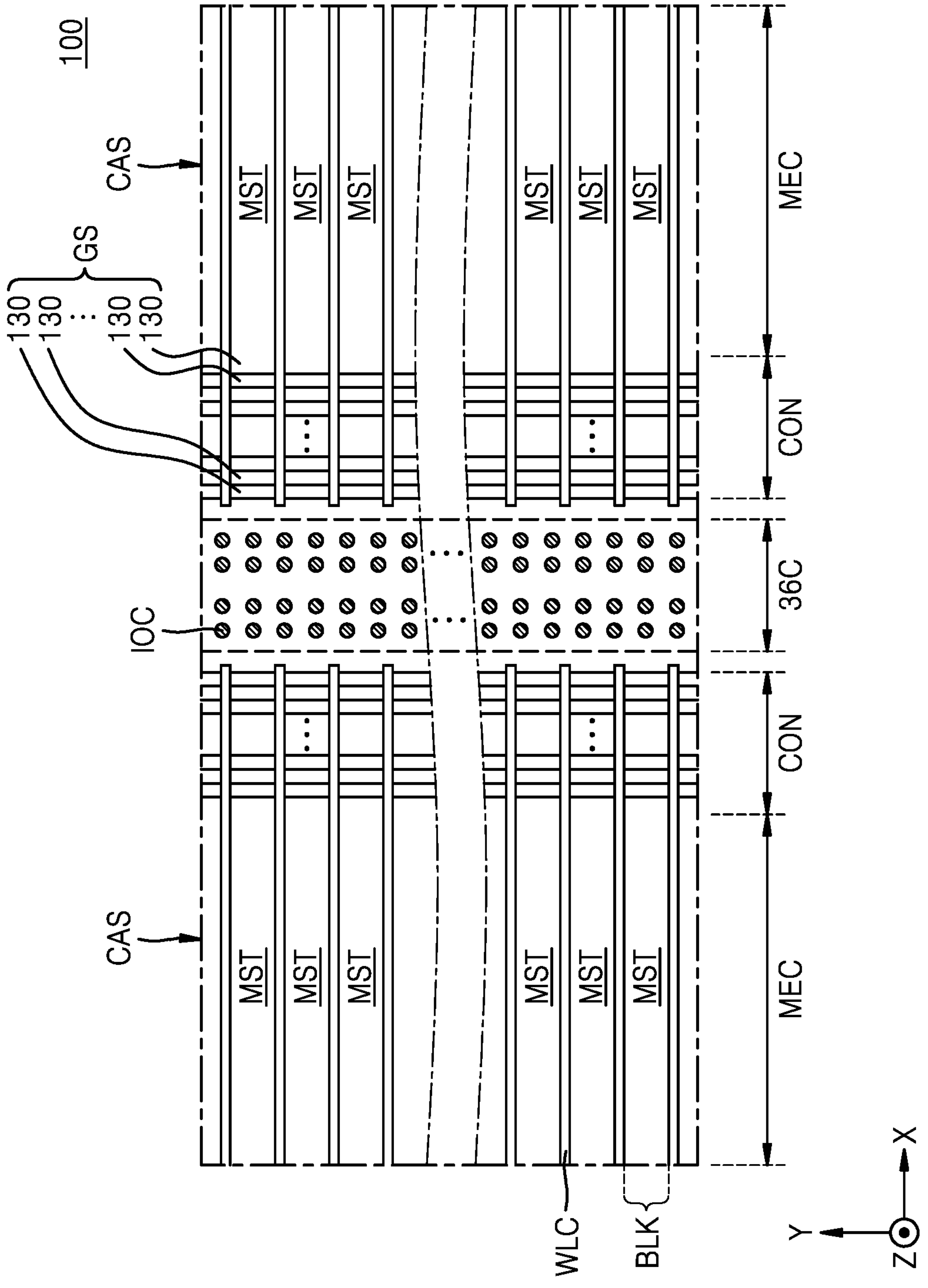
FIG. 8 is a schematic plan view of a partial region of a semiconductor device according to example embodiments of the inventive concept.

FIG. 8 is a schematic plan view of a partial region of a semiconductor device 100 according to embodiments of the inventive concept.

Referring to FIG. 8, the semiconductor device 100 may include a pair of cell array structures CAS spaced apart in a first horizontal direction (X direction) with a peripheral circuit connection area 36C therebetween. Each of the pair of cell array structures CAS may include a plurality of memory cell blocks BLK1, BLK2, . . . , BLKp−1, BLKp. A peripheral circuit structure PCS (see FIG. 4) may be disposed below the cell array structure CAS. The plurality of memory cell blocks BLK1, BLK2, . . . , BLKp−1, BLKp may overlap the peripheral circuit structure PCS in a vertical direction (Z direction).

Each of the pair of cell array structures CAS may include a memory cell area MEC and a connection area CON disposed on one side of the memory cell area MEC. The plurality of memory cell blocks BLK1, BLK2, . . . , BLKp−1, and BLKp each may include a memory stack structure MST extending in a first horizontal direction (X direction) across the memory cell area MEC and the connection area CON. The memory stack structure MST may include a plurality of gate lines 130 stacked to overlap each other in the vertical direction (Z direction) in the memory cell area MEC and the connection area CON. The plurality of gate lines 130 in each of the plurality of memory stack structures MST may constitute the gate stack GS. In each of the plurality of memory stack structures MST, the plurality of gate lines 130 may constitute the ground select line GSL, the plurality of word lines WL, and the string select line SSL illustrated in FIG. 7. In example embodiments, the area of the plurality of gate lines 130 in the X-Y plane may gradually increase as the distance from the peripheral circuit structure PCS (see FIG. 4) increases. In other embodiments, the area of the plurality of gate lines 130 in the X-Y plane may gradually decrease as the distance from the peripheral circuit structure PCS (see FIG. 4) increases.

A plurality of word line cut structures 192 extending in a first horizontal direction (X direction) may be disposed in the memory cell area MEC and the connection area CON. The plurality of word line cut structures 192 may be disposed parallel to each other while being spaced apart from each other in the second horizontal direction (Y direction). The plurality of memory cell blocks BLK1, BLK2, . . . , BLKp−1, and BLKp may be disposed between each of the plurality of word line cut structures 192.

The peripheral circuit connection area 36C may be disposed between two adjacent connection areas CON in a first horizontal direction (X direction). A plurality of contact plugs IOC may be disposed in the peripheral circuit connection area 36C. Each of the plurality of contact plugs IOC may extend in a vertical direction (Z direction) in the peripheral circuit connection area 36C. The plurality of contact plugs IOC may include one end portion configured to connect to at least one circuit included in the first circuit area CT1 (see FIG. 4) of the peripheral circuit structure PCS and facing the first circuit area CT1 (see FIG. 4) and the other end configured to connect to the external connection terminal 94 (see FIG. 6). A more detailed configuration of the plurality of contact plugs IOC will be described below with reference to FIG. 10.

Figure 9:
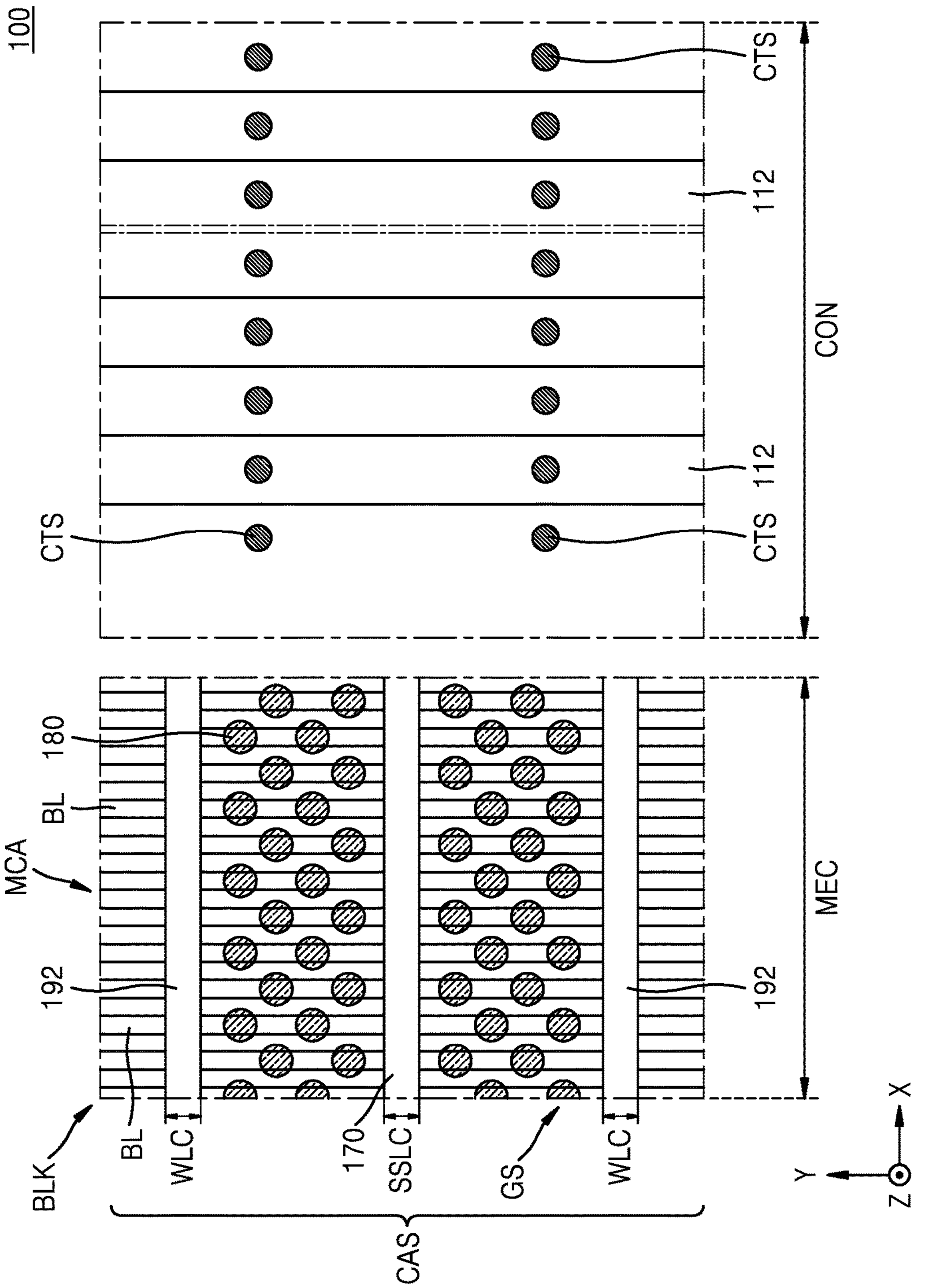
FIG. 9 is a plan layout illustrating some components of a cell array structure of a semiconductor device according to example embodiments of the inventive concept.
Figure 10:
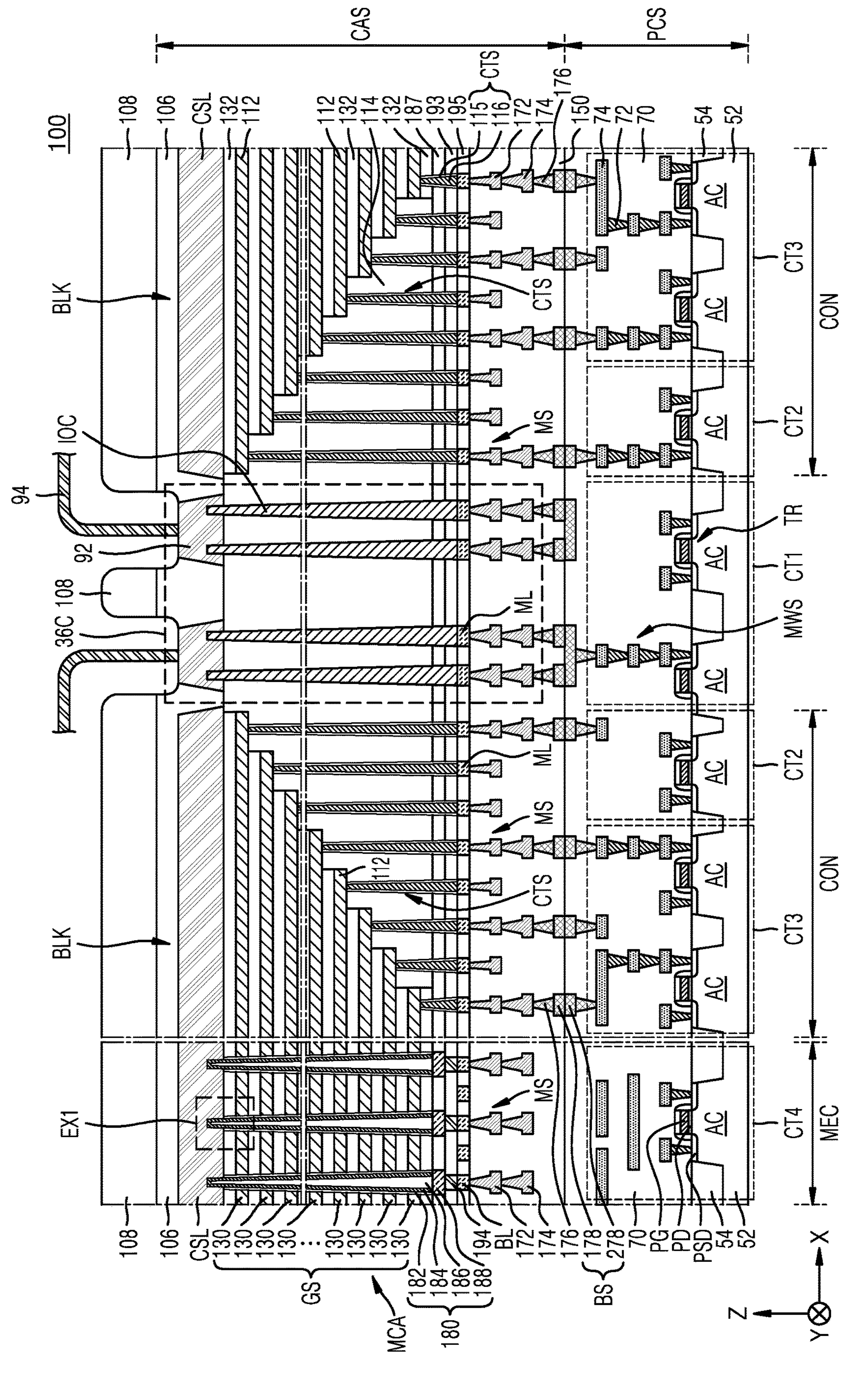
FIG. 10 is a cross-sectional view of partial regions of each of a peripheral circuit structure and a cell array structure of a semiconductor device according to example embodiments of the inventive concept.

FIG. 9 is a plan layout illustrating some components of a cell array structure CAS of the semiconductor device 100 according to example embodiments according to the inventive concept. FIG. 10 is a cross-sectional view of partial regions of the peripheral circuit structure PCS and the cell array structure CAS of the semiconductor device 100. FIG. 9 illustrates a memory cell block BLK corresponding to one memory cell block BLK selected from among the plurality of memory cell blocks BLK1, BLK2, . . . , BLKp illustrated in FIG. 3A. FIG. 10 illustrates some configurations of a connection area CON of each of a pair of memory cell blocks BLK selected from among the plurality of memory cell blocks BLK1, BLK2, . . . , BLKp illustrated in FIG. 3A and spaced apart in a first horizontal direction (X direction) with a peripheral circuit connection area 36C therebetween and a first circuit area CT1, a second circuit area CT2, a third circuit area CT3, and a fourth circuit area CT4 of the peripheral circuit structure PCS under each of the peripheral circuit connection area 36C and the pair of memory cell blocks BLK.

Referring to FIGS. 9 and 10, the semiconductor device 100 may include a cell array structure CAS and a peripheral circuit structure PCS overlapping in a vertical direction (Z direction). The cell array structure CAS may include a memory cell area MEC in which the memory cell array MCA is disposed, and a connection area CON disposed on one side of the memory cell area MEC in a first horizontal direction (X direction).

In example embodiments, the semiconductor device 100 may have a chip to chip (C2C) structure. After forming a cell array structure CAS on a first wafer and forming a peripheral circuit structure PCS on a second wafer different from the first wafer, the C2C structure may be obtained by connecting the cell array structure CAS and the peripheral circuit structure PCS to each other by a bonding method. For example, the bonding method may refer to a method of electrically connecting the first bonding metal pad 178 formed on the uppermost metal layer of the cell array structure CAS and the second bonding metal pad 278 formed on the uppermost metal layer of the peripheral circuit structure PCS to each other. In example embodiments, when the first bonding metal pad 178 and the second bonding metal pad 278 are made of copper (Cu), the bonding method may be a Cu—Cu bonding method. In other embodiments, each of the first bonding metal pad 178 and the second bonding metal pad 278 may be made of aluminum (Al) and/or tungsten (W).

The peripheral circuit structure PCS may include a substrate 52, a plurality of circuits formed on the substrate 52, and a multilayer wiring structure MWS for interconnecting the plurality of circuits or connecting the plurality of circuits with components in a memory cell area MEC of a cell array structure CAS.

The substrate 52 may be made of a semiconductor material. For example, the substrate 52 may include Si, Ge, and/or SiGe. An active area AC may be defined on the substrate 52 by an element isolation film 54. A plurality of transistors TR constituting a plurality of circuits may be formed on the active area AC. Each of the plurality of transistors TR may include a gate dielectric film PD and a gate PG sequentially stacked on the substrate 52, and a plurality of ion implantation areas PSD formed in the active area AC at both sides of the gate PG. Each of the plurality of ion implantation areas PSD may constitute a source region or a drain region of the transistor TR.

A multilayer wiring structure MWS included in the peripheral circuit structure PCS may include a plurality of contact plugs 72 and a plurality of conductive lines 74. At least some of the plurality of conductive lines 74 may be configured to be electrically connectable to the transistor TR. The plurality of contact plugs 72 may be configured to interconnect selected portions of the plurality of transistors TR and the plurality of conductive lines 74. The plurality of transistors TR and the multilayer wiring structure MWS included in the peripheral circuit structure PCS may be at least partially covered with an interlayer insulating film 70. The interlayer insulating film 70 may include a silicon oxide film, a silicon nitride film, a SiON film, a SiOCN film, or a combination thereof.

The plurality of circuits included in the peripheral circuit structure PCS may include various circuits included in the peripheral circuit 30 described with reference to FIG. 1. As described with reference to FIG. 4, the peripheral circuit structure PCS may include a first circuit area CT1, a plurality of second circuit areas CT2, a plurality of third circuit areas CT3, and a plurality of fourth circuit areas CT4 disposed at the same vertical level on the substrate 52. As used herein, the term "vertical level" refers to a distance along a vertical direction (Z direction or −Z direction) from the main surface of the substrate 52. In example embodiments, the peripheral circuit structure PCS may further include unit elements such as resistors and capacitors. The plurality of transistors TR, the plurality of contact plugs 72, and the plurality of conductive lines 74 included in the peripheral circuit structure PCS may be used to compose a first circuit area CT1, a plurality of second circuit areas CT2, a plurality of third circuit areas CT3, and a plurality of fourth circuit areas CT4. Each of the plurality of transistors TR may be configured to be electrically connected to the memory cell area MEC and the connection area CON through a plurality of wiring structures MWS. The plurality of wiring structures MWS may include a plurality of contact structures CTS disposed on the connection area CON of the cell array structure CAS.

As illustrated in FIG. 10, a memory cell area MEC of each of the pair of memory cell blocks BLK may include a plurality of gate lines 130 sequentially stacked in a vertical direction (Z direction), and a connection area CON of each of the pair of memory cell blocks BLK may include a plurality of conductive pad areas 112 integrally connected as part of a monolithic structure to a plurality of gate lines 130.

Each of the plurality of gate lines 130 and the plurality of conductive pad areas 112 may be made of a metal, a metal silicide, a semiconductor doped with impurities, or a combination thereof. For example, each of the plurality of gate lines 130 and the plurality of conductive pad areas 112 may include a metal such as tungsten, nickel, cobalt, tantalum, and the like, a metal silicide such as tungsten silicide, nickel silicide, cobalt silicide, tantalum silicide, and the like, doped polysilicon, or a combination thereof.

Each of the pair of memory cell blocks BLK may include a common source line CSL. A pair of common source lines CSL included in a pair of memory cell blocks BLK may be spaced apart from the peripheral circuit structure PCS in a vertical direction (Z direction) with a memory cell area MEC therebetween. A pair of common source lines CSL included in a pair of memory cell blocks BLK may be spaced apart in a first horizontal direction (X direction) with a peripheral circuit connection area 36C therebetween.

The peripheral circuit connection area 36C includes a plurality of contact plugs IOC disposed between a pair of connection areas CON included in a pair of memory cell blocks BLK and a plurality of connection pads 92 disposed between the pair of common source lines CSL. Each of the plurality of contact plugs IOC may extend in a vertical direction (Z direction) from the peripheral circuit connection area 36C and be connected to at least one circuit included in the first circuit area CT1. Each of the plurality of contact plugs IOC may include one end portion facing the first circuit area CT1 and another end portion configured to connect to the external connection terminal 94 through the connection pad 92. Each of the plurality of connection pads 92 may be connected to the other end portion of the contact plug IOC. The plurality of connection pads 92 may be disposed at positions spaced apart from the pair of common source lines CSL in a first horizontal direction (X direction) at the same vertical level as the pair of common source lines CSL.

A plurality of first bonding metal pads 178 may be disposed on an upper surface of the cell array structure CAS adjacent to the peripheral circuit structure PCS. Each of the plurality of first bonding metal pads 178 in the cell array structure CAS may be insulated with an interlayer insulating film 150. The interlayer insulating film 150 may be formed of a silicon oxide film, a silicon nitride film, or a combination thereof.

The peripheral circuit structure PCS may include a plurality of second bonding metal pads 278 disposed on the multilayer wiring structure MWS. The plurality of second bonding metal pads 278 are bonded to the plurality of first bonding metal pads 178 included in the cell array structure CAS to be electrically connected to the plurality of first bonding metal pads 178. The plurality of first bonding metal pads 178 and the plurality of second bonding metal pads 278 may constitute a plurality of bonding structures BS. The interlayer insulating film 70 may at least partially cover the plurality of transistors TR, the plurality of contact plugs 72, the plurality of conductive lines 74, and the plurality of second bonding metal pads 278.

In example embodiments, each of the plurality of contact plugs 72 and the plurality of conductive lines 74 in the peripheral circuit structure PCS may include tungsten, aluminum, copper, or a combination thereof, but is not limited thereto. The element isolation film 54 may be formed of a silicon oxide film, a silicon nitride film, or a combination thereof. The interlayer insulating film 70 may be formed of a silicon oxide film, a silicon nitride film, or a combination thereof. The plurality of first bonding metal pads 178 and the plurality of second bonding metal pads 278 of the plurality of bonding structures BS may be formed of copper, aluminum, and/or tungsten.

The cell array structure CAS may include a memory cell array MCA disposed between the peripheral circuit structure PCS and the common source line CSL. A gate stack GS may be disposed between the peripheral circuit structure PCS and the common source line CSL in the memory cell area MEC and the connection area CON. The gate stack GS may include a plurality of gate lines 130 and a plurality of conductive pad areas 112 integrally connected as part of a monolithic structure to the plurality of gate lines 130. A portion of the gate stack GS disposed on the memory cell area MEC may constitute a memory cell array MCA. The plurality of gate lines 130 included in the gate stack GS are disposed on the memory cell area MEC, extend in a horizontal direction parallel to the common source line CSL, and overlap each other in the vertical direction (Z direction). The plurality of gate lines 130 may include the plurality of word lines WL, ground select lines GSL, and string select lines SSL illustrated in FIG. 7.

In the cell array structure CAS, the plurality of conductive pad areas 112 included in the gate stack GS may form a stepped connection part in the connection area CON. Each of the plurality of conductive pad areas 112 may be integrally connected as part of a monolithic structure to one gate line 130 selected from among the plurality of gate lines 130.

As illustrated in FIG. 9, a plurality of word line cut areas WLC may extend in a first horizontal direction (X direction) in the cell array structure CAS. The plurality of word line cut areas WLC may limit the width of the gate stack GS in the second horizontal direction (Y direction). A plurality of word line cut areas WLC may be at least partially filled with the word line cut structure 192. The word line cut structure 192 may be formed of an insulating film, polysilicon, a metal film, or a combination thereof. In example embodiments, the word line cut structure 192 may be formed of a silicon oxide film, a silicon nitride film, a polysilicon film, a tungsten film, or a combination thereof, but embodiments are not limited thereto.

In the memory cell array MCA, two string select lines SSL (see FIG. 7) adjacent in the second horizontal direction (Y direction) may be spaced apart from each other with a string select line cut area SSLC therebetween. The string select line cut area SSLC may be at least partially filled with insulating film 170. The insulating film 170 may be formed of an oxide film, a nitride film, or a combination thereof. In example embodiments, at least a portion of the string select line cut structure SSLC may be formed of an air gap. As used herein, the term "air" may refer to the atmosphere or other gases that may exist in the atmosphere or during a manufacturing process.

Each of the plurality of gate lines 130 and the plurality of conductive pad areas 112 may be made of metal, conductive metal nitride, or a combination thereof. For example, each of the plurality of gate lines 130 and the plurality of conductive pad areas 112 may be made of tungsten, nickel, cobalt, tantalum, tungsten nitride, titanium nitride, tantalum nitride, or a combination thereof, but embodiments are not limited thereto.

As illustrated in FIG. 10, the cell array structure CAS may include a plurality of insulating films 132 at least partially covering upper and lower surfaces of each of the plurality of gate lines 130. The plurality of insulating films 132 may be made of silicon oxide, silicon nitride, or SiON.

In the memory cell area MEC, the plurality of channel structures 180 penetrate or extend into the plurality of gate lines 130 and the plurality of insulating films 132 and extend in a vertical direction (Z direction) and may be arranged to connect to the common source line CSL. The plurality of channel structures 180 may be arranged to be spaced apart from each other with a preset interval therebetween in the first horizontal direction (X direction) and the second horizontal direction (Y direction).

Each of the plurality of channel structures 180 may include a gate dielectric film 182, a channel region 184, a buried insulating film 186, and a drain region 188. The channel region 184 may include doped polysilicon and/or undoped polysilicon. The channel region 184 may have a cylindrical shape. An internal space of the channel region 184 may be at least partially filled with a buried insulating film 186. The channel region 184 may include a portion in contact with the common source line CSL. The buried insulating film 186 may be made of an insulating material. For example, the buried insulating film 186 may be made of silicon oxide, silicon nitride, SiON, or a combination thereof. In some embodiments, the buried insulating film 186 may be omitted, and in this case, the channel region 184 may have a pillar structure without an internal space. The drain region 188 may be formed of impurity-doped polysilicon, metal, conductive metal nitride, or a combination thereof. Examples of metals that may constitute the drain region 188 may include tungsten, nickel, cobalt, and/or tantalum. The plurality of drain regions 188 may be insulated from each other by an intermediate insulating film 187. Each of the intermediate insulating films 187 may be formed of an oxide film, a nitride film, or a combination thereof.

FIG. 10 illustrates an example in which the channel structure 180 includes a gate dielectric film 182 and the gate dielectric film 182 has a shape extending in a vertical direction (Z direction) along the channel region 184, but embodiments of the inventive concept are not limited thereto, and various modifications and changes are possible.

Figure 11:
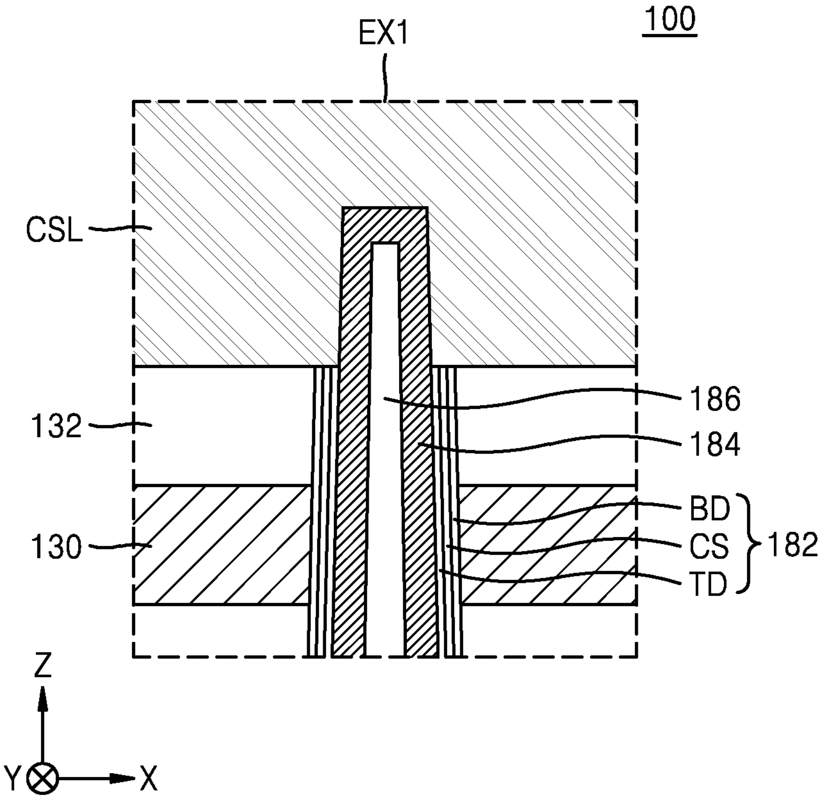
FIG. 11 is an enlarged cross-sectional view of an area indicated by "EX1" in FIG. 10.

FIG. 11 is a cross-sectional view illustrating the gate dielectric film 182 illustrated in FIG. 10 in more detail, and is an enlarged view of an area indicated by "EX1" in FIG. 10.

Referring to FIG. 11, the gate dielectric film 182 may include a tunneling dielectric film TD, a charge storage film CS, and a blocking dielectric film BD sequentially formed from the channel region 184. The relative thicknesses of the tunneling dielectric film TD, the charge storage film CS, and the blocking dielectric film BD are not limited to those illustrated in FIG. 11 and may be variously modified.

The tunneling dielectric film TD may include silicon oxide, hafnium oxide, aluminum oxide, zirconium oxide, tantalum oxide, or the like. The charge storage film CS is a region in which electrons passing through the tunneling dielectric film TD from the channel region 184 may be stored, and may include silicon nitride, boron nitride, silicon boron nitride, and/or polysilicon doped with impurities. The blocking dielectric film BD may be formed of silicon oxide, silicon nitride, and/or metal oxide having a higher dielectric constant than silicon oxide. The metal oxide may be formed of hafnium oxide, aluminum oxide, zirconium oxide, tantalum oxide, or a combination thereof.

Figure 12:
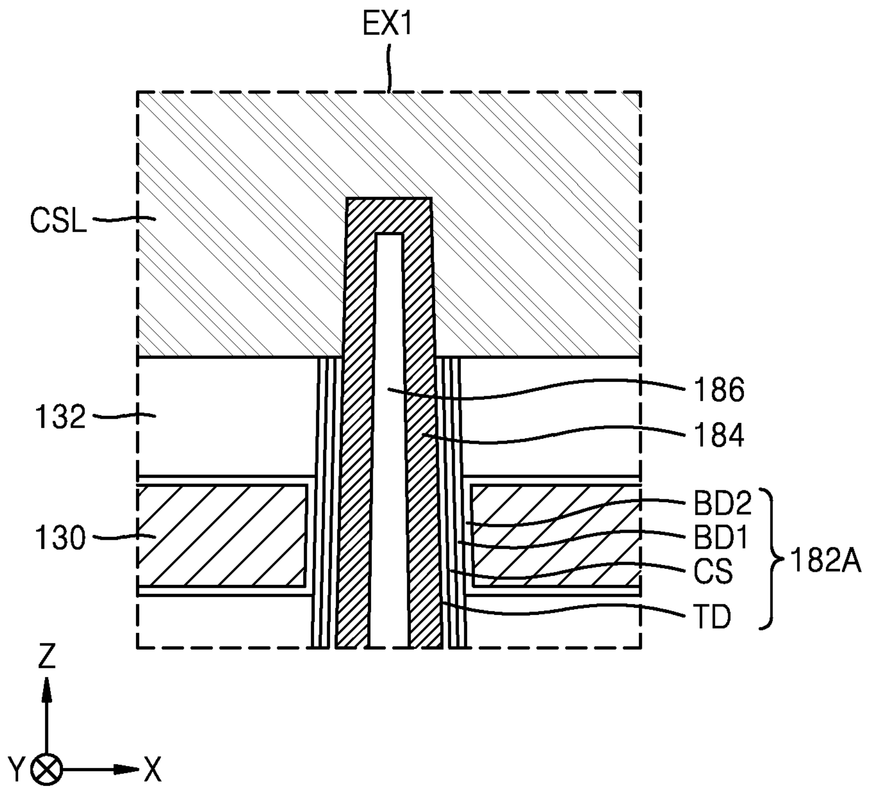
FIG. 12 is an enlarged cross-sectional view of an area corresponding to the area indicated by "EX1" in FIG. 10.

FIG. 12 is cross-sectional views showing an example structure of a gate dielectric film 182A that may be used instead of the gate dielectric film 182 illustrated in FIG. 11. FIG. 12 illustrates a cross-sectional configuration of an area corresponding to the area indicated by "EX1" in FIG. 10.

In example embodiments, the semiconductor device 100 illustrated in FIGS. 9 and 10 may include the gate dielectric film 182A illustrated in FIG. 12 instead of the gate dielectric film 182. The gate dielectric film 182A has substantially the same configuration as the gate dielectric film 182 illustrated in FIG. 11. However, the gate dielectric film 182A may include the first blocking dielectric film BD1 and the second blocking dielectric film BD2 instead of the blocking dielectric film BD. The first blocking dielectric film BD1 may extend parallel to the channel region 184, and the second blocking dielectric film BD2 may be disposed to border or surround the gate line 130. Each of the first blocking dielectric film BD1 and the second blocking dielectric film BD2 may be formed of silicon oxide, silicon nitride, and/or metal oxide. For example, the first blocking dielectric film BD1 may be formed of a silicon oxide film, and the second blocking dielectric film BD2 may be formed of a metal oxide film having a higher dielectric constant than the silicon oxide film.

The configuration and shape of the gate dielectric films 182 and 182A that may be included in the semiconductor device 100 are not limited to those illustrated in FIGS. 11 and 12, and various modifications and changes are possible within the scope of the technical spirit of the inventive concept.

Referring back to FIGS. 9 and 10, in the connection area CON of the cell array structure CAS, a plurality of conductive pad areas 112 constituting the stepped connection part may have a width that gradually decreases with increasing distance from the common source line CSL in the horizontal direction (e.g., X direction). In example embodiments, a plurality of dummy channel structures (not shown) passing or extending through the plurality of conductive pad areas 112 may be disposed in the connection area CON. The plurality of dummy channel structures support the gate stack GS and the plurality of conductive pad areas 112 to reduce or prevent unwanted structural deformation such as bending or breaking of these parts.

A plurality of bit lines BL may be disposed on the plurality of channel structures 180 in the cell array structure CAS. A plurality of bit line contact pads 194 may be disposed between the plurality of channel structures 180 and the plurality of bit lines BL. Each drain region 188 of the plurality of channel structures 180 may be connected to a corresponding one of the plurality of bit lines BL through the bit line contact pad 194. The plurality of bit line contact pads 194 may be insulated from each other by the first upper insulating film 193. The plurality of bit lines BL may be insulated from each other by the second upper insulating film 195. Each of the plurality of bit line contact pads 194 and the plurality of bit lines BL may be formed of metal, metal nitride, or a combination thereof. For example, each of the plurality of bit line contact pads 194 and the plurality of bit lines BL may be made of tungsten, titanium, tantalum, copper, aluminum, titanium nitride, tantalum nitride, tungsten nitride, or a combination thereof. The first upper insulating film 193 and the second upper insulating film 195 may each be made of a silicon oxide film, a silicon nitride film, or a combination thereof.

A connection part insulating film 114 at least partially covering the plurality of conductive pad areas 112 may be disposed between the common source line CSL and the intermediate insulating film 187 in the cell array structure CAS. The connection part insulating film 114 may include portions at least partially covering the plurality of conductive pad areas 112 and a portion at least partially filling a portion of the peripheral circuit connection area 36C in the cell array structure CAS. The connection part insulating film 114 may be formed of a silicon oxide layer, a silicon nitride layer, or a combination thereof.

A plurality of contact structures CTS penetrating or extending into the connection part insulating film 114 in a vertical direction (Z direction) may be disposed on the plurality of conductive pad areas 112 in the connection area CON. One end portion of the plurality of contact structures CTS may be connected to a plurality of wiring layers ML disposed between the plurality of contact structures CTS and the peripheral circuit structure PCS. The plurality of wiring layers ML may be disposed to pass through the second upper insulating film 195 at the same level as the plurality of bit lines BL.

Each of the plurality of contact structures CTS may include a contact plug 116 elongating in a vertical direction (Z direction). A sidewall of the contact plug 116 may be bordered or surrounded by an insulating plug 115. The other end portion of the contact structure CTS may be electrically connected to the conductive pad area 112.

As illustrated in FIG. 10, in the peripheral circuit connection area 36C, the plurality of contact plugs IOC may extend in a vertical direction (Z direction) to pass through the connection part insulating film 114, the intermediate insulating film 187, and the first upper insulating film 193, respectively, and may be connected to the wiring layer ML. One end portion of each of the plurality of contact plugs IOC may be connected to the wiring structure MS through the wiring layer ML. The wiring structure MS may include a first upper wiring layer 172, a second upper wiring layer 174, and a third upper wiring layer 176. Each of the wiring layer ML, the first upper wiring layer 172, the second upper wiring layer 174, and the third upper wiring layer 176 may be made of tungsten, titanium, tantalum, copper, aluminum, titanium nitride, tantalum nitride, tungsten nitride, or a combination thereof. In example embodiments, the plurality of bit lines BL and the plurality of wiring layers ML may be made of the same material.

The plurality of gate lines 130 may be connected to a plurality of circuits, for example, a plurality of circuits included in the second circuit area CT2 and the third circuit area CT3, included in a plurality of circuit areas included in the peripheral circuit structure PCS, respectively, through the conductive pad area 112, the contact structure CTS, the wiring structure MS, and the bonding structure BS.

In the cell array structure CAS, the plurality of bit lines BL may be connected to a plurality of circuits, for example, a plurality of circuits included in the fourth circuit area CT4, included in a plurality of circuit areas included in the peripheral circuit structure PCS through the wiring structure MS and the bonding structure BS.

The peripheral circuit connection area 36C may include a plurality of connection pads 92 disposed on the plurality of contact plugs IOC. The other end portion of each of the plurality of contact plugs IOC may be connected to one connection pad 92 selected from among the plurality of connection pads 92. The plurality of connection pads 92 may be made of the same material as the common source line CSL. In example embodiments, the common source line CSL and the connection pad 92 may include metal, a conductive metal nitride, a semiconductor material, or a combination thereof. For example, the common source line CSL and the connection pad 92 may be made of tungsten, titanium, tantalum, copper, aluminum, titanium nitride, tantalum nitride, tungsten nitride, or a combination thereof, but embodiments are not limited thereto.

The common source line CSL may be at least partially covered with the insulating film 106 and the protective film 108, and the plurality of connection pads 92 may be exposed to the outside through an opening defined by the insulating film 106 and the protective film 108. The insulating film 106 may be made of a silicon oxide film and the protective film 108 may be made of a polyimide-based material film, such as photo sensitive polyimide PSPI, but embodiments of the inventive concept are not limited thereto.

In the peripheral circuit connection area 36C, one end portion of each of the plurality of contact plugs IOC may be configured to connect to the first circuit area CT1 in the peripheral circuit structure PCS through the wiring layer ML, the wiring structure MS, and the bonding structure BS. Each of the plurality of contact structures CTS in the connection area CON of the cell array structure CAS may be configured to connect to at least one circuit area selected from the second circuit area CT2 and the third circuit area CT3 of the peripheral circuit structure PCS through the wiring layer ML, the wiring structure MS, and the bonding structure BS.

In embodiments, each of the plurality of contact plugs 116 included in the plurality of contact structures CTS, and the first upper wiring layer 172, the second upper wiring layer 174, and the third upper wiring layer 176 included in the wiring structure MS may be made of tungsten, titanium, tantalum, copper, aluminum, titanium nitride, tantalum nitride, tungsten nitride, or a combination thereof.

The plurality of transistors TR in the peripheral circuit structure PCS may include circuits included in the first to fourth circuit areas CT1, CT2, CT3, and CT4, for example, a row decoder 32, a page buffer 34, a data I/O circuit 36, a control logic 38, and a common source line driver 39. In example embodiments, unit elements such as resistors and capacitors may be further disposed in the peripheral circuit structure PCS.

The plurality of transistors TR in the peripheral circuit structure PCS may be configured to be electrically connected to the memory cell array MCA of the cell array structure CAS through a wiring structure MWS consisting of a plurality of contact plugs 72 and a plurality of conductive lines 74.

In the cell array structure CAS, the channel structure 180 may be configured to connect to the fourth circuit area CT4 included in the peripheral circuit structure PCS through the bit line contact pad 194, the bit line BL, the wiring structure MS, and the bonding structure BS. For example, the channel structure 180 may be configured to be electrically connected to the page buffer 34 (see FIG. 1) included in the fourth circuit area CT4 of the peripheral circuit structure PCS.

The semiconductor device 100 described with reference to FIGS. 4 to 10 includes a peripheral circuit connection area 36C disposed in a center area between a pair of adjacent memory cell blocks BLK in one chip area CR, and the peripheral circuit connection area 36C overlaps the first circuit area CT1 included in the peripheral circuit structure PCS in the vertical direction (Z direction). To improve the degree of integration of the semiconductor device 100, the number of stacked gate lines 130 is increased in the cell array structure CAS, and accordingly, the peripheral circuit connection area 36C is placed in the idle space that may be generated around the connection area CON of the cell array structure CAS, and by providing a connection path between the peripheral circuit structure PCS and the outside, efficient spatial arrangement may be implemented in the chip area CR constituting the semiconductor device 100. Accordingly, the degree of integration of the semiconductor device 100 may be further improved. In particular, as the circuit areas that are placed on the outer edge of the chip area CR to limit the efficient placement of the chip area CR are arranged in an area overlapping in the vertical direction (Z direction) with the peripheral circuit connection area 36C around the connection area CON of the cell array structure CAS, the area of the chip area CR may be further reduced, and the semiconductor device 100 having an efficient arrangement structure may be provided by arranging circuits having a close connection relationship adjacent to each other.

Figure 13:
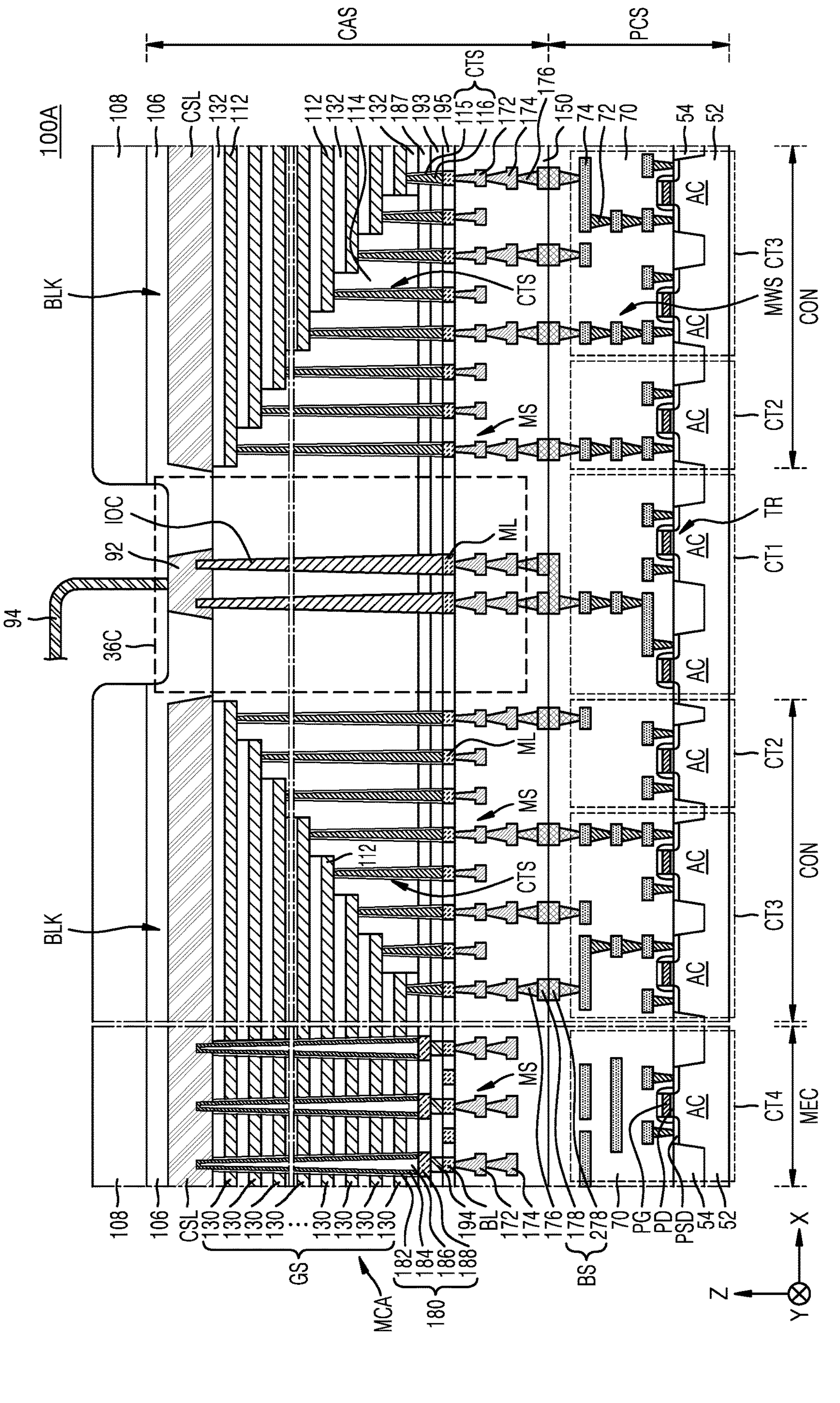
FIG. 13 is a cross-sectional view of partial regions of each of a peripheral circuit structure and a cell array structure of a semiconductor device according to other embodiments of the inventive concept.

FIG. 13 is a cross-sectional view of partial regions of the peripheral circuit structure PCS and the cell array structure CAS of the semiconductor device 100A according to other embodiments according to the inventive concept.

Referring to FIG. 13, a semiconductor device 100A has substantially the same configuration as the semiconductor device 100 described with reference to FIGS. 4 to 10. However, in the semiconductor device 100A, one connection pad 92 may be disposed between a pair of adjacent common source lines CSL in the first horizontal direction (X direction). The one connection pad 92 may be disposed at a position spaced apart from the pair of common source lines CSL in a first horizontal direction (X direction) at the same vertical level as a pair of adjacent common source lines CSL with the peripheral circuit connection area 36C therebetween.

An end portion of the contact plug IOC disposed in the peripheral circuit connection area 36C may be configured to connect to the first circuit area CT1 included in the peripheral circuit structure PCS through the wiring layer ML, the wiring structure MS, and the bonding structure BS. The other end portion of the contact plug IOC disposed in the peripheral circuit connection area 36C may be configured to connect to the external connection terminal 94 through the one connection pad 92.

In example embodiments, the semiconductor device 100A may have substantially the same planar structure as the planar structure described with reference to FIG. 6. However, the connection pad area 36P may include one pad group among the first connection pad group 92G1 and the second connection pad group 92G2 including the plurality of connection pads 92. Some of the plurality of connection pads 92 included in the one pad group are configured to connect to a plurality of memory cell blocks BLK1, BLK2, . . . , BLKp of a memory cell area MEC on one side of the peripheral circuit connection area 36C and the connection pad area 36P in the first horizontal direction (X direction) through the first circuit area CT1 of the peripheral circuit structure PCS, and other some of the plurality of connection pads 92 included in the one pad group may be configured to connect to the plurality of memory cell blocks BLK1, BLK2, . . . , BLKp of the memory cell area MEC on the other side of the peripheral circuit connection area 36C and the connection pad area 36P in the first horizontal direction (X direction) through the first circuit area CT1 of the peripheral circuit structure PCS.

Figure 14:
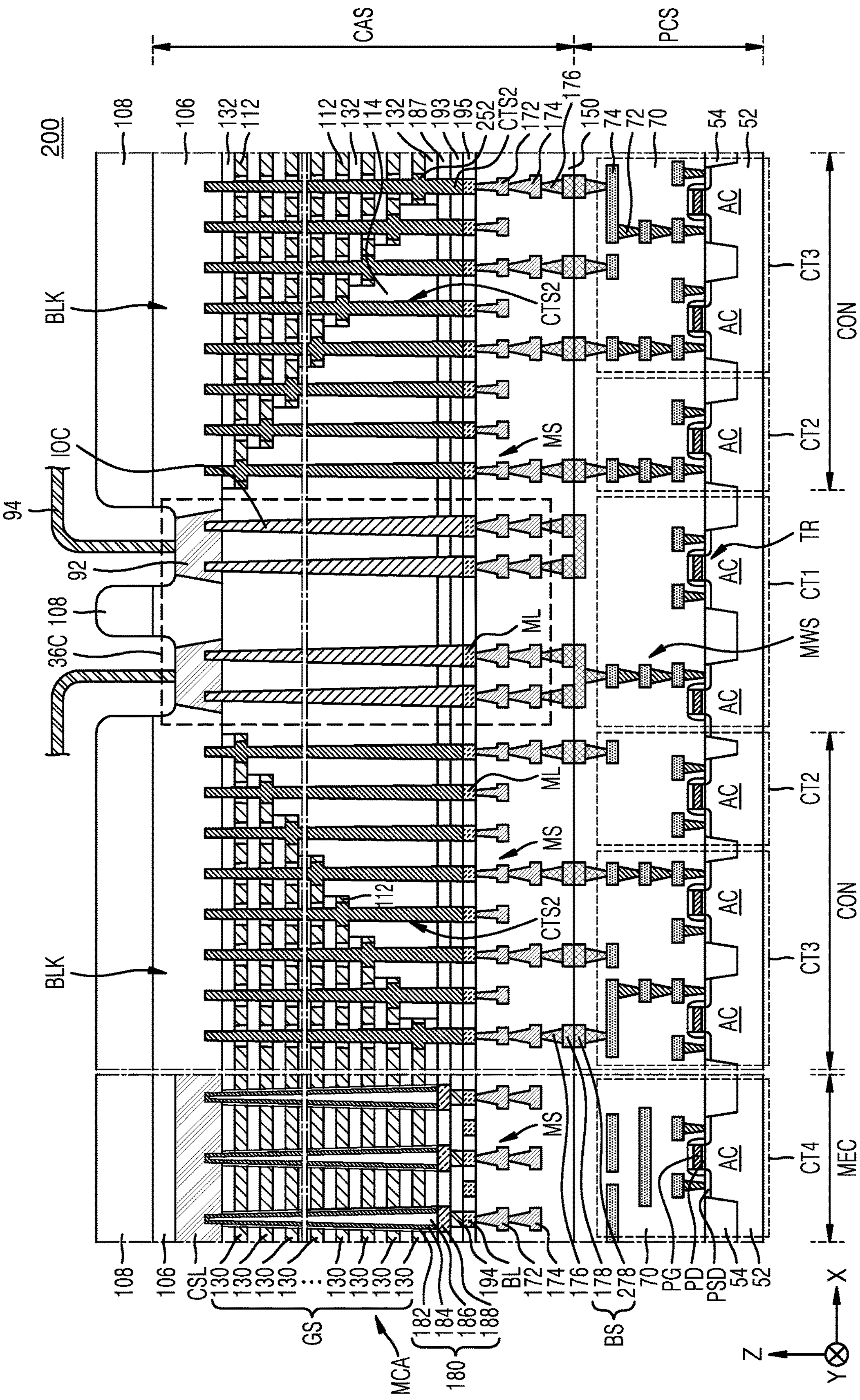
FIG. 14 is a cross-sectional view illustrating a semiconductor device according to still other embodiments of the inventive concept.

FIG. 14 is a cross-sectional view illustrating a semiconductor device 200 according to still other embodiments according to the inventive concept.

Referring to FIG. 14, a semiconductor device 200 has substantially the same configuration as the semiconductor device 100 described with reference to FIGS. 4 to 10. However, the semiconductor device 200 may include a plurality of contact structures CTS2 disposed in the connection area CON of the cell array structure CAS.

Each of the plurality of contact structures CTS2 may penetrate or extend into at least a portion of the plurality of conductive pad areas 112 in the connection area CON in the vertical direction (Z direction), and may be electrically connected to one conductive pad area 112 selected from among a plurality of conductive pad areas 112. An insulating ring 252 may be disposed between another conductive pad area 112 not connected to the contact structure CTS2 among the plurality of conductive pad areas 112 and the contact structure CTS2 to insulate the conductive pad area 112 from the contact structure CTS2. In example embodiments, the insulating ring 252 may be made of silicon oxide, but embodiments are not limited thereto.

One end portion of each of the plurality of contact structures CTS2 may be connected to the wiring structure MS, and the other end portion of each of the plurality of contact structures CTS2 may be at least partially covered with an insulating film 106. A more detailed configuration of the plurality of contact structures CTS2 is substantially the same as that described for the plurality of contact structures CTS with reference to FIG. 10.

Figure 15A:
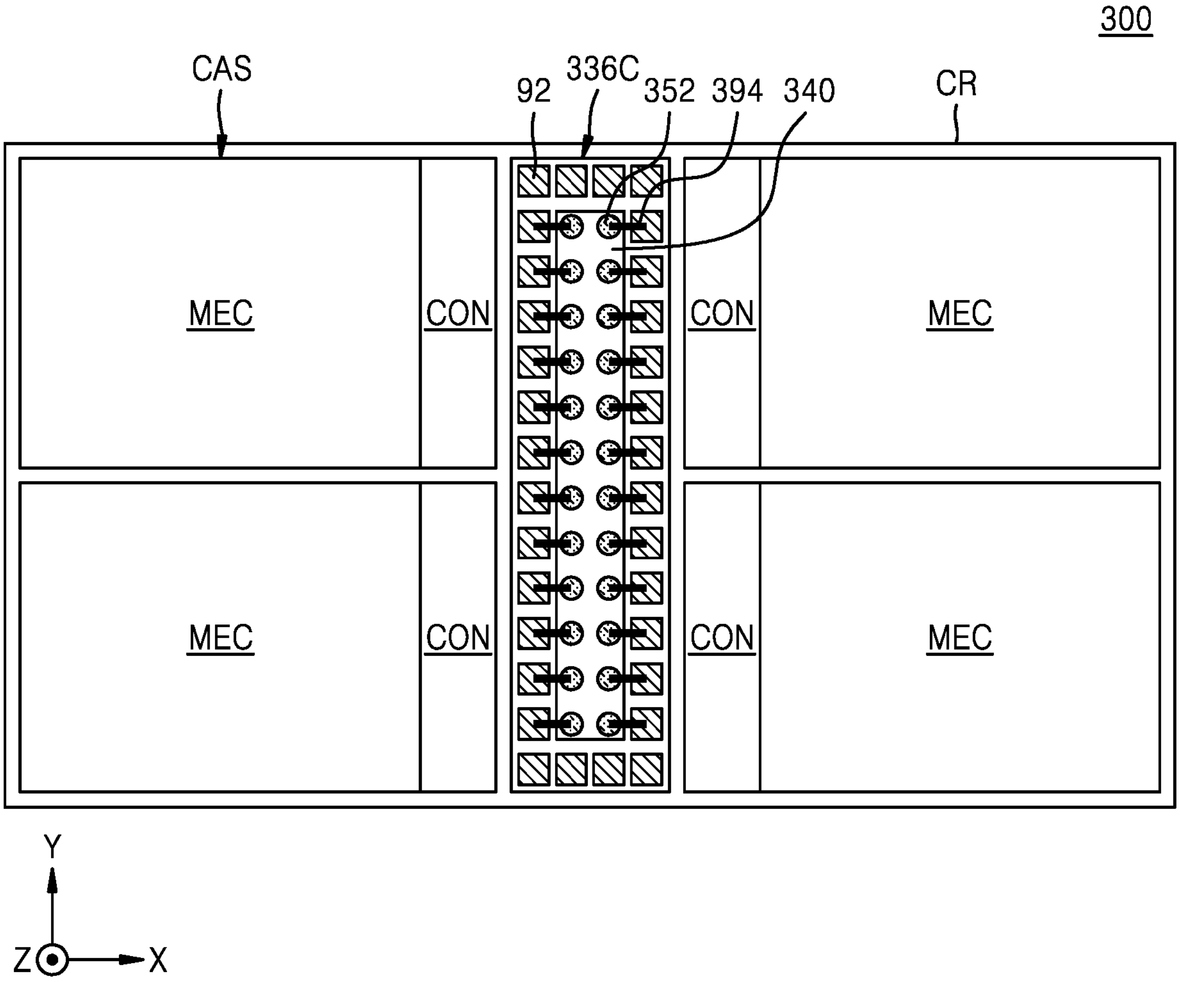
FIG. 15A is a plan view of a semiconductor device according to still other embodiments of the inventive concept.
Figure 15B:
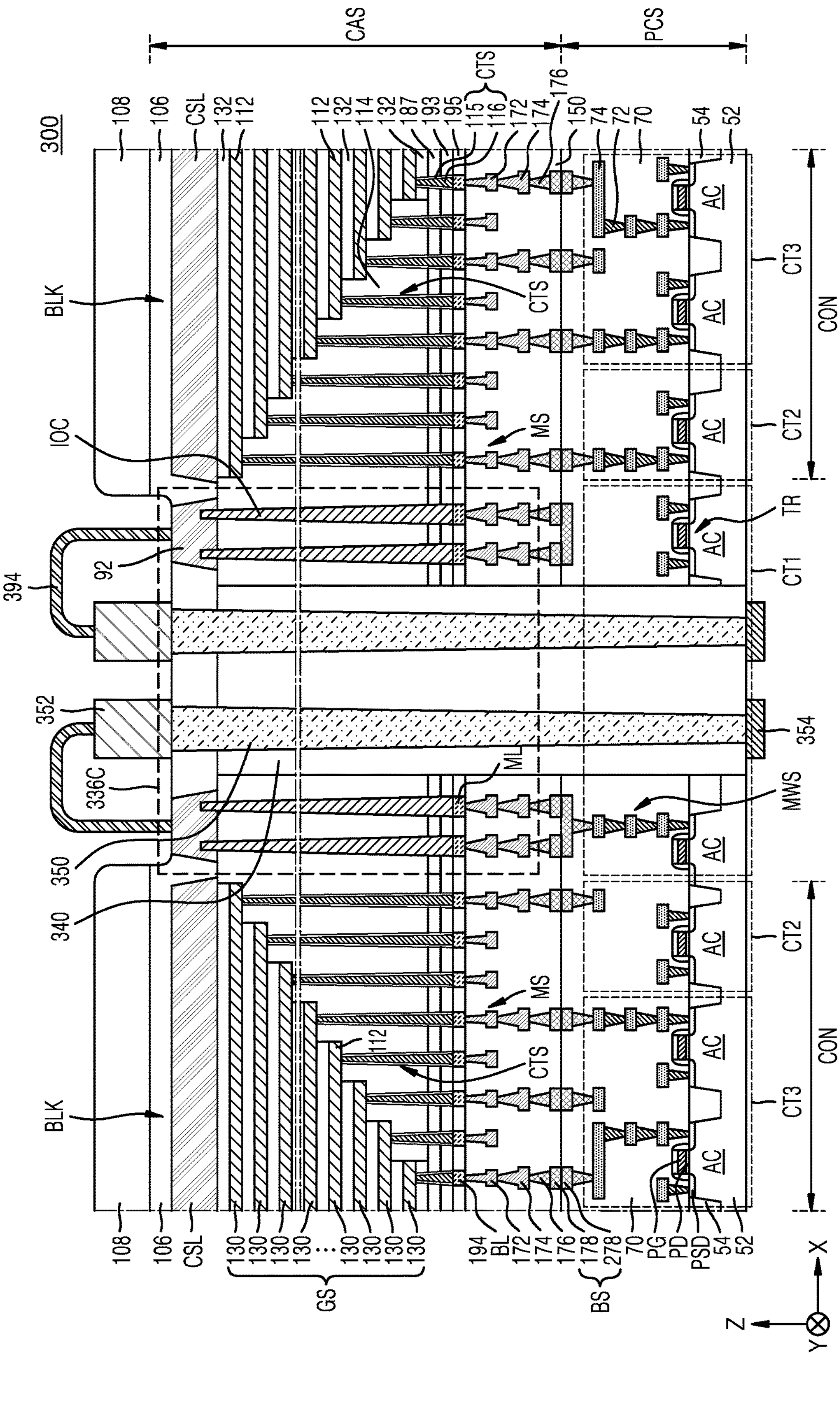
FIG. 15B is a cross-sectional view of a connection area of a cell array structure and a portion of a peripheral circuit structure of the semiconductor device illustrated in FIG. 15A.

FIG. 15A is a top plan view of a semiconductor device 300 according to still other embodiments of the inventive concepts, and FIG. 15B is a cross-sectional view of a connection area CON of a cell array structure CAS and some areas of a peripheral circuit structure PCS of the semiconductor device 300.

Referring to FIGS. 15A and 15B, a semiconductor device 300 has substantially the same configuration as the semiconductor device 100 described with reference to FIGS. 4 to 10. However, the semiconductor device 300 may include a peripheral circuit connection area 336C and a connection pad area 336P extending along a second horizontal direction (Y direction) from the center area of the chip area CR in the first horizontal direction (X direction).

The peripheral circuit connection area 336C and the connection pad area 336P may have substantially the same configuration as described for the peripheral circuit connection area 36C and the connection pad area 36P with reference to FIGS. 4 to 10. However, a plurality of through electrodes 350 may be disposed in the peripheral circuit connection area 336C. The plurality of through electrodes 350 may extend in the vertical direction (Z direction) in the peripheral circuit connection area 336C and penetrate or extend into the cell array structure CAS and the peripheral circuit structure PCS in the vertical direction (Z direction). Portions of the plurality of through electrodes 350 penetrating or extending into the cell array structure CAS and the peripheral circuit structure PCS may be bordered or surrounded by a through insulating film 340.

A plurality of first connection pads 352 may be disposed on the insulating film 106 outside the cell array structure CAS, and a plurality of second connection pads 354 may be disposed on the through insulating film 340 outside the peripheral circuit structure PCS. One end portion of each of the plurality of through electrodes 350 is connected to the first connection pad 352 adjacent to the cell array structure CAS, and the other end portion of each of the plurality of through electrodes 350 may be connected to the second connection pad 354 adjacent to the peripheral circuit structure PCS. In example embodiments, one end portion of each of the plurality of through electrodes 350 may be connected to the connection pad 92 through an external connection terminal 394. The plurality of through electrodes 350 may be configured to connect to at least one contact plug IOC among the plurality of contact plugs IOC through the external connection terminal 394 and the connection pad 92.

Each of the plurality of through electrodes 350, the plurality of first connection pads 352, and the plurality of second connection pads 354 may be made of a metal, a conductive metal nitride, or a combination thereof. For example, each of the plurality of through electrodes 350, the plurality of first connection pads 352, and the plurality of second connection pads 354 may be made of tungsten, nickel, cobalt, tantalum, tungsten nitride, titanium nitride, tantalum nitride, or combinations thereof, but embodiments are not limited thereto. The through insulating film 340 may be formed of a silicon oxide film, a silicon nitride film, or a combination thereof, but embodiments are not limited thereto.

Figure 16A:
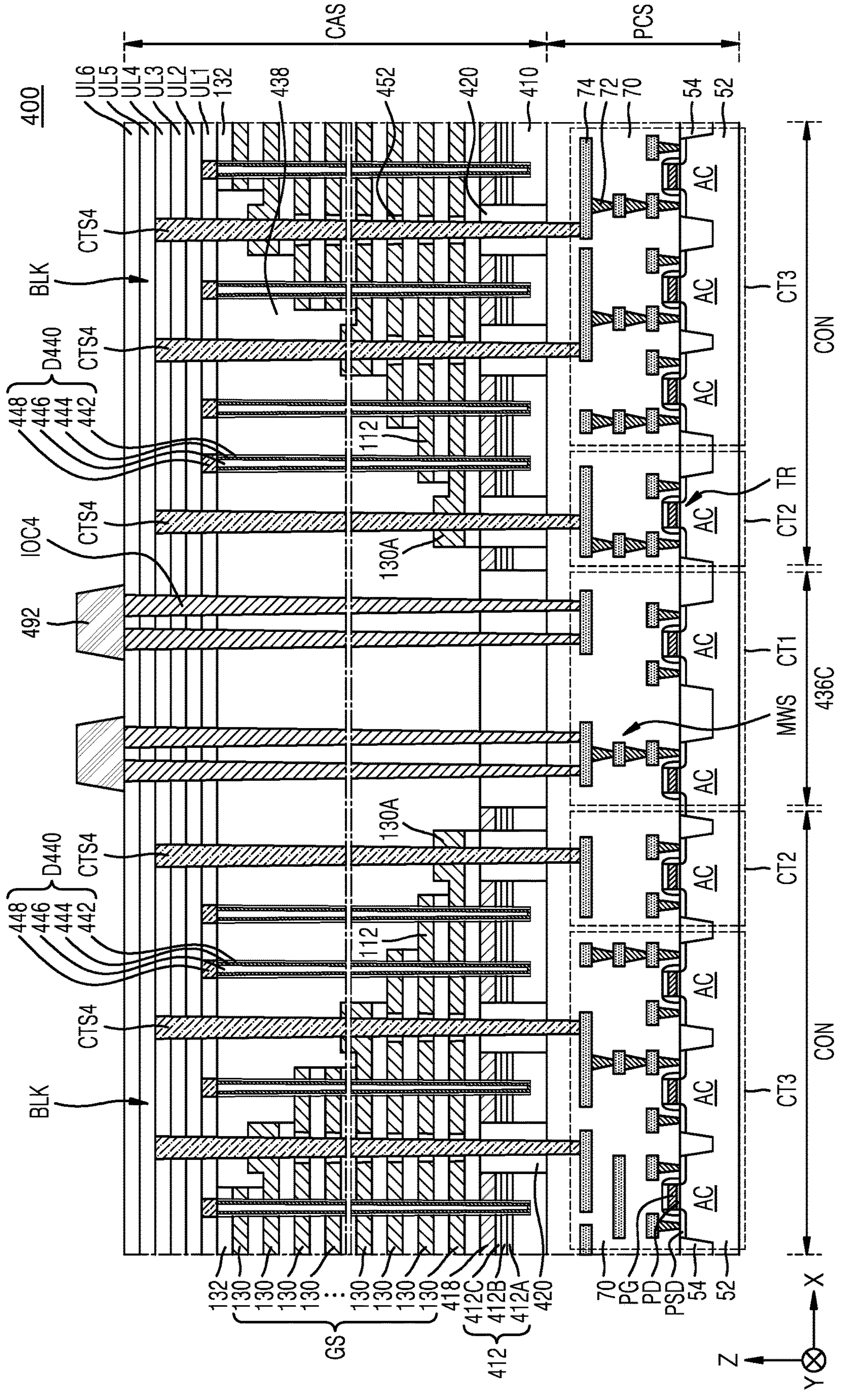
FIG. 16A is a cross-sectional view of a semiconductor device according to still other embodiments of the inventive concept.
Figure 16B:
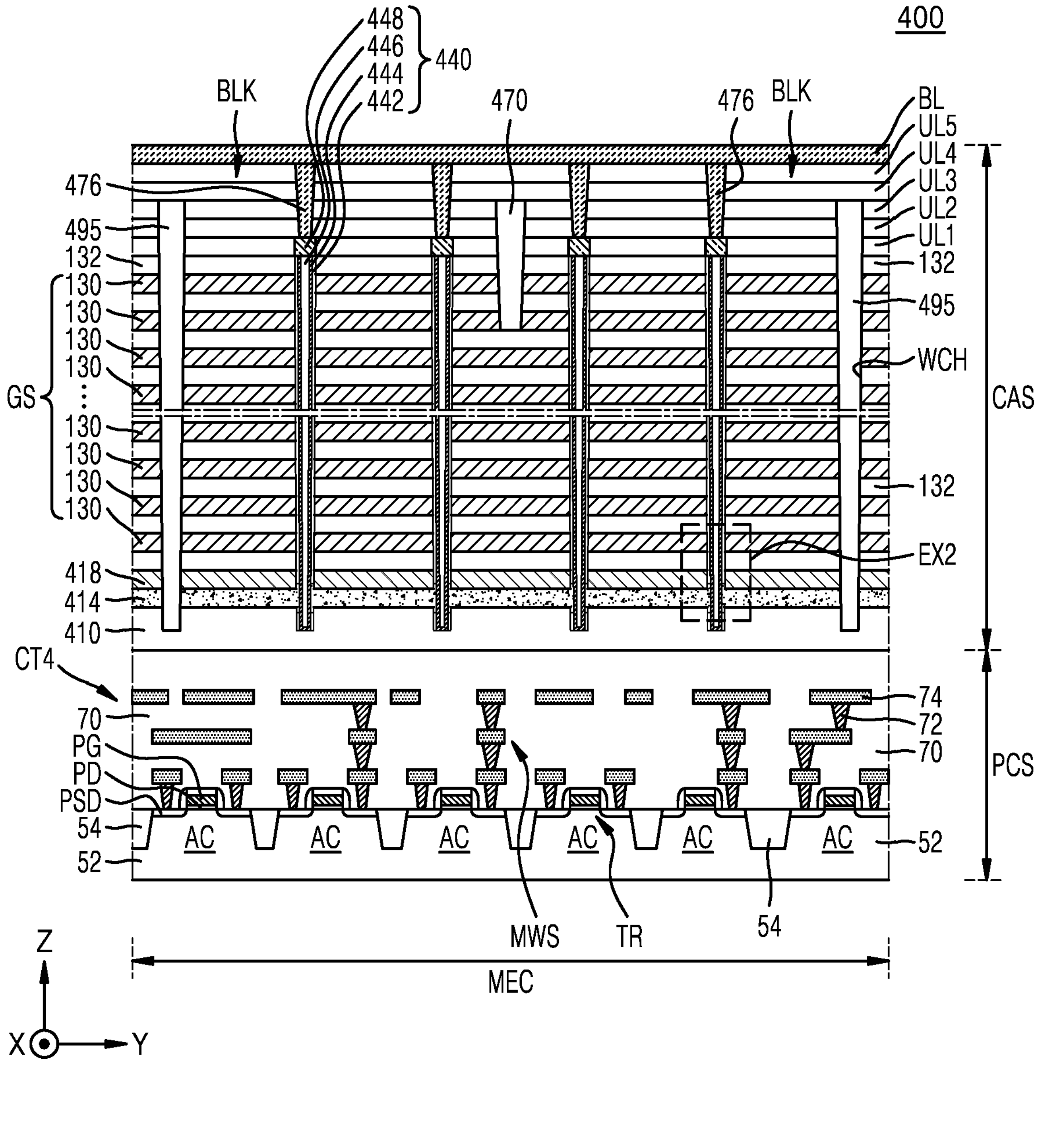
FIG. 16B is a cross-sectional view of a memory cell area of a cell array structure of the semiconductor device illustrated in FIG. 16A.
Figure 16C:
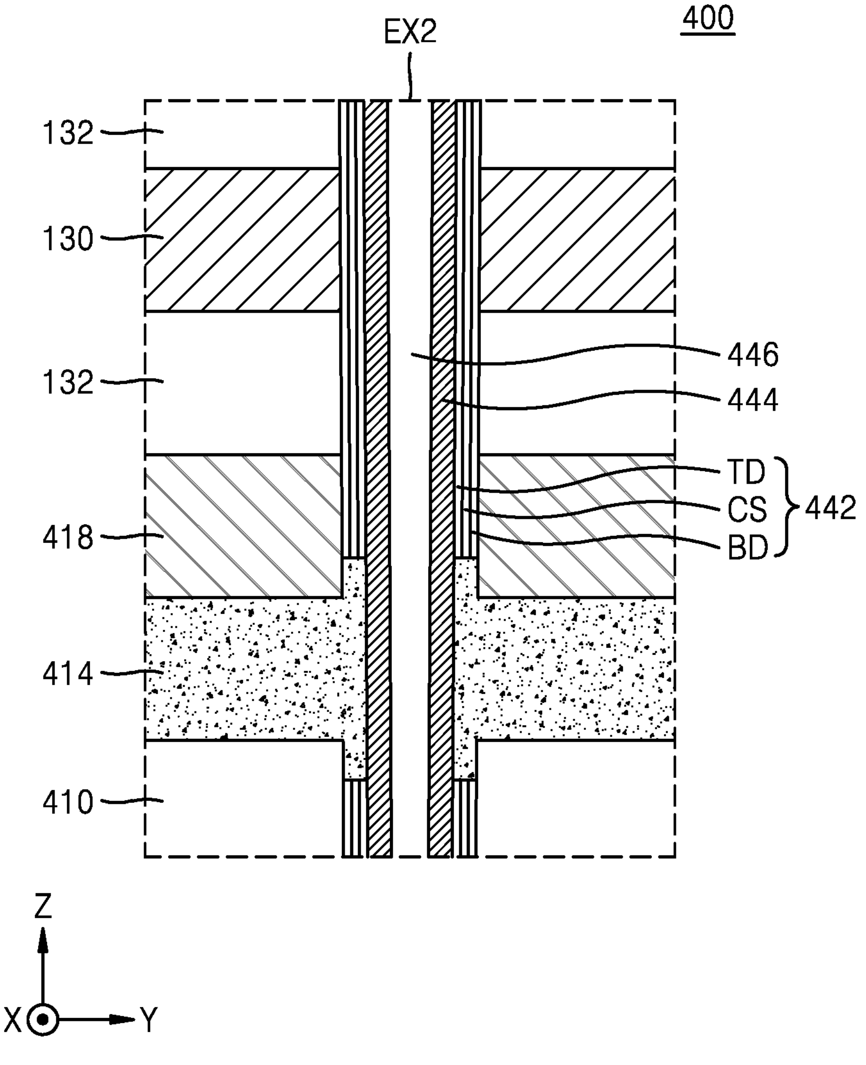
FIG. 16C is an enlarged cross-sectional view of some components included in the area indicated by "EX2" in FIG. 16B.

FIG. 16A is a cross-sectional view of a semiconductor device 400 according to other embodiments according to the inventive concept. FIG. 16B is a cross-sectional view of a memory cell area MEC of a cell array structure CAS of the semiconductor device 400. FIG. 16C is an enlarged cross-sectional view of some components included in the area indicated as "EX2" in FIG. 16B.

FIG. 16A shows a connection area CON included in each of a pair of adjacent memory cell blocks BLK selected from among the plurality of memory cell blocks BLK1, BLK2, . . . , BLKp illustrated in FIG. 3B in the first horizontal direction (X direction), a peripheral circuit connection area 436C disposed between the pair of memory cell blocks BLK, and a first circuit area CT1, a second circuit area CT2, and a third circuit area CT3 of the peripheral circuit structure PCS under each of the pair of memory cell blocks BLK. FIG. 16B shows a partial region of the memory cell area (MEC) of one memory cell block BLK selected from among the plurality of memory cell blocks BLK1, BLK2, . . . , BLKp illustrated in FIG. 3B, and a fourth circuit area CT4 of the peripheral circuit structure PCS located below the partial region.

Referring to FIGS. 16A to 16C, the semiconductor device 400 has substantially the same configuration as the semiconductor device 100 described with reference to FIGS. 4 to 10. However, as the connection area CON of the cell array structure CAS of the semiconductor device 400 approaches the peripheral circuit structure PCS, i.e., a distance between the connection area CON and the peripheral circuit structure PCS decreases, the planar area in the X-Y plane may increase similar to what is described with reference to FIG. 3B. The peripheral circuit structure PCS of the semiconductor device 400 may have substantially the same configuration as that of the peripheral circuit structure PCS of the semiconductor device 100 described with reference to FIGS. 4 to 10.

As illustrated in FIG. 16A, the cell array structure CAS may include a cell substrate 410 disposed between the peripheral circuit structure PCS and the gate stack GS. An insulating plate 412, a second conductive plate 418, and a plurality of conductive pad areas 112 may be disposed on the cell substrate 410 in the connection area CON of the cell array structure CAS. As illustrated in FIG. 16B, a first conductive plate 414, a second conductive plate 418, and a plurality of gate lines 130 may be disposed on a cell substrate 410 in a memory cell area MEC of a cell array structure CAS. The cell substrate 410, the first conductive plate 414, and the second conductive plate 418 may function as a common source line CSL supplying current to the vertical memory cells included in the cell array structure CAS.

In example embodiments, the cell substrate 410 may be made of a semiconductor material such as polysilicon. Each of the first conductive plate 414 and the second conductive plate 418 may be formed of a doped polysilicon film, a metal film, or a combination thereof. The metal film may be made of tungsten (W), but embodiments are not limited thereto.

An insulating film 132 may be disposed between the second conductive plate 418 and the plurality of gate lines 130 and between each of the plurality of gate lines 130. Among the plurality of gate lines 130, the uppermost gate line 130 may be at least partially covered with an insulating film 132.

As illustrated in FIG. 16B, a plurality of word line cut structures 495 may extend along the first horizontal direction (X direction) on the cell substrate 410. A width of each of the plurality of gate lines 130 included in the memory cell block BLK in the second horizontal direction (Y direction) may be limited by the plurality of word line cut structures 495. Each of the plurality of word line cut structures 495 may be formed of an insulating structure. In example embodiments, the insulating structure may be formed of silicon oxide, silicon nitride, silicon oxynitride, and/or a low-k material. For example, the insulating structure may be formed of a silicon oxide film, a silicon nitride film, an SiON film, a SiOCN film, a SiCN film, or a combination thereof. In other embodiments, at least a portion of the insulating structure may be formed of an air gap.

As illustrated in FIG. 16B, a plurality of gate lines 130 constituting one gate stack GS are stacked on the second conductive plate 418 between two adjacent word line cut structures 495 so as to overlap each other in the vertical direction (Z direction). In the plurality of gate lines 130, the upper two gate lines 130 may be separated in the second horizontal direction (Y direction) with the string select line cut structure 470 therebetween. The two gate lines 130 separated from each other with the string select line cut structure 470 therebetween may constitute the string select line SSL described with reference to FIG. 1. FIG. 16B illustrates a case in which one string select line cut structure 470 is formed in one gate stack GS, but embodiments of the inventive concept are not limited to those illustrated in FIG. 6. For example, at least two string select line cut structures 470 may be formed on one gate stack GS. The string select line cut structure 470 may be at least partially filled with an insulating film. In example embodiments, the string select line cut structure 470 may include an insulating film formed of an oxide film, a nitride film, or a combination thereof. In example embodiments, at least a portion of the string select line cut structure 470 may be formed of an air gap.

As illustrated in FIG. 16A, a plurality of insulating plugs 420 penetrating or extending into the cell substrate 410, the insulating plate 412, and the second conductive plate 418 in a vertical direction (Z direction) may be disposed in the connection area CON and the peripheral circuit connection area 436C. The plurality of insulating plugs 420 may be formed of a silicon oxide film, a silicon nitride film, or a combination thereof.

As illustrated in FIG. 16B, a plurality of channel structures 440 in the memory cell area MEC may pass or extend through the plurality of gate lines 130, the plurality of insulating films 132, the second conductive plate 418, and the first conductive plate 414 in a vertical direction (Z direction). Each of the plurality of channel structures 440 may include a gate dielectric film 442, a channel region 444, a buried insulating film 446, and a drain region 448.

The plurality of channel structures 440 may have substantially the same configuration as described with respect to the channel structure 180 with reference to FIG. 10. As illustrated in FIG. 16C, the gate dielectric film 442 may include a tunneling dielectric film TD, a charge storage film CS, and a blocking dielectric film BD sequentially formed from the channel region 444. The first conductive plate 414 may pass through a portion of the gate dielectric film 442 in a horizontal direction (X direction and/or Y direction) to contact the channel region 444. The gate dielectric film 442 may include a portion at least partially covering a sidewall of the channel region 444 at a level higher in the Z-direction than the first conductive plate 414 and a portion at least partially covering a bottom surface of the channel region 444 at a level lower in the Z-direction than the first conductive plate 414. The channel region 444 may be spaced apart from the cell substrate 410 with the gate dielectric film 442 therebetween. A sidewall of the channel region 444 may be configured to contact the first conductive plate 414 and be electrically connectable to the first conductive plate 414. A more detailed configuration of each of the gate dielectric film 442, channel region 444, buried insulating film 446, and drain region 448 is substantially the same as that described for the gate dielectric film 182, the channel region 184, the buried insulating film 186, and the drain region 188 with reference to FIG. 10.

The plurality of drain regions 148 may be insulated from each other by the first upper insulating film UL1. In the memory cell area MEC, the plurality of channel structures 440 and the first upper insulating film UL1 may be at least partially covered with the second upper insulating film UL2.

The string select line cut structure 470 may penetrate or extend into the first upper insulating film UL1, the second upper insulating film UL2, and the third upper insulating film UL3 in the vertical direction (Z direction). A fourth upper insulating film UL4 and a fifth upper insulating film UL5 may be sequentially formed on the string select line cut structure 470, the word line cut structure 495, and the third upper insulating film UL3.

A plurality of bit lines BL may be disposed on the fifth upper insulating film UL5 in the memory cell area MEC of the memory stack structure MST. The plurality of bit lines BL may extend parallel to each other in the second horizontal direction (Y direction). The plurality of channel structures 440 may be connected to a plurality of bit lines BL, respectively, through the plurality of contact plugs 476 penetrating or extending into the second upper insulating film UL2, the third upper insulating film UL3, the fourth upper insulating film UL4, and the fifth upper insulating film UL5.

A space between each of the plurality of bit lines BL may be at least partially filled with a sixth upper insulating film UL6 (see FIG. 16A). Each of the first upper insulating film UL1, the second upper insulating film UL2, the third upper insulating film UL3, the fourth upper insulating film UL4, the fifth upper insulating film UL5, and the sixth upper insulating film UL6 may be formed of an oxide film, a nitride film, or a combination thereof.

As illustrated in FIG. 16A, an insulating plate 412 and a second conductive plate 418 may be sequentially stacked on the cell substrate 410 in the connection area CON of the cell array structure CAS. The insulating plate 412 may be formed of a multi-layered insulating film including a first insulating film 412A, a second insulating film 412B, and a third insulating film 412C sequentially stacked on the cell substrate 410. In example embodiments, the first insulating film 412A and the third insulating film 412C may be made of a silicon oxide film, and the second insulating film 412B may be made of a silicon nitride film.

In the connection area CON, each of the plurality of conductive pad areas 112 may include a gate pad part 130A. The gate pad part 130A may be disposed on an edge part furthest from the memory cell area MEC among the conductive pad areas 112. In the connection area CON, each edge part of the plurality of conductive pad areas 112 and the plurality of insulating films 132 may be at least partially covered with an interlayer insulating film 438. The interlayer insulating film 438 may be formed of a silicon oxide film, but embodiments are not limited thereto.

As illustrated in FIG. 16A, a plurality of contact structures CTS4 may be disposed in the connection area CON. Each of the plurality of contact structures CTS4 may pass or extend through at least a portion of the interlayer insulating film 438, the plurality of conductive pad areas 112, and the plurality of insulating films 132. One end portion of each of the plurality of contact structures CTS4 may pass or extend through the insulating plug 420 and extend to the peripheral circuit area PCS.

Each of the plurality of contact structures CTS4 may be connected to the gate pad part 130A in one conductive pad area 112 selected from among the plurality of conductive pad areas 112, and may not be connected to other conductive pad areas 112 except for the selected one gate line 130. Each of the plurality of contact structures CTS4 may be connected to the selected one gate line 130 through a gate pad part 130A and a conductive pad area 112. The contact structure CTS4 may be horizontally spaced apart from other conductive pad areas 112 except for the selected one conductive pad area 112. An insulating ring 452 may be disposed between the contact structure CTS4 and the conductive pad area 112 not connected to the contact structure CTS4. In example embodiments, the insulating ring 452 may be made of silicon oxide, but embodiments are not limited thereto.

The plurality of contact structures CTS4 may pass through the first upper insulating film UL1, the second upper insulating film UL2, the third upper insulating film UL3, and the fourth upper insulating film UL4 in a vertical direction (Z direction). The upper surface of each of the plurality of contact structures CTS4 may be at least partially covered with a fifth upper insulating film UL5 and a sixth upper insulating film UL6. One end portion of each of the plurality of contact structures CTS4 may penetrate or extend into the insulation plug 420 in the vertical direction (Z direction), and may be connected to one conductive line 74 among a plurality of conductive lines 74 included in the peripheral circuit structure PCS. Each of the plurality of contact structures CTS4 may be formed of tungsten, titanium, tantalum, copper, aluminum, titanium nitride, tantalum nitride, tungsten nitride, or a combination thereof.

As illustrated in FIG. 16A, a plurality of dummy channel structures D440 may be disposed in the connection area CON. Each of the plurality of dummy channel structures D440 may pass or extend through at least a portion of the interlayer insulating film 438, the plurality of gate lines 130, and the plurality of insulating films 132. Each of the plurality of dummy channel structures D440 may include a gate dielectric film 442, a channel region 444, a buried insulating film 446, and a drain region 448 similarly to the channel structure 440. However, the plane size of each of the plurality of dummy channel structures D440 may be greater than the plane size of the channel structure 440.

In the connection area CON, the interlayer insulating film 438 may be at least partially covered with the first upper insulating film UL1. The drain regions 448 of each of the plurality of dummy channel structures D440 may be insulated from each other by the first upper insulating film UL1. In the connection area CON, the plurality of dummy channel structures D440 and the first upper insulating film UL1 may be at least partially covered with the second upper insulating film UL2.

As illustrated in FIG. 16A, the peripheral circuit connection area 136 may include a plurality of contact plugs IOC4 disposed between a pair of connection areas CON included in a pair of memory cell blocks BLK and a plurality of connection pads 492 connected to the plurality of contact plugs IOC4. Each of the plurality of contact plugs IOC4 may pass through the cell substrate 410 and be connected to at least one circuit included in the first circuit area CT1. Each of a plurality of contact plugs IOC4 may extend in the vertical direction (Z direction) through the interlayer insulating film 438 and the insulating plug 420 in the peripheral circuit connection area 436C, and may be connected to at least one circuit included in the first circuit area CT1 of the peripheral circuit structure PCS. One end portion of each of the plurality of contact plugs IOC4 may contact one conductive line 74 among a plurality of conductive lines 74 included in the peripheral circuit structure PCS. The other end portion of each of the plurality of contact plugs IOC4 may be configured to connect to an external connection terminal through a connection pad 492. A more detailed configuration of the plurality of contact plugs IOC4 and the plurality of connection pads 492 is substantially the same as that described for the plurality of contact plugs IOC and the plurality of connection pads 92 with reference to FIG. 10.

According to the semiconductor devices 100A, 200, 300, and 400 described with reference to FIGS. 13 to 16B, similar to the above with respect to the semiconductor device 100 described with reference to FIGS. 4 to 10, peripheral circuit connection areas 36C, 336C, and 436C disposed in a center area between a pair of memory cell blocks BLK adjacent to each other in one chip area CR are included and the peripheral circuit connection areas 36C, 336C, and 436C overlap the first circuit area CT1 included in the peripheral circuit structure PCS in the vertical direction (Z direction). To improve the degree of integration of semiconductor devices 100A, 200, 300, and 400, the number of stacked gate lines 130 is increased in the cell array structure CAS, and accordingly, by arranging peripheral circuit connection areas 36C, 336C, and 436C in the idle space that may be generated around the connection area CON of the cell array structure CAS to provide a connection path between the peripheral circuit structure PCS and the outside, efficient spatial arrangement may be implemented in the chip area CR constituting the semiconductor devices 100A, 200, 300, and 400, and accordingly, the degree of integration of the semiconductor devices 100A, 200, 300, and 400 may be further improved.

Figure 17:
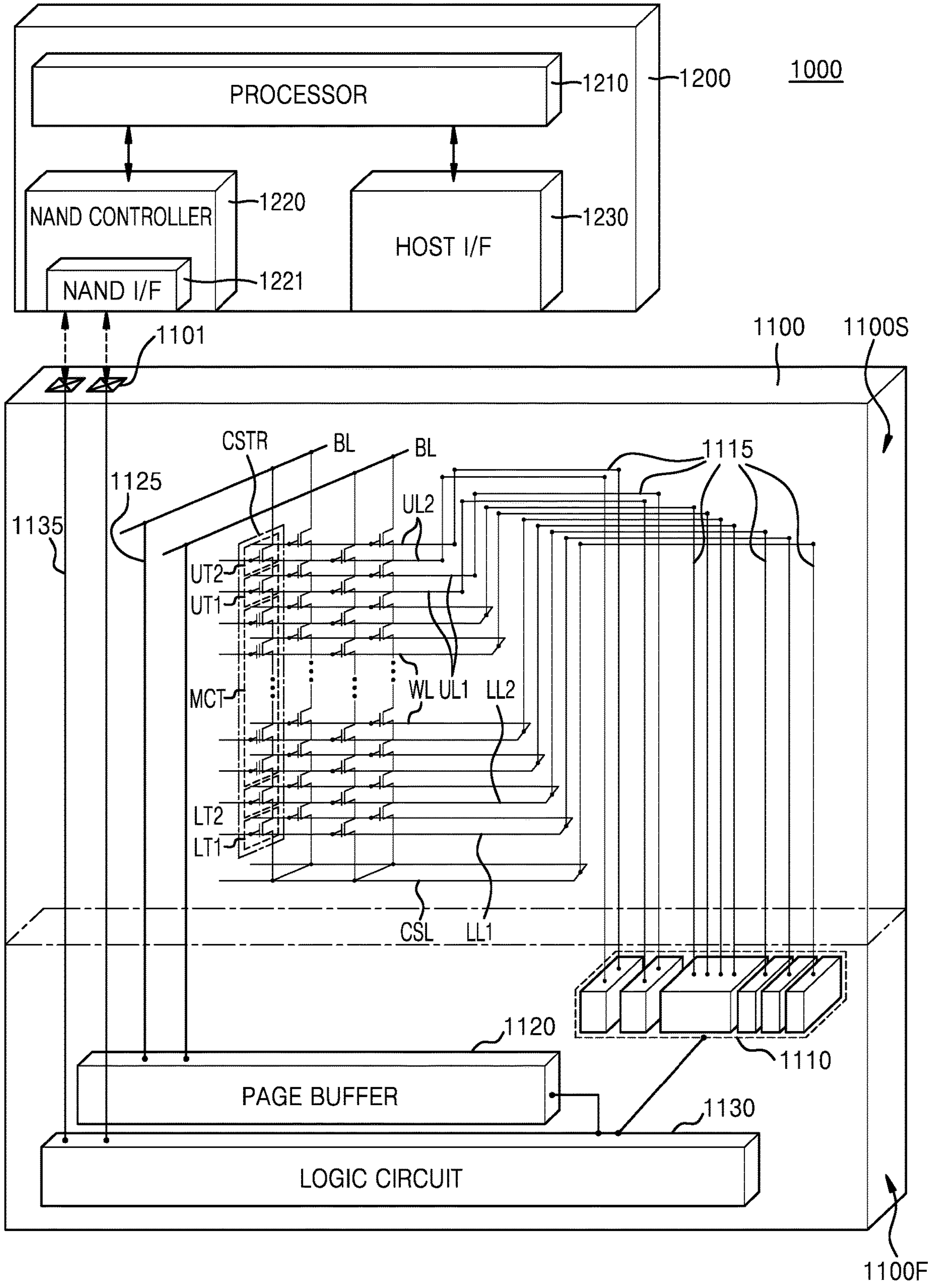
FIG. 17 is a diagram schematically illustrating an electronic system including a semiconductor device according to an embodiment of the inventive concept.

FIG. 17 is a diagram schematically illustrating an electronic system including a semiconductor device according to an embodiment of the inventive concept.

Referring to FIG. 17, an electronic system 1000 according to an embodiment of the inventive concept may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive device (SSD), a universal serial bus (USB), a computing system, a medical device, or a communication device including at least one semiconductor device 1100.

The semiconductor device 1100 may be a nonvolatile memory device. For example, the semiconductor device 1100 may be a NAND flash memory device including at least one of the structures described above with respect to the semiconductor devices 10A, 10B, 100, 100A, 200, 300, and 400 with reference to FIGS. 3A to 16C. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, the plurality of memory cell strings CSTR may each include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to different embodiments.

In example embodiments, the upper transistors UT1 and UT2 may include a string select transistor, and the lower transistors LT1 and LT2 may include a ground select transistor. The plurality of gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2.

The common source line CSL, the plurality of gate lower lines LL1 and LL2, the plurality of word lines WL, and the plurality of gate upper lines UL1 and UL2 may be electrically connected to the decoder circuit 1110 through a plurality of first connection wires 1115 extending from the first structure 1100F to the second structure 1100S. The plurality of bit lines BL may be electrically connected to the page buffer 1120 through a plurality of second connection wires 1125 extending from the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through the input/output pad 1101 electrically connected to the logic circuit 1130. The input/output pad 1101 may be electrically connected to the logic circuit 1130 through an input/output connection wire 1135 extending from the first structure 1100F to the second structure 1100S.

The memory controller 1200 may include a processor 1210, a NAND controller 1220, and a host interface 1230. In some embodiments, the electronic system 1000 may include a plurality of semiconductor devices 1100, and in this example, the controller 1200 may control the plurality of semiconductor devices 1100.

The processor 1210 may control the overall operation of the electronic system 1000 including the controller 1200. The processor 1210 may operate according to a preset firmware, and may access the semiconductor device 1100 by controlling the NAND controller 1220. The NAND controller 1220 may include a NAND OF 1221 that processes communication with the semiconductor device 1100. Through the NAND interface 1221, a control command for controlling the semiconductor device 1100, data to be written to the plurality of memory cell transistors MCT of the semiconductor device 1100, and data to be read from the plurality of memory cell transistors MCT of the semiconductor device 1100 may be transmitted. The host interface 1230 may provide a communication function between the electronic system 1000 and an external host. When receiving a control command from an external host through the host interface 1230, the processor 1210 may control the semiconductor device 1100 in response to the control command.

Figure 18:
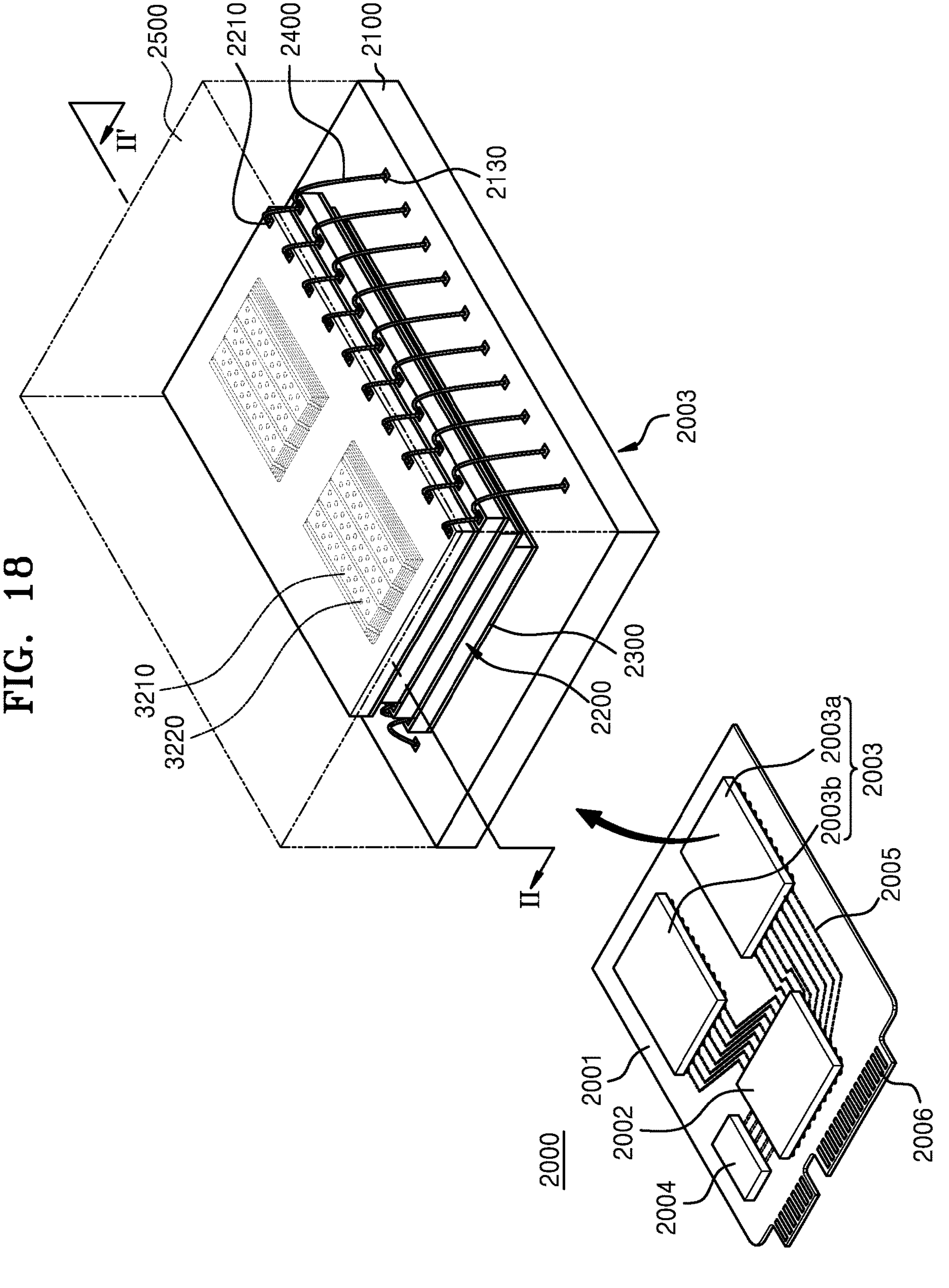
FIG. 18 is a schematic perspective view of an electronic system including a semiconductor device according to an embodiment of the inventive concept.

FIG. 18 is a schematic perspective view of an electronic system including a semiconductor device according to an embodiment of the inventive concept.

Referring to FIG. 18, an electronic system 2000 according to an embodiment of the inventive concept may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 by a plurality of wire patterns 2005 formed on the main board 2001.

The main board 2001 may include a connector 2006 including a plurality of pins coupled to an external host. The number and arrangement of the plurality of pins in the connector 2006 may vary according to a communication interface between the electronic system 2000 and the external host. In embodiments, the electronic system 2000 may communicate with an external host according to any one of the interfaces such as Universal Serial Bus (USB), Peripheral Component Interconnect Express (PCI-Express), Serial Advanced Technology Attachment (SATA), and M-Phy for Universal Flash Storage (UFS). In example embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the electronic system 2000.

The DRAM 2004 may be a buffer memory for reducing a speed difference between the semiconductor package 2003, that is, a data storage space, and an external host. The DRAM 2004 included in the electronic system 2000 may operate as a kind of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, a plurality of semiconductor chips 2200 on the package substrate 2100, an adhesive layer 2300 disposed on a lower surface of each of the plurality of semiconductor chips 2200, a connection structure 2400 electrically connecting the plurality of semiconductor chips 2200 and the package substrate 2100, and a molding layer 2500 at least partially covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 19. Each of the plurality of semiconductor chips 2200 may include a plurality of gate stacks 3210 and a plurality of channel structures 3220. Each of the plurality of semiconductor chips 2200 may include at least one of the structures described above with respect to the semiconductor devices 10A, 10B, 100, 100A, 200, 300, and 400 with reference to FIGS. 3A to 16C.

In some embodiments, the connection structure 2400 may be a bonding wire electrically connecting the input/output pad 2210 and the package upper pad 2130. Accordingly, in the first and second semiconductor packages 2003*a* and 2003*b*, the plurality of semiconductor chips 2200 may be electrically connected to each other by a bonding wire method, and may be electrically connected to the package upper pad 2130 of the package substrate 2100. In some embodiments, in relation to the first and second semiconductor packages 2003*a* and 2003*b*, the plurality of semiconductor chips 2200 may be electrically connected to each other by a connection structure including a through silicon via (TSV) instead of the bonding wire type connection structure 2400.

In example embodiments, the controller 2002 and the plurality of semiconductor chips 2200 may be included in one package. In embodiments, the controller 2002 and the plurality of semiconductor chips 2200 may be mounted on a separate interposer substrate different from the main board 2001, and the controller 2002 and the plurality of semiconductor chips 2200 may be connected to each other by wires formed on the interposer substrate.

Figure 19:
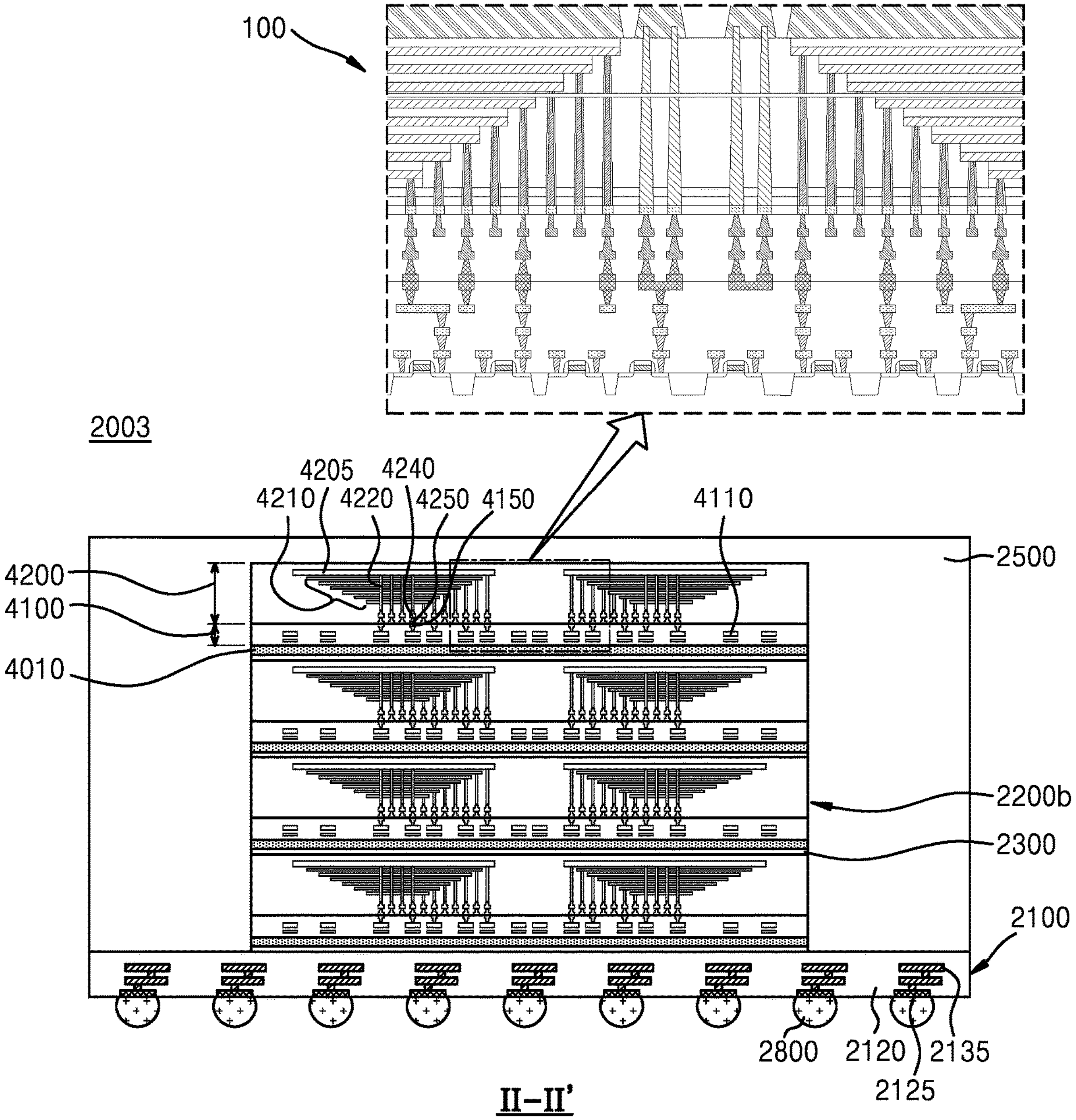
FIG. 19 is a schematic cross-sectional view of semiconductor packages according to an embodiment of the inventive concept.

FIG. 19 is a cross-sectional view schematically illustrating semiconductor packages according to an embodiment of the inventive concept. In FIG. 19, the configuration along line II-II' of FIG. 18 is shown in more detail.

Referring to FIG. 19, in a semiconductor package 2003, each of the semiconductor chips 2200*b* may include a semiconductor substrate 4010, a first structure 4100 on the semiconductor substrate 4010, and a second structure 4200 bonded to the first structure 4100 by a wafer bonding method on the first structure 4100.

The first structure 4100 may include a peripheral circuit area including a peripheral wire 4110 and first junction structures 4150. The second structure 4200 may include a common source line 4205, a gate stack structure 4210 between the common source line 4205 and the first structure 4100, memory channel structures 4220 passing through the gate stack structure 4210, and second junction structures 4250 electrically connected to the memory channel structures 4220 and the word lines WL in FIG. 17 of the gate stack structure 4210. For example, the second junction structures 4250 may be electrically connected to the memory channel structures 4220 and word lines WL (see FIG. 17), respectively, through the gate connection wires electrically connected to the bit lines 4240 and word lines WL (see FIG. 17) electrically connected to the memory channel structures 4220. The first junction structures 4150 of the first structure 4100 and the second junction structures 4250 of the second structure 4200 may be bonded while contacting each other. Junction portions of the first junction structures 4150 and the second junction structures 4250 may be formed of, for example, copper (Cu).

Each of the semiconductor chips 2200*b* may further include input/output pads 2210 (see FIG. 18) electrically connected to the peripheral wires 4110 of the first structure 4100.

The semiconductor chips 2200 of FIG. 18 and the semiconductor chips 2200*b* of FIG. 19 may be electrically connected to each other by connection structures 2400 in the form of bonding wires. However, in some embodiments, semiconductor chips in one semiconductor package, such as the semiconductor chips 2200 of FIG. 18 and the semiconductor chips 2200*b* of FIG. 19 may be electrically connected to each other by a connection structure including a TSV.

Next, a method of manufacturing a semiconductor device according to embodiments of the inventive concept will be described in detail.

FIGS. 20A to 20K are cross-sectional views illustrating a method of manufacturing a semiconductor device according to embodiments according to the inventive concept. An example manufacturing method of the semiconductor device 100 described with reference to FIGS. 4 to 10 will be described with reference to FIGS. 20A to 20K.

Figure 20A:
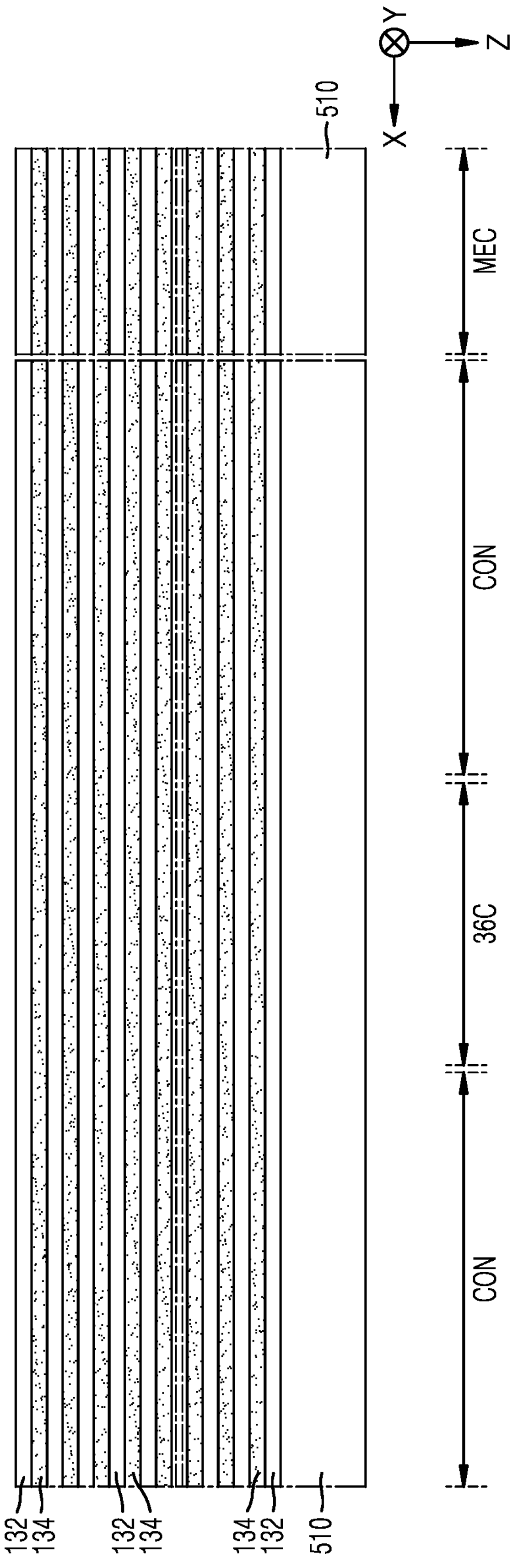
FIGS. 20A to 20K are cross-sectional views illustrating a method of manufacturing a semiconductor device according to example embodiments of the inventive concept.

Referring to FIG. 20A, a plurality of insulating films 132 and a plurality of sacrificial insulating films 134 may be alternately stacked one by one on a sacrificial substrate 510.

The sacrificial substrate 510 may be made of silicon. The plurality of insulating films 132 may be made of silicon oxide film, and the plurality of sacrificial insulating films 134 may be made of silicon nitride film. Each of the plurality of sacrificial insulating films 134 may serve to secure a space for forming a gate stack GS (see FIG. 10) in a subsequent process.

Figure 20B:
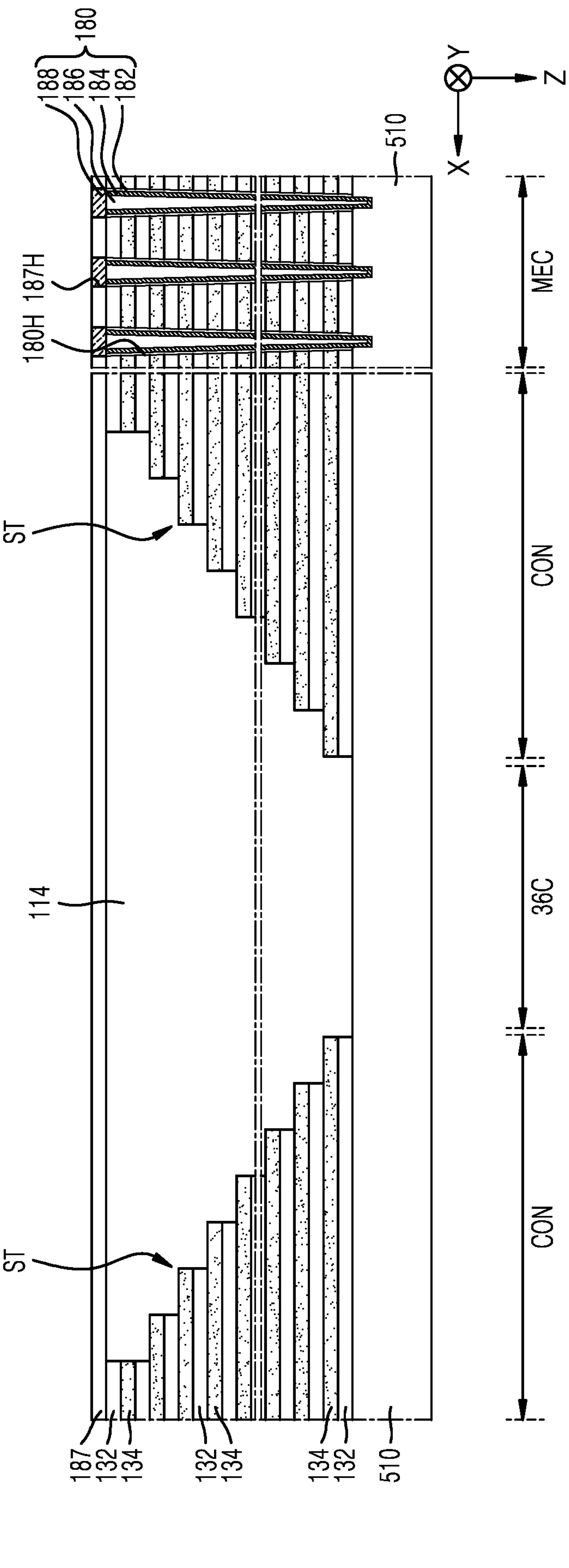

Referring to FIG. 20B, in order that a plurality of insulating films 132 and a plurality of sacrificial insulating films 134 form a stepped connection part ST in a pair of adjacent connection areas CON, after removing portions of each of the plurality of insulating films 132 and the plurality of sacrificial insulating films 134, a stepped connection part ST of a pair of neighboring connection areas CON and a connection part insulating film 114 at least partially covering a peripheral circuit connection area 36C between the pair of memory cell blocks BLK may be formed.

A plurality of channel holes 180H may be formed in a memory cell area MEC, penetrating or extending into the plurality of insulating films 132 and the plurality of sacrificial insulating films 134 and extending in a vertical direction (Z direction), and a plurality of channel hole filling structures may be formed by forming a gate dielectric film 182, a channel region 184, and a buried insulating film 186 inside each of the plurality of channel holes 180H.

An intermediate insulating film 187 at least partially covering the plurality of channel hole filling structures, the stepped connection part ST, and the peripheral circuit connection area 36C may be formed in the memory cell area MEC, the connection area CON, and the peripheral circuit connection area 36C, and a plurality of contact holes 187H may be formed in an intermediate insulating film 187 to expose upper surfaces of the plurality of channel hole filling structures, and the channel structure 180 may be formed by forming a plurality of drain regions 188 in the plurality of contact holes 187H.

Figure 20C:
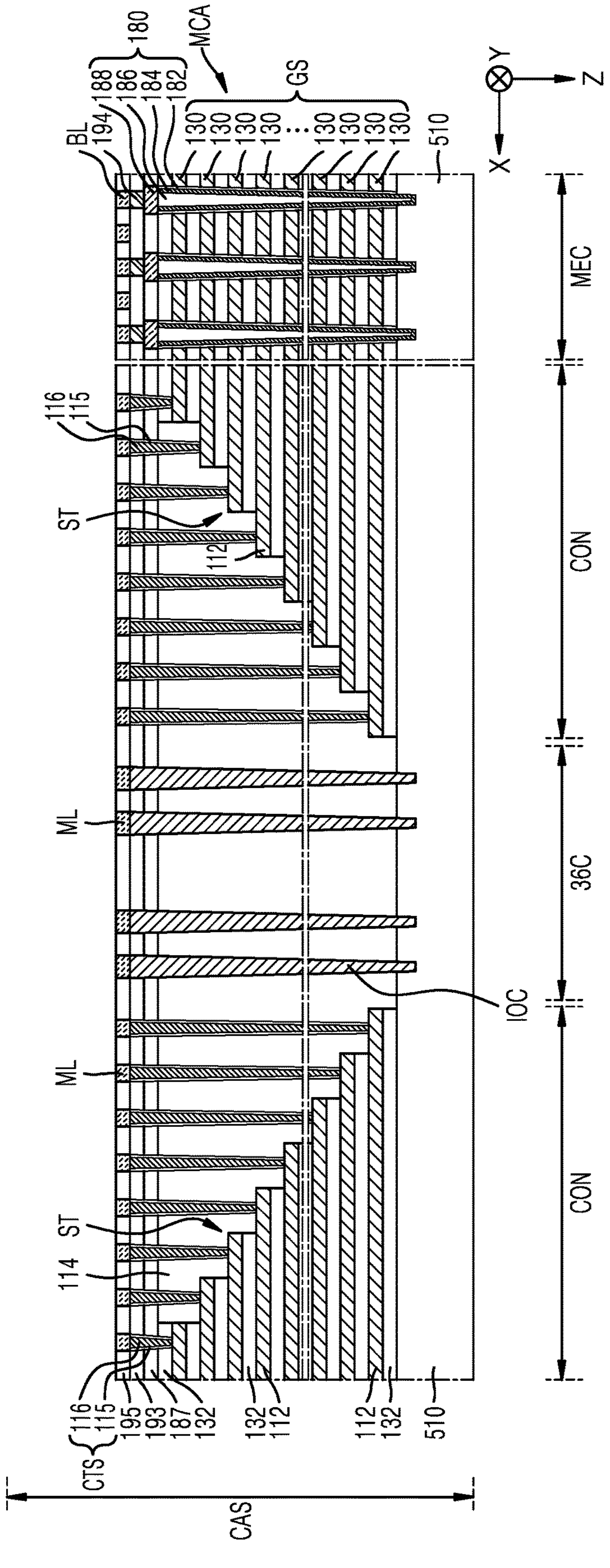

Referring to FIG. 20C, in the result of FIG. 20B, a plurality of word line cut areas WLC (see FIG. 9) penetrating or extending into the plurality of insulating films 132 and the plurality of sacrificial insulating films 134 may be formed, and a plurality of sacrificial insulating films 134 may be replaced with a plurality of gate lines 130 and a plurality of conductive pad areas 112 through a plurality of word line cut areas WLC.

In some embodiments, to replace the plurality of sacrificial insulating films 134 (see FIG. 20B) with the plurality of gate lines 130, after preparing an empty space between each of the plurality of insulating films 132 by selectively removing a plurality of sacrificial insulating films 134 (see FIG. 20B) exposed through a plurality of word line cut areas WLC (see FIG. 9), a plurality of gate lines 130 and a plurality of conductive pad areas 112 may be formed by at least partially filling the empty space with a conductive material. After that, as illustrated in FIG. 9, the inside of each of the plurality of word line cut areas WLC may be at least partially filled with the word line cut structure 192.

After forming the first upper insulating film 193 on the plurality of channel structures 180 and the intermediate insulating film 187, a plurality of bit line contact pads 194 connected to the plurality of channel structures 180 may be formed through the first upper insulating film 193 in the memory cell area MEC. The connection part insulating film 114, the intermediate insulating film 187, and the first upper insulating film 193 may constitute an insulating structure.

Some areas of the insulating structure are anisotropically etched using a mask pattern (not shown) as an etch mask, so that a plurality of contact holes may be formed in the connection area CON and the peripheral circuit connection area 36C, a contact structure CTS consisting of an insulating plug 115 and a contact plug 116 may be formed inside each of a plurality of contact holes in a connection area CON among the plurality of contact holes, and a contact plug IOC may be formed inside each of the plurality of contact holes in the peripheral circuit connection area 36C among the plurality of contact holes.

After forming the second upper insulating film 195 in the memory cell area MEC, the connection area CON, and the peripheral circuit connection area 36C, a plurality of bit lines BL connected to a plurality of bit line contact pads 194 may be formed by passing or extending through partial regions of the second upper insulating film 195 in the memory cell area MEC, and a plurality of wiring layers ML connected to the plurality of contact structures CTS and the plurality of contact plugs IOC may be formed through partial regions of the second upper insulating film 195 in the connection area CON and the peripheral circuit connection area 36C.

Figure 20D:
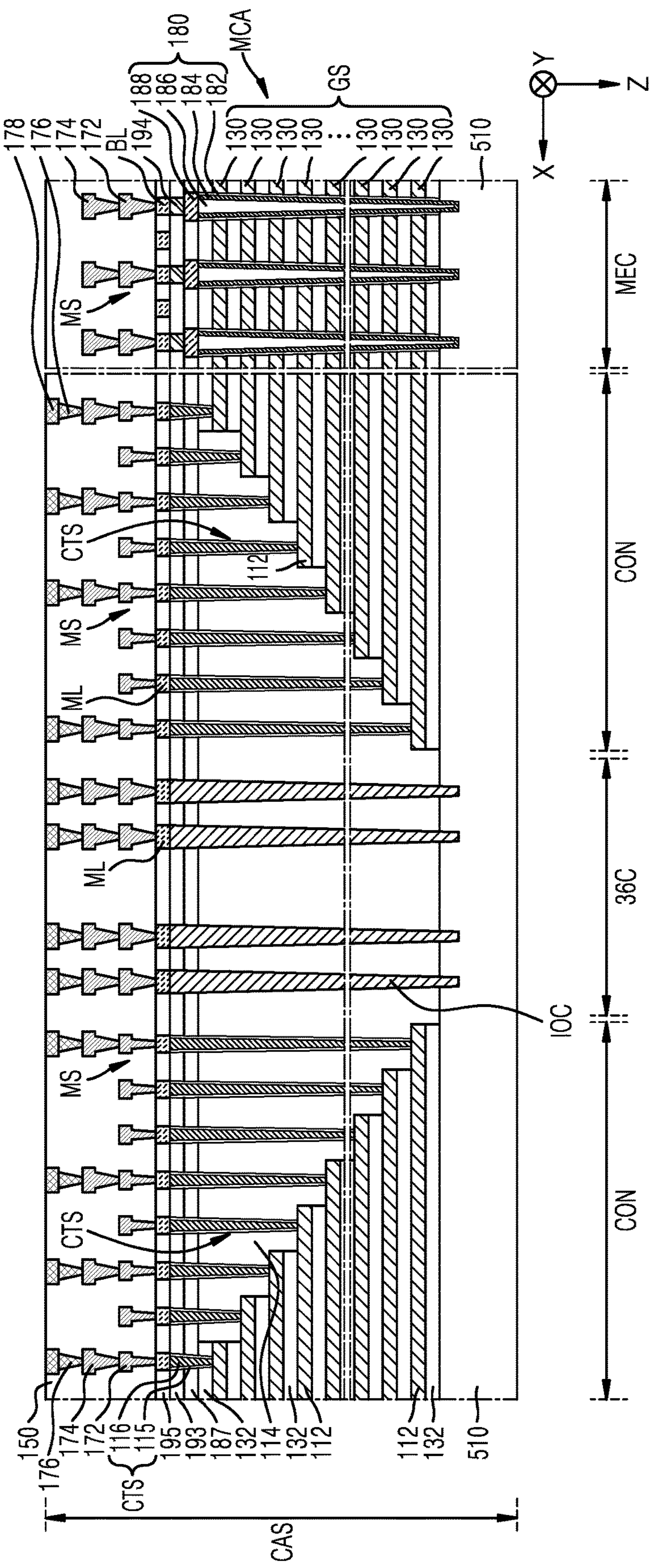

Referring to FIG. 20D, a wiring structure MS including a plurality of first upper wiring layers 172, a plurality of second upper wiring layers 174, and a plurality of third upper wiring layers 176, a plurality of first bonding metal pads 178, and an interlayer insulating film 150 at least partially filling spaces therebetween may be formed on the result of FIG. 20C.

Figure 20E:
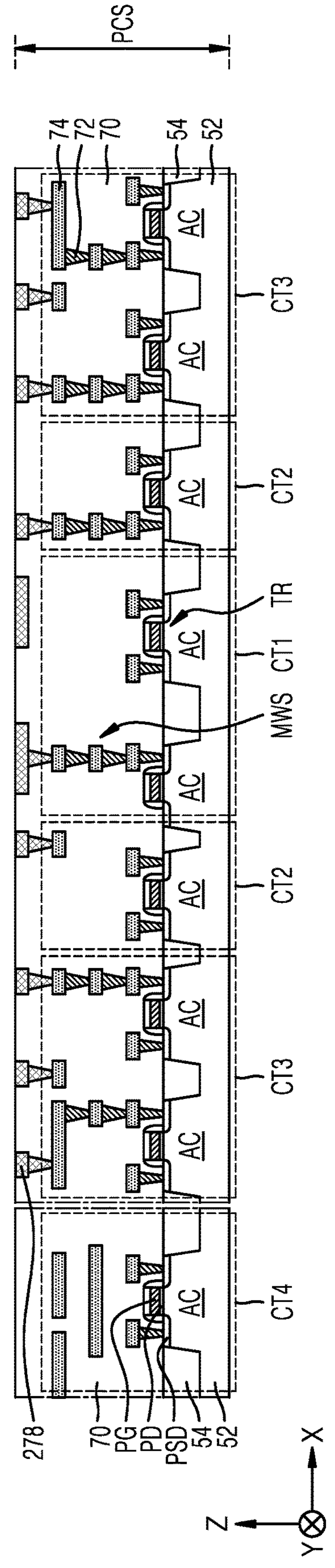

Referring to FIG. 20E, a peripheral circuit structure PCS may be formed. The peripheral circuit structure PCS may include a plurality of circuit areas, for example, first to fourth circuit areas CT1, CT2, CT3, and CT4, and a plurality of second bonding metal pads 278.

Figure 20F:
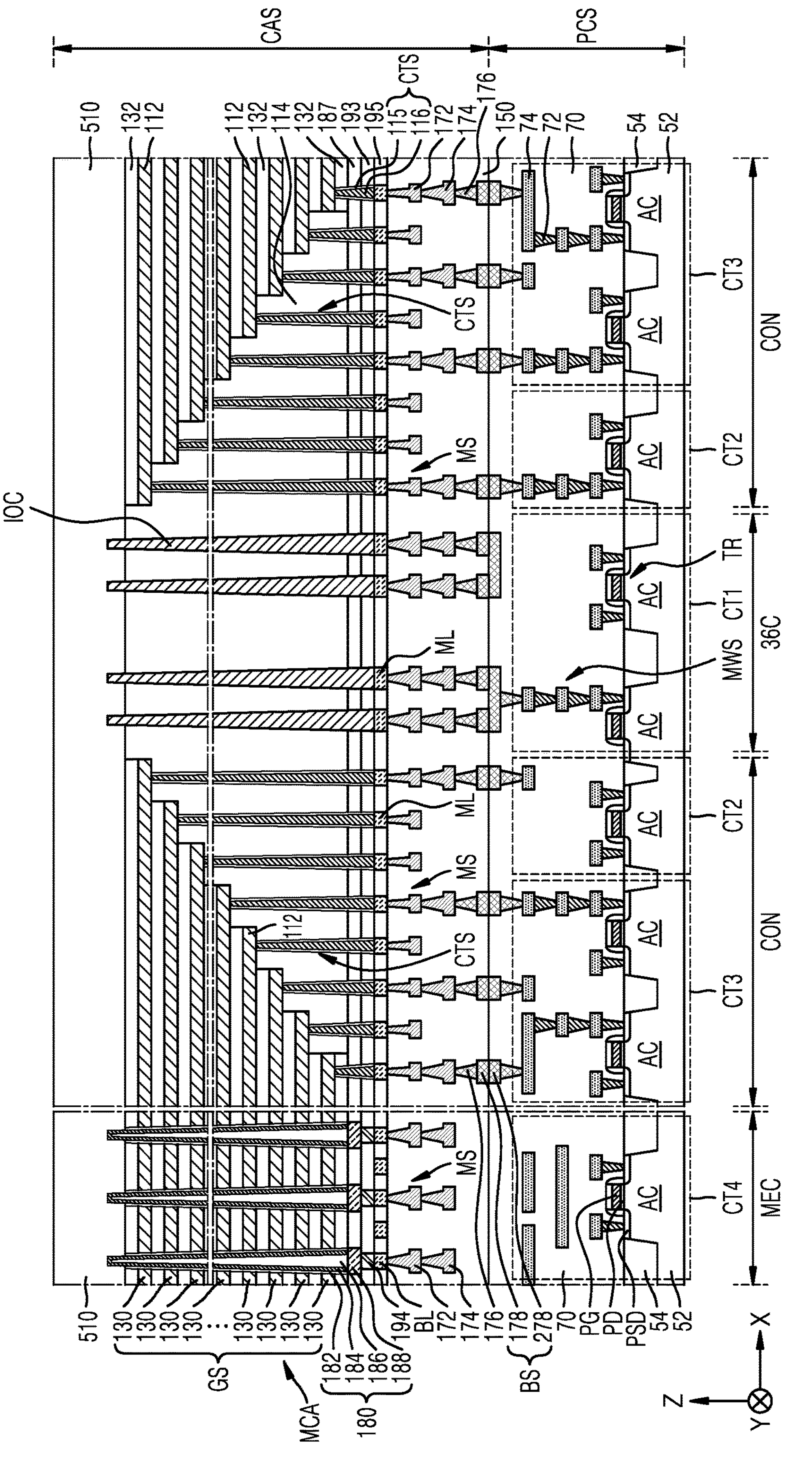

Referring to FIG. 20F, the plurality of first bonding metal pads 178 included in the result of FIG. 20D and the plurality of second bonding metal pads 278 included in the peripheral circuit structure PCS are mutually bonded, so that a result of FIG. 20D may be bonded to the peripheral circuit structure PCS by forming a plurality of bonding structures BS.

In example embodiments, the plurality of first bonding metal pads 178 and the plurality of second bonding metal pads 278 may be directly bonded by mutual pressure without a separate adhesive layer. For example, in a state where the plurality of first bonding metal pads 178 and the plurality of second bonding metal pads 278 face each other, the plurality of first bonding metal pads 178 and the plurality of second bonding metal pads 278 are pressed in a direction in which the plurality of first bonding metal pads 178 and the plurality of second bonding metal pads 278 come closer to each other so that a bond is formed at the atomic level and a bonding structure BS (see FIG. 10) may be formed. In example embodiments, before bonding the plurality of first bonding metal pads 178 and the plurality of second bonding metal pads 278, to strengthen the bonding strength of each of these connections, a surface treatment process of the surface where the plurality of first bonding metal pads 178 are exposed and the surface where the plurality of second bonding metal pads 278 are exposed may be further performed with hydrogen plasma.

Figure 20G:
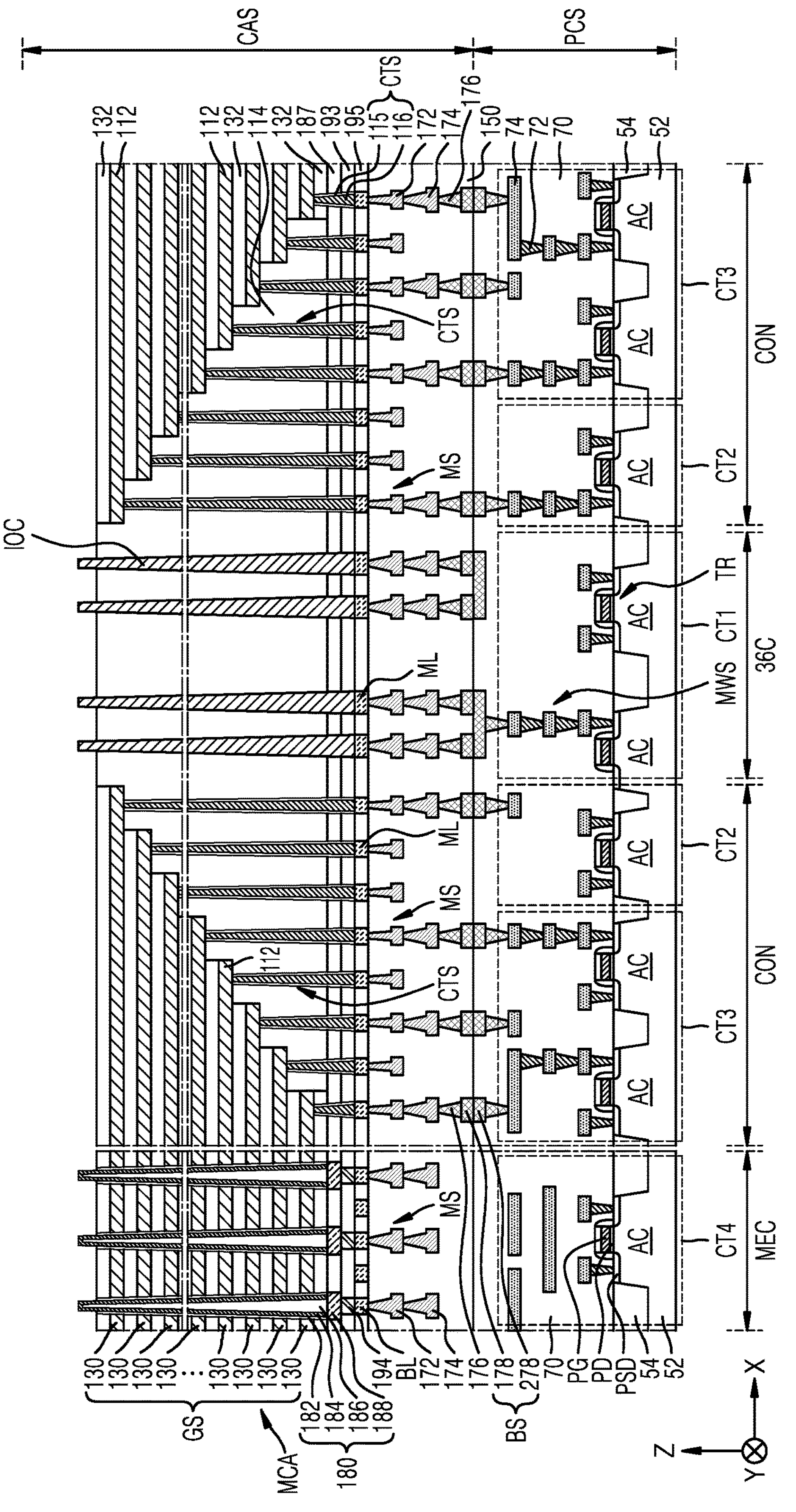

Referring to FIG. 20G, the insulating film 132 and the connection part insulating film 114 may be exposed by removing the sacrificial substrate 510 from the result of FIG. 20F. As a result, portions of each of the plurality of channel structures 180 and portions of each of the plurality of contact plugs IOC may protrude above the insulating film 132. A portion of the channel region 184 may be exposed by removing the exposed gate dielectric film 182 from portions of the plurality of channel structures 180 protruding above the insulating film 132.

Figure 20H:
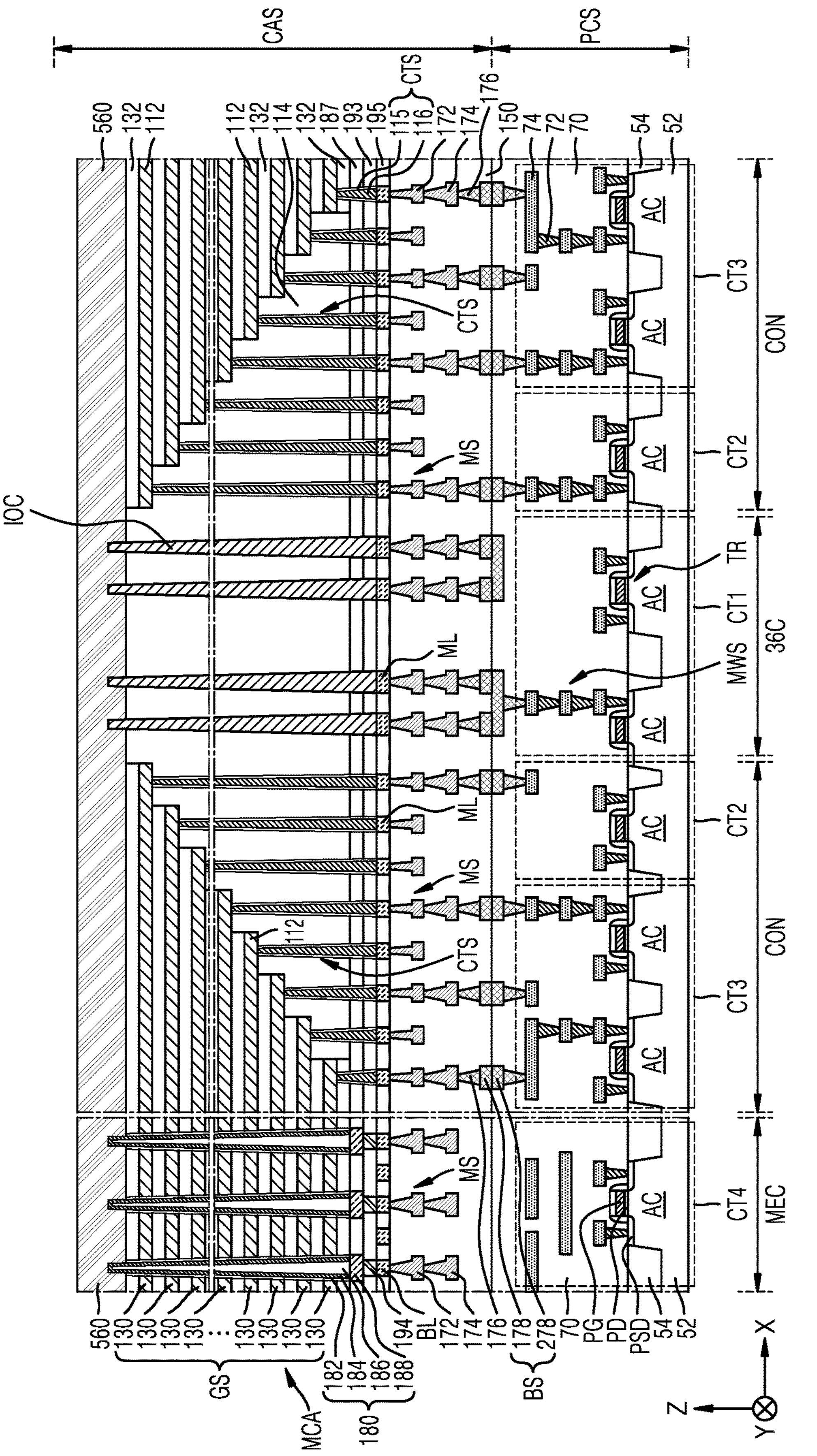

Referring to FIG. 20H, a conductive layer 560 may be formed on the resulting structure of FIG. 20G. The conductive layer 560 may include a metal, a conductive metal nitride, a semiconductor material, or a combination thereof. For example, the conductive layer 560 may be made of tungsten, titanium, tantalum, copper, aluminum, titanium nitride, tantalum nitride, tungsten nitride, or a combination thereof, but embodiments are not limited thereto.

Figure 20I:
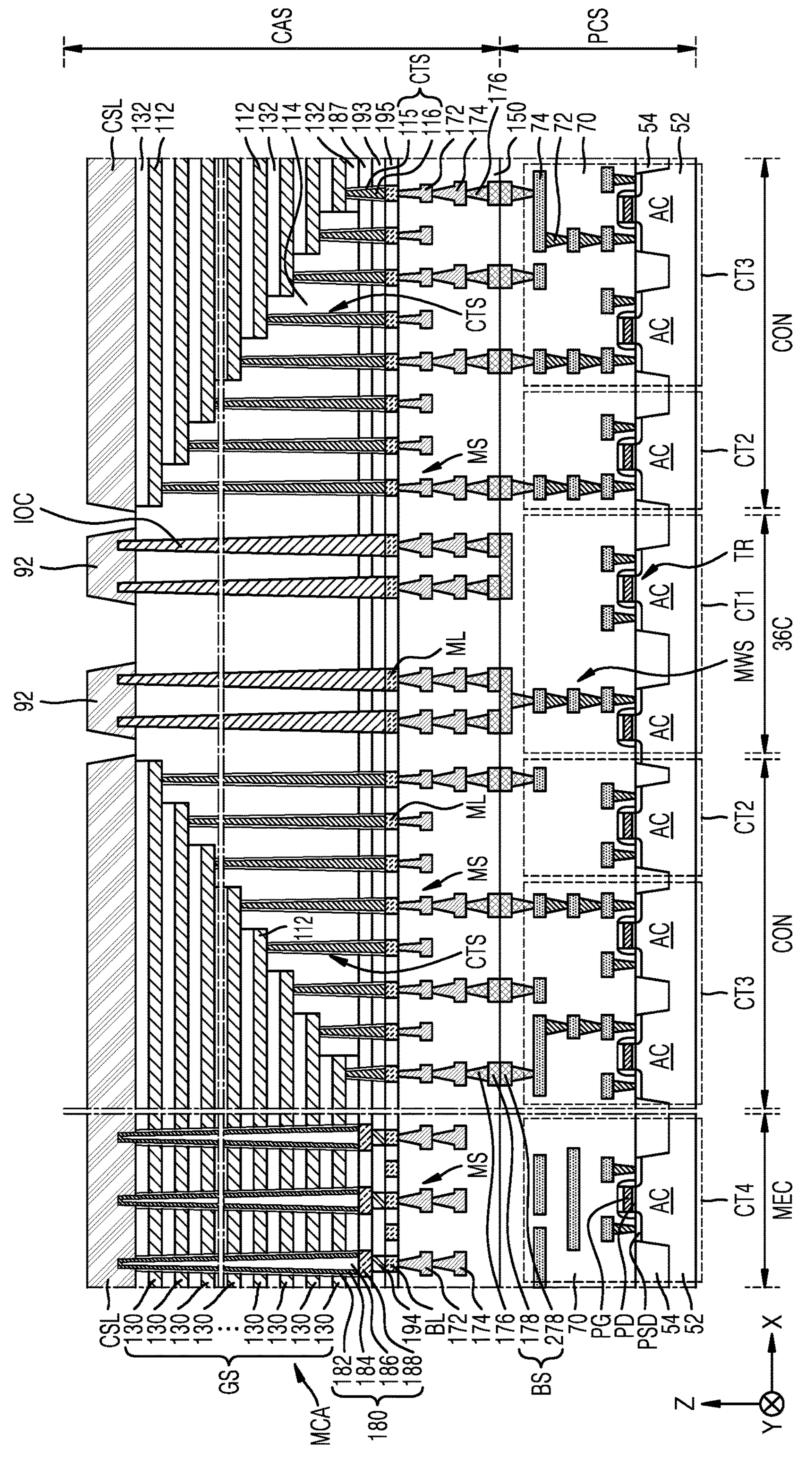

Referring to FIG. 20I, partial regions of the conductive layer 560 may be removed from the result of FIG. 20H by etching to form a plurality of common source lines CSL and a plurality of connection pads 92.

Figure 20J:
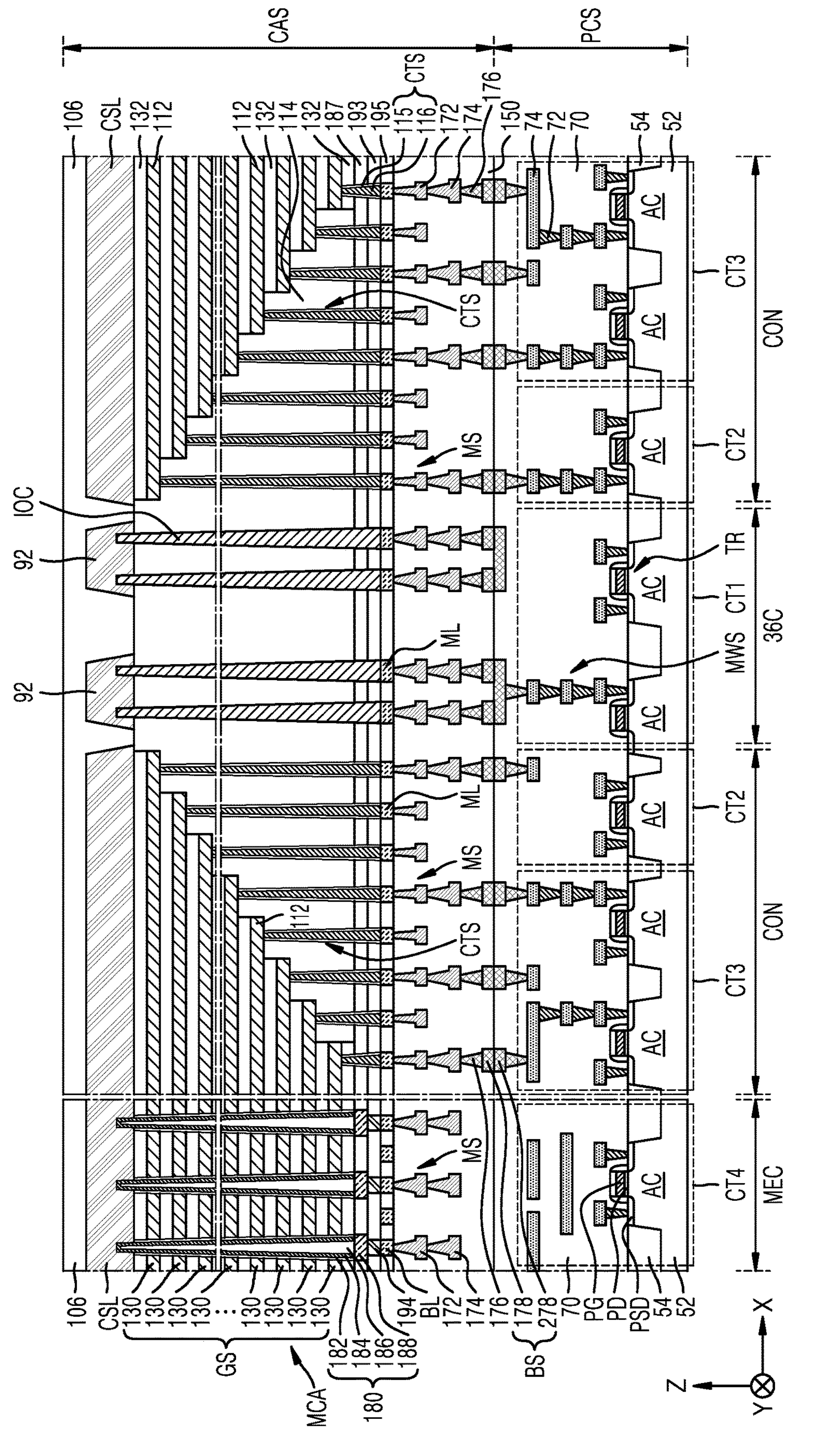

Referring to FIG. 20J, an insulating film 106 may be formed to at least partially cover the plurality of common source lines CSL and the plurality of connection pads 92.

Figure 20K:
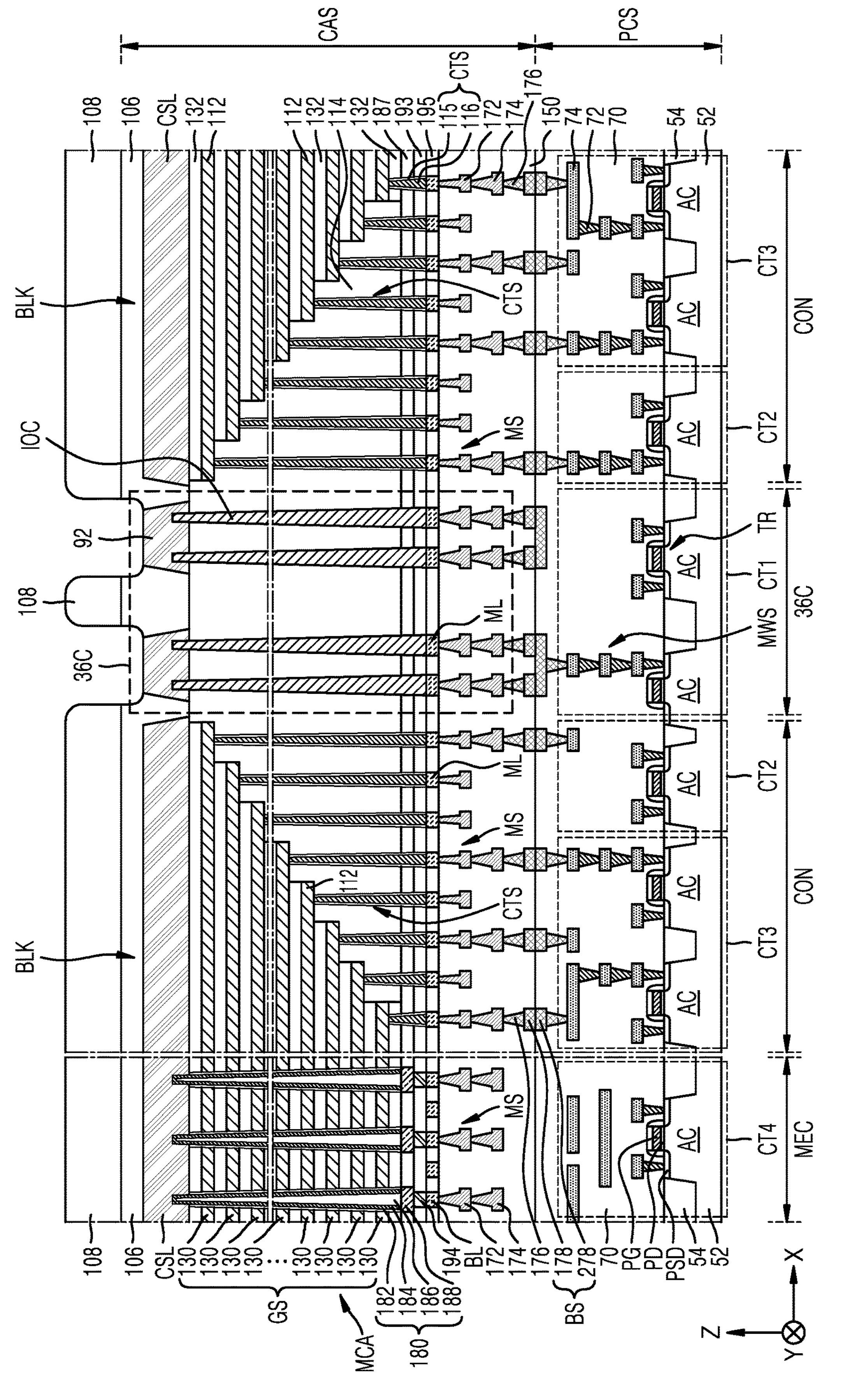

Referring to FIG. 20K, a protective film 108 may be formed on the insulating film 106, and a plurality of connection pads 92 may be exposed by removing partial regions of each of the protective film 108 and the insulating film 106.

FIGS. 21A to 30 are cross-sectional views illustrating a method of manufacturing a semiconductor device according to other embodiments of the inventive concept. In particular, FIGS. 21A, 22A, 23A, 24A, 25, 26, 27A, 28, 29, and 30 are cross-sectional views according to the process sequence of the connection area CON and the peripheral circuit connection area 436C of the cell array structure CAS and each partial region of the peripheral circuit structure PCS overlapping them in the vertical direction (Z direction) and FIGS. 21B, 22B, 23B, 24B, and 27B are cross-sectional views of a portion of a memory cell area MEC and a portion of a peripheral circuit structure PCS according to a process sequence. An example manufacturing method of the semiconductor device 400 illustrated in FIGS. 16A and 16B will be described with reference to FIGS. 21A to 30.

Figure 21A:
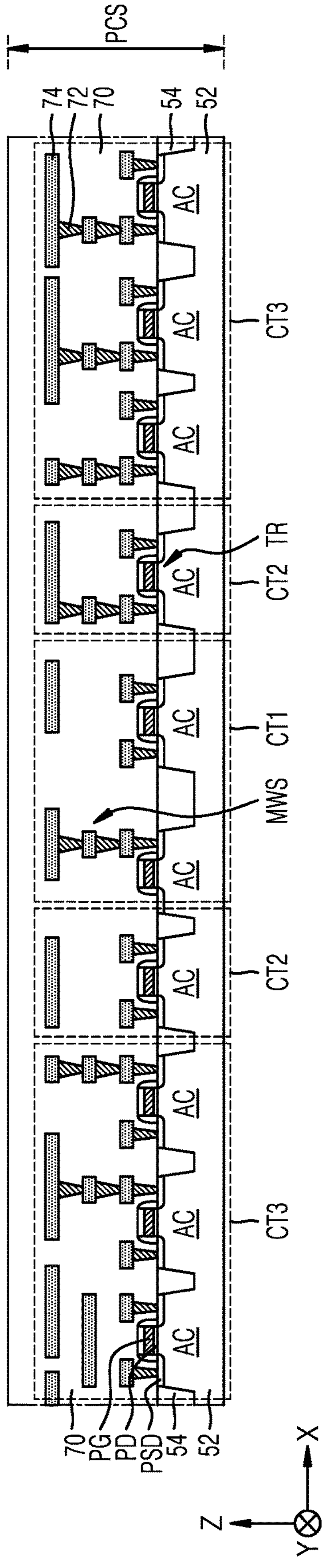
Figure 21B:
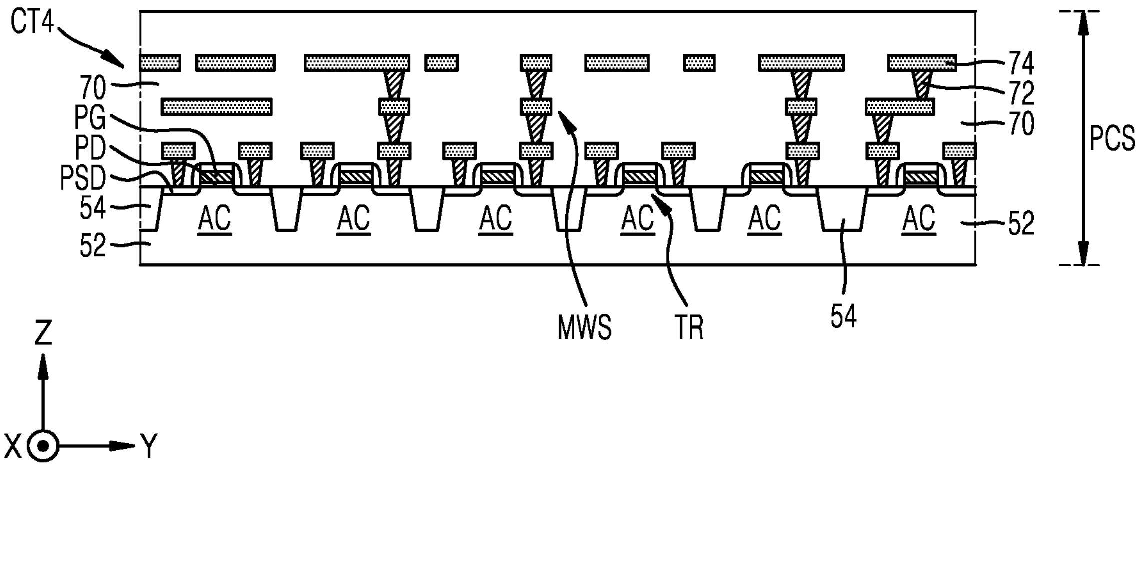
FIGS. 21B, 22B, 23B, 24B, and 27B are cross-sectional views of a portion of a memory cell area and a portion of a peripheral circuit structure according to a process sequence.

Referring to FIGS. 21A and 21B, a peripheral circuit structure PCS including a substrate 52, a plurality of transistors TR, a multilayer wiring structure MWS, and an interlayer insulating film 70 may be formed.

Figure 22A:
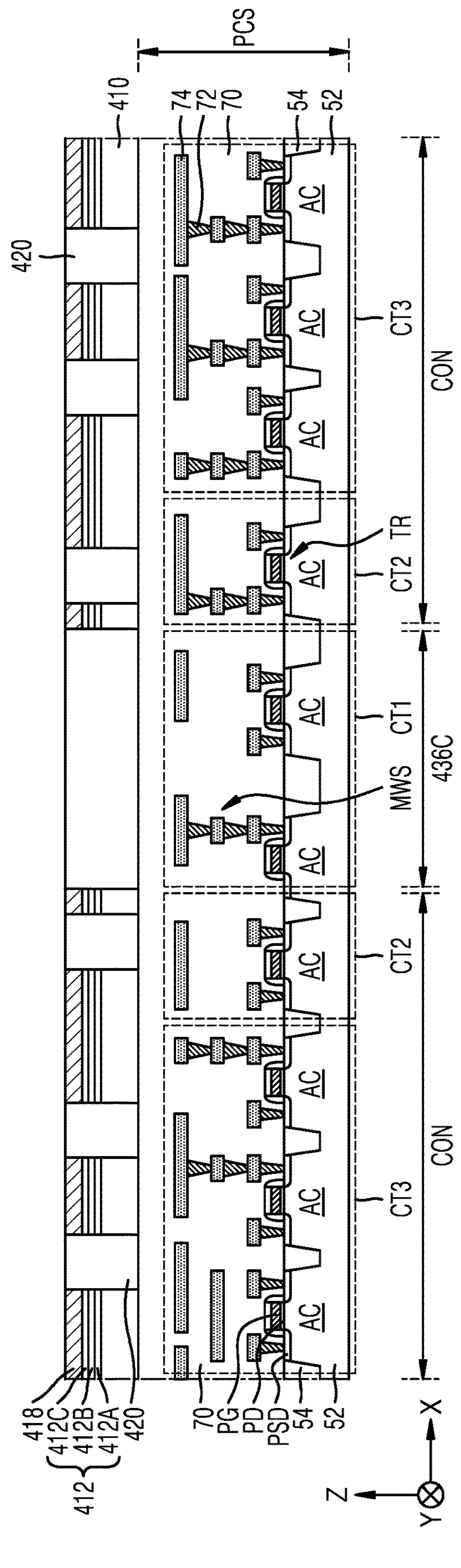
Figure 22B:
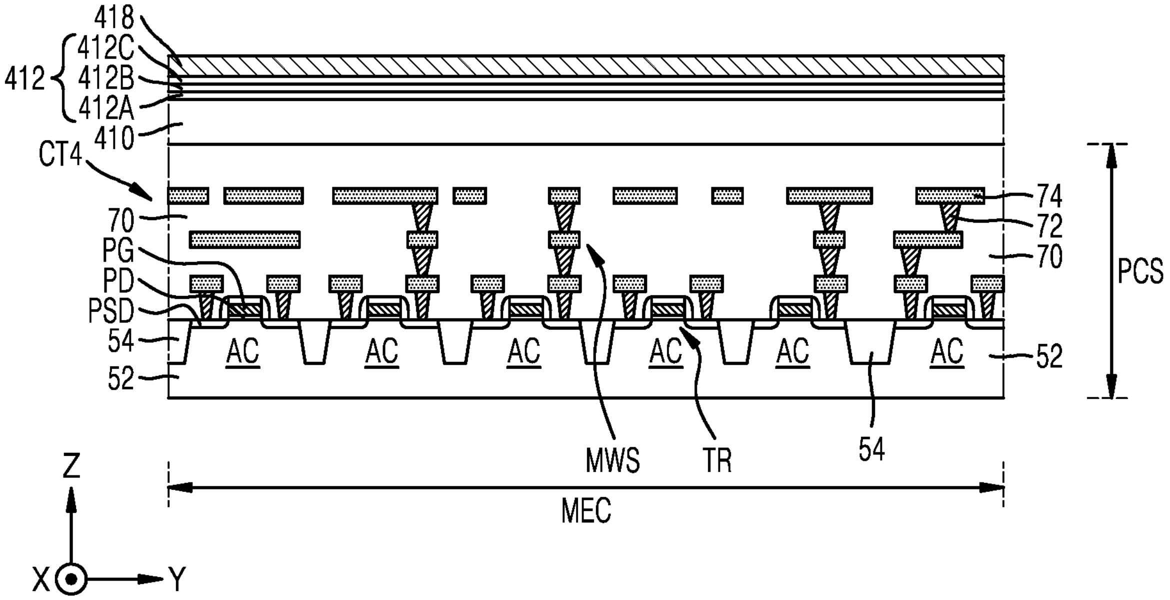

Referring to FIGS. 22A and 22B, a cell substrate 410 may be formed on the peripheral circuit structure PCS, and an insulating plate 412 and a second conductive plate 418 at least partially covering the cell substrate 410 may be sequentially formed. The insulating plate 412 may be formed of an insulating film having a multilayer structure including the first insulating film 412A, the second insulating film 412B, and the third insulating film 412C.

Then, as illustrated in FIG. 22A, a plurality of openings may be formed penetrating or extending into the cell substrate 410, the insulating plate 412, and the second conductive plate 418, and a plurality of insulating plugs 420 at least partially filling the plurality of openings may be formed in the connection area CON and the peripheral circuit connection area 436C.

Figure 23A:
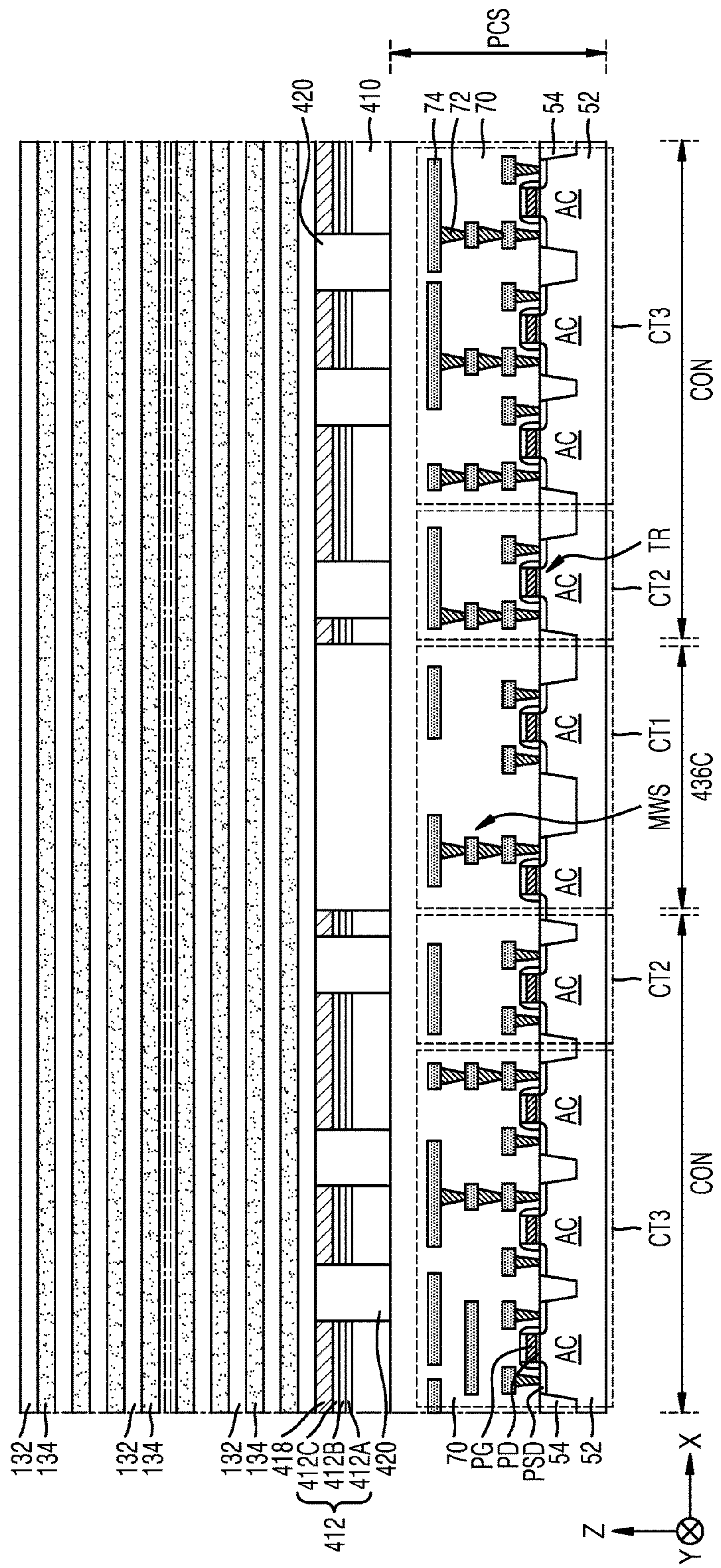
Figure 23B:
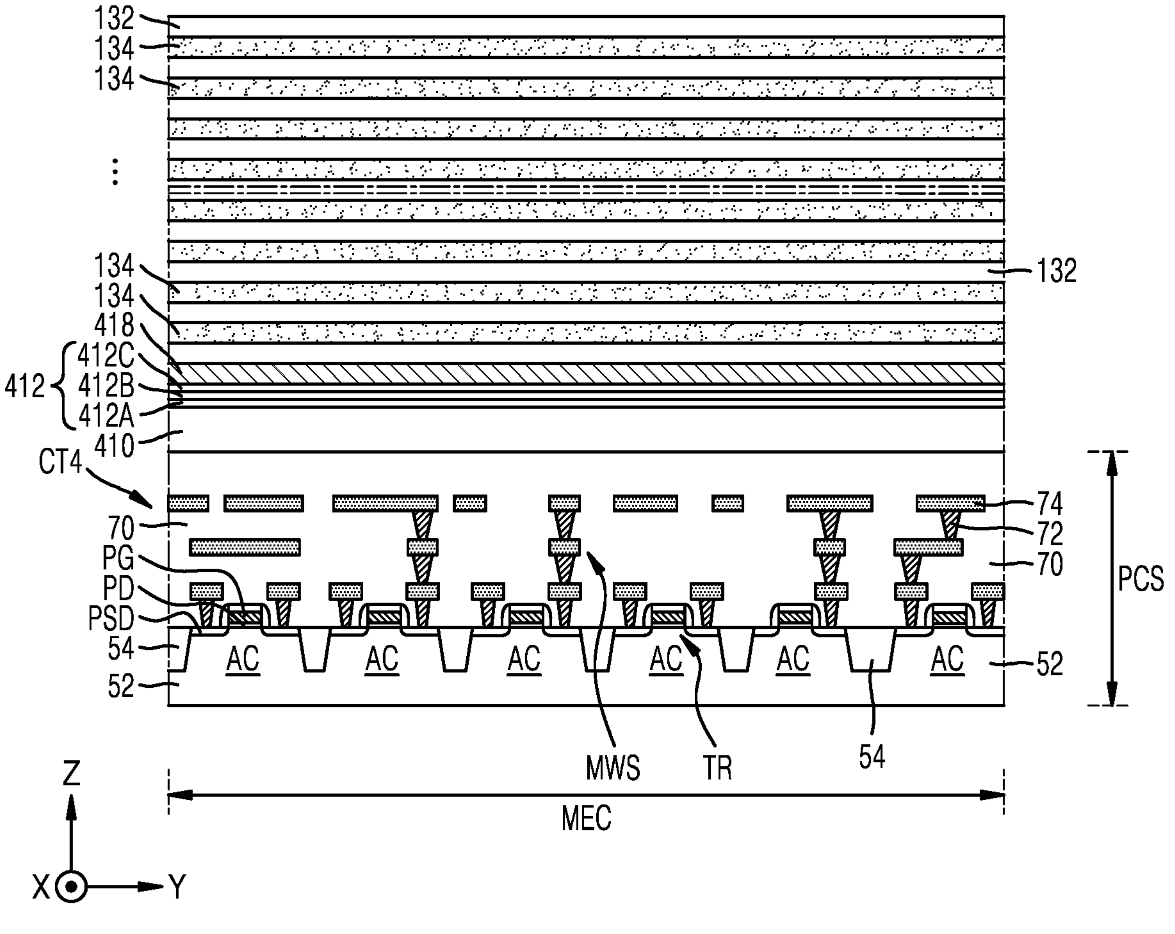

Referring to FIGS. 23A and 23B, in the memory cell area MEC, the connection area CON, and the peripheral circuit connection area 436C, a plurality of insulating films 132 and a plurality of sacrificial insulating films 134 may be alternately stacked one by one on the second conductive plate 418 and the insulating plug 420.

Figure 24A:
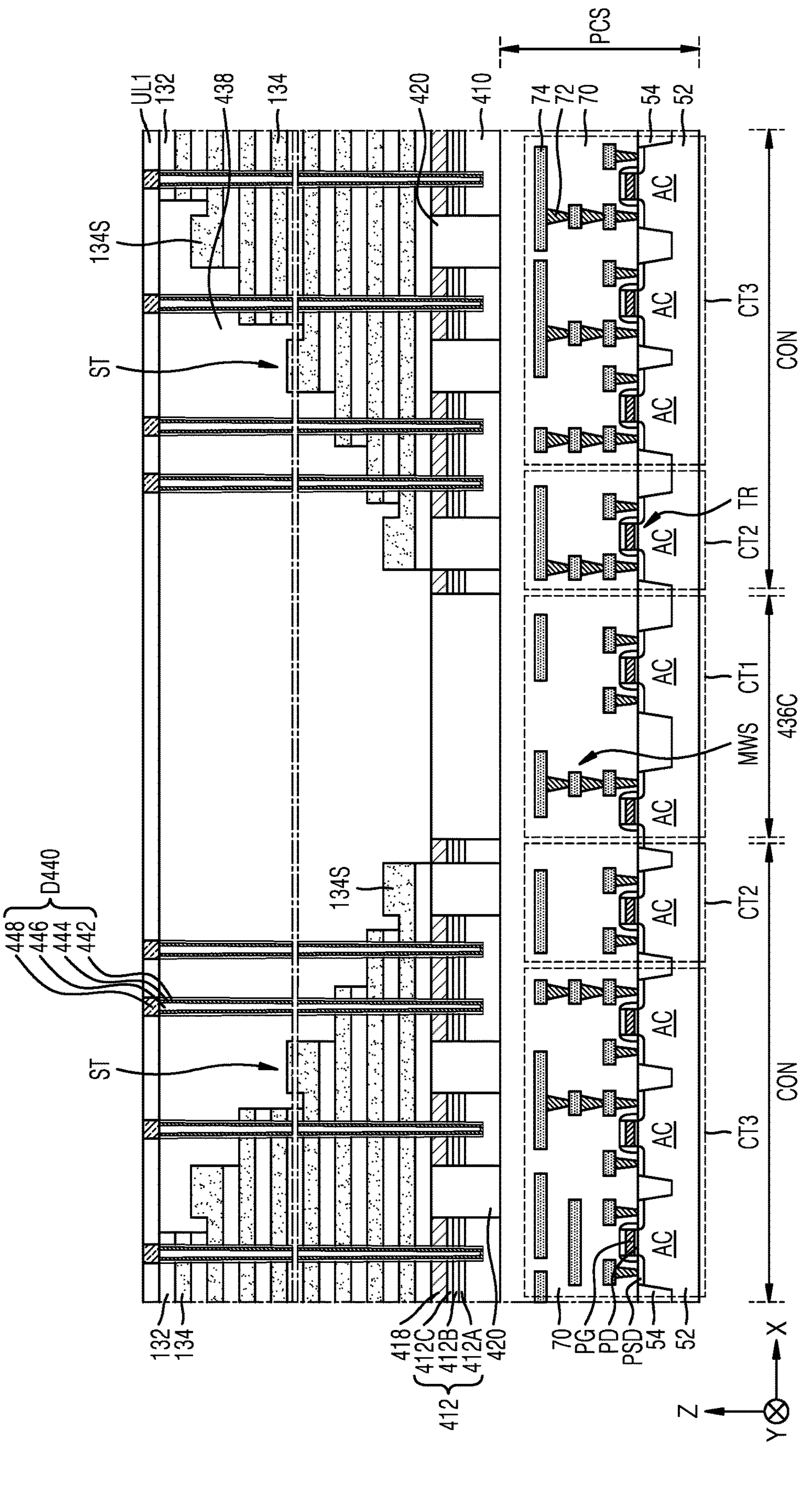
Figure 24B:
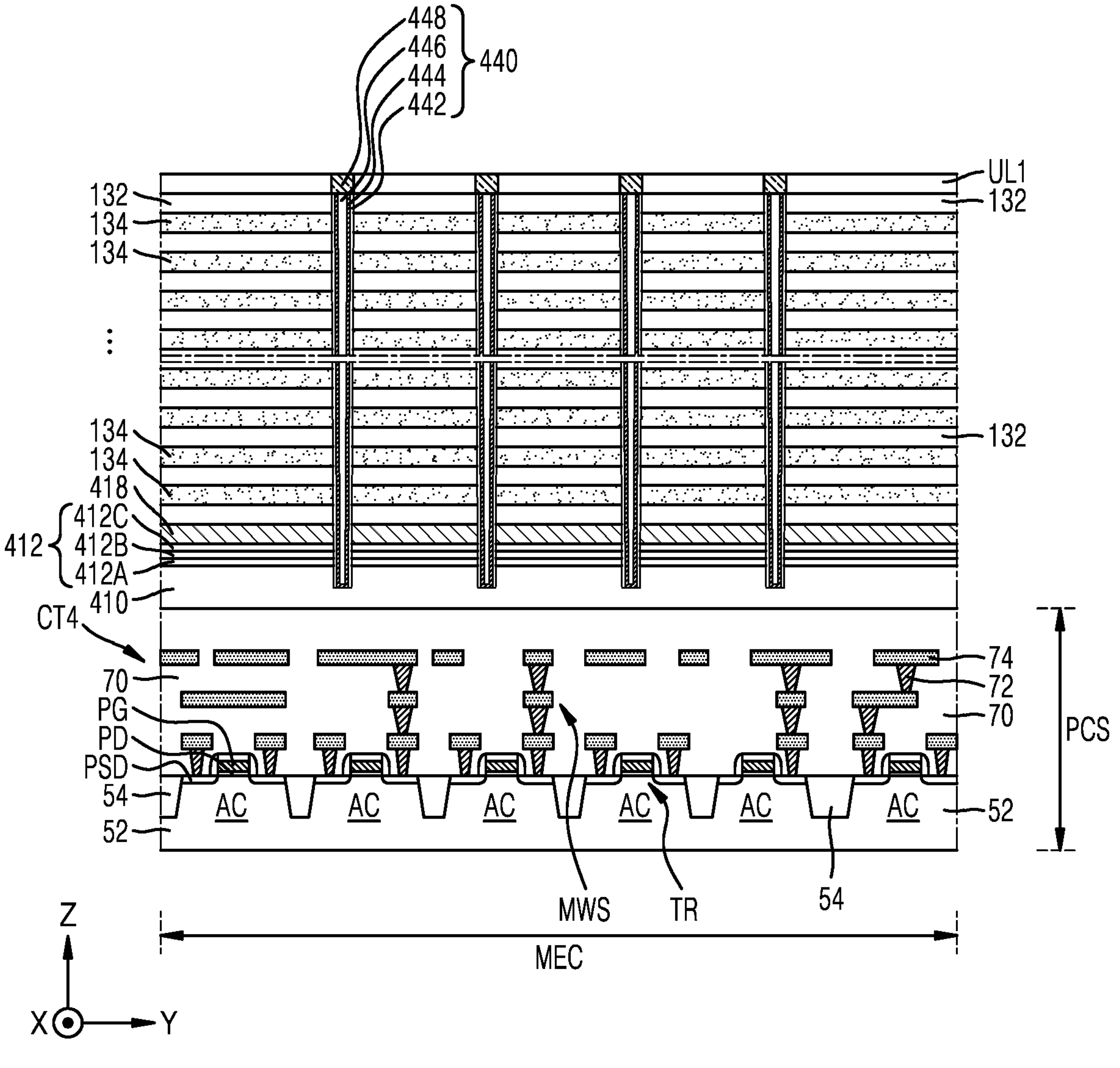

Referring to FIGS. 24A and 24B, in the resulting structures of FIGS. 23A and 23B, portions of each of the plurality of insulating films 132 and the plurality of sacrificial insulating films 134 are removed, and as an end portion of each of the plurality of insulating films 132 and the plurality of sacrificial insulating films 134 moves away from the cell substrate 410, a stepped connection part ST having a gradually smaller width in the horizontal direction may be formed.

Thereafter, a sacrificial pad part 134S having an increased thickness may be formed at one end portion of each of the plurality of sacrificial insulating films 134 constituting the stepped connection part ST. FIG. 24A shows only the sacrificial pad part 134S formed on one end portion of a portion of the sacrificial insulating films 134 among the plurality of sacrificial insulating films 134, but the sacrificial insulating film 134 that is not connected to the sacrificial pad part 134S in FIG. 24A may be connected to the sacrificial pad part 134S at another portion not visible in FIG. 24A.

In embodiments, to form a sacrificial pad part 134S on one end portion of each of the plurality of sacrificial insulating films 134, after removing a portion of the plurality of insulating films 132 to expose an end portion of each of the plurality of sacrificial insulating films 134 constituting the stepped connection part ST, an additional film made of the same material as a constituent material of the plurality of sacrificial insulating films 134 may be deposited on an exposed end portion of each of the plurality of sacrificial insulating films 134, and the additional layer may be patterned so that the sacrificial pad part 134S remains.

After that, an interlayer insulating film 438 at least partially covering the stepped connection part ST, the second conductive plate 418, and the insulating plug 420 may be formed, and the resulting product may be planarized by a chemical mechanical polishing (CMP) process to expose the uppermost insulating film 132.

Then, a first upper insulating film UL1 at least partially covering the upper surface of each of the uppermost insulating film 132 and the interlayer insulating film 438, a plurality of channel structures 440 extending in a vertical direction (Z direction) while penetrating or extending into the first upper insulating film UL1, the plurality of insulating films 132, and the plurality of sacrificial insulating films 134 in the memory cell area MEC, and a plurality of dummy channel structures D440 extending in a vertical direction (Z direction) while penetrating or extending into the first upper insulating film UL1, the plurality of insulating films 132, the plurality of sacrificial insulating films 134, and the interlayer insulating film 438 in the connection area CON may be formed.

Figure 25:
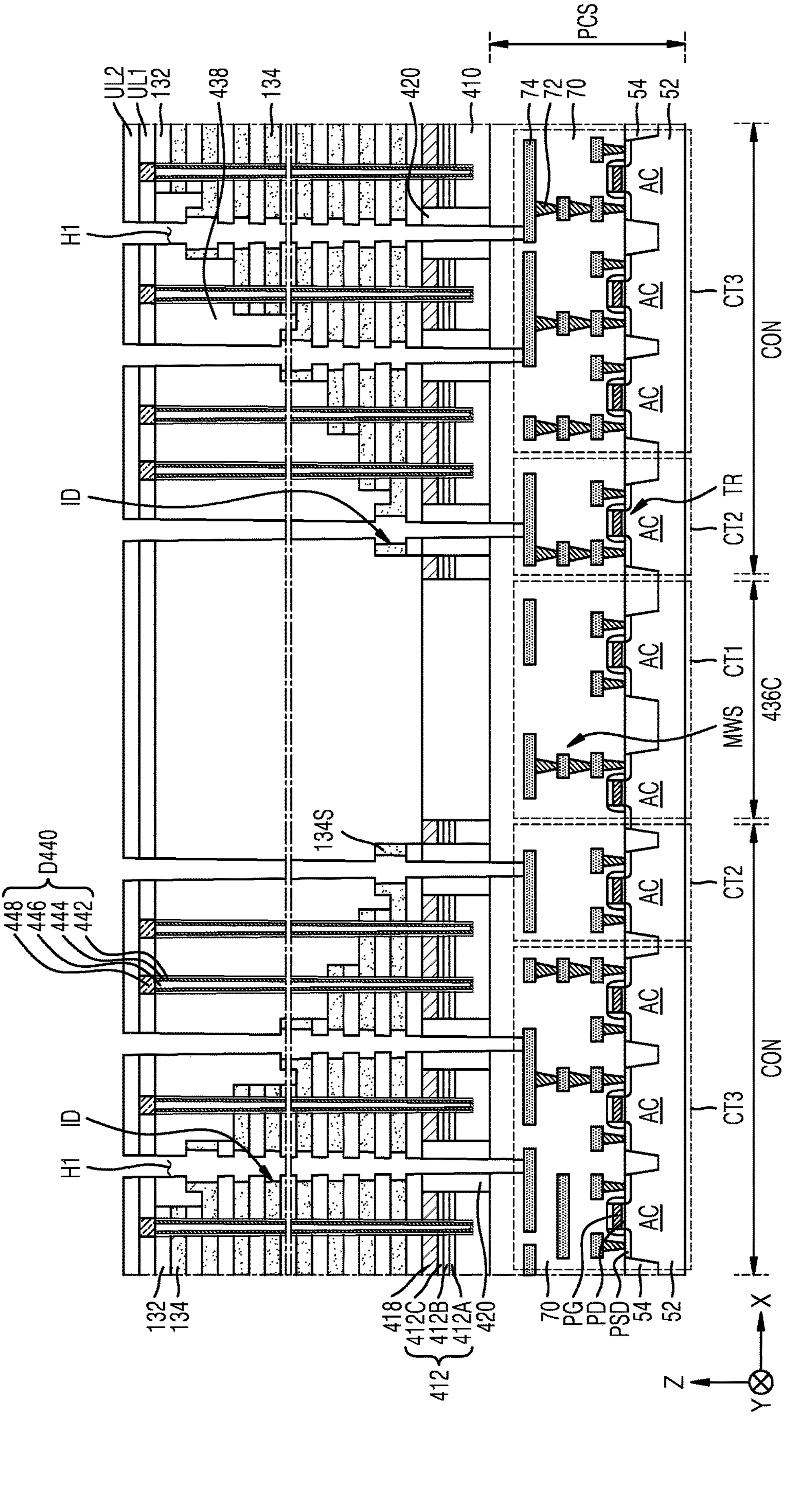

Referring to FIG. 25, after forming the second upper insulating film UL2 on the resulting structures of FIGS. 24 and 24, a plurality of vertical holes H1 may be formed in the connection area CON. A conductive line 74 included in the peripheral circuit structure PCS may be exposed on a bottom surface of each of the plurality of vertical holes H1.

The plurality of vertical holes H1 may penetrate or extend into a second upper insulating film UL2, a first upper insulating film UL1, an interlayer insulating film 438, one sacrificial pad part 134S, a plurality of sacrificial insulating films 134, a plurality of insulating films 132, and an insulating plug 420 in a vertical direction (Z direction).

Thereafter, portions of the sacrificial pad part 134S and the sacrificial insulating film 134 exposed inside each of the plurality of vertical holes H1 are etched to extend the horizontal direction width of each of the plurality of vertical holes H1 at the same vertical level as the sacrificial insulating film 134, so that a plurality of indent spaces ID exposing sidewalls of the sacrificial pad part 134S and the sacrificial insulating film 134 may be formed.

Figure 26:
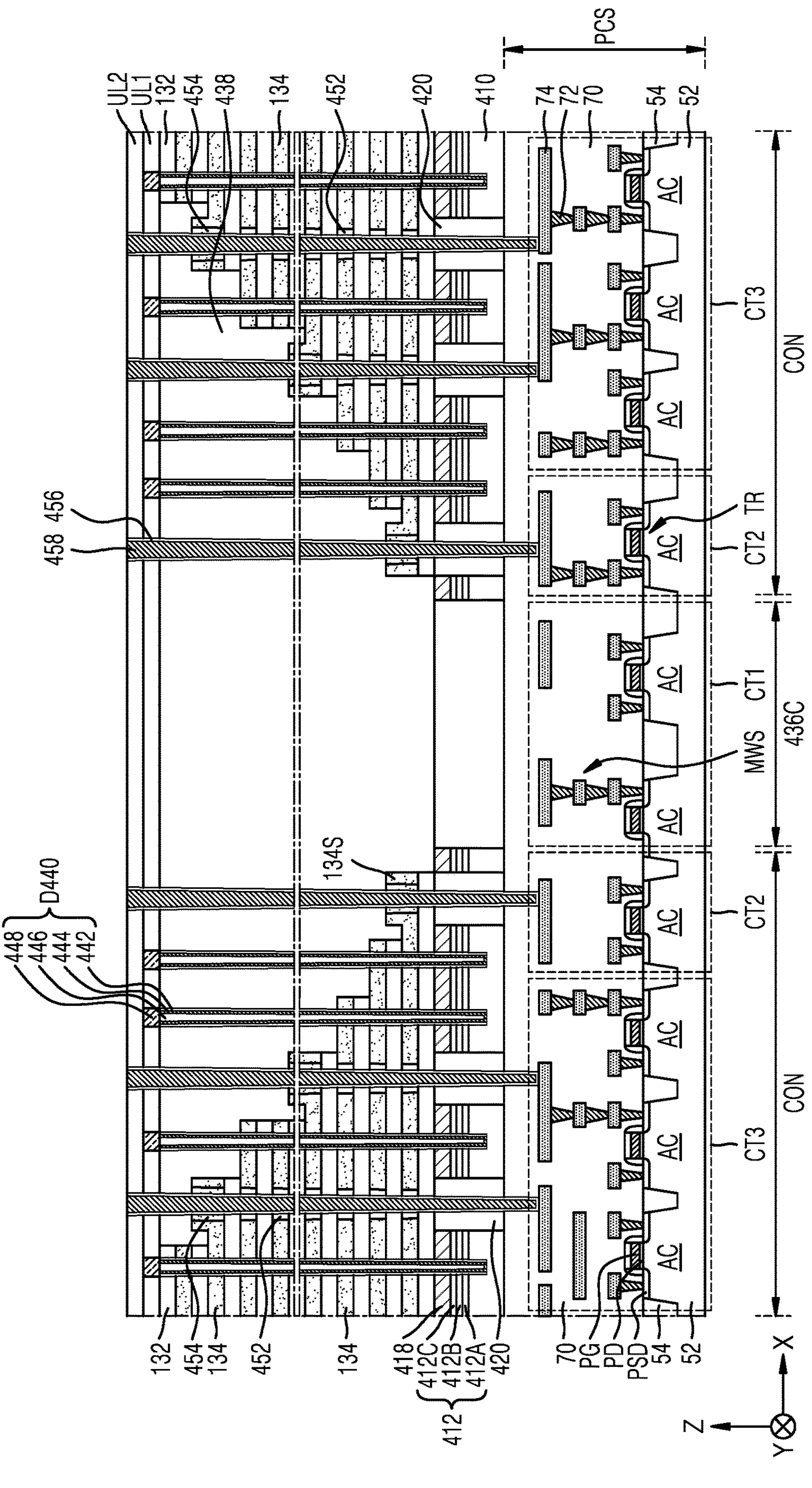

Referring to FIG. 26, in the resulting structure of FIG. 25, the indent space ID exposing the sacrificial insulating film 134 among the plurality of indent spaces ID connected to the plurality of vertical holes H1 may be at least partially filled with the insulating ring 452, and an indent space ID exposing the sacrificial pad part 134S may be at least partially filled with a sacrificial insulating ring 454. The insulating ring 452 may be made of a silicon oxide film. The sacrificial insulating ring 454 may be made of the same material as the sacrificial insulating film 134, for example, a silicon nitride film.

In embodiments, after first forming the insulating ring 452 in the indent space ID exposing the sacrificial insulating film 134 inside the plurality of vertical holes H1, a process of forming the sacrificial insulation ring 454 may be performed in the indent space ID exposing the sacrificial pad part 134S inside each of the plurality of vertical holes H1. In example embodiments, an etch stop insulating liner (not shown) may be disposed between the sacrificial insulating film 134 and the insulating ring 452. The etch stop insulating liner may be made of a silicon nitride film.

Then, the insides of each of the plurality of vertical holes H1 may be at least partially filled with an insulating spacer 456 and a sacrificial plug 458. In example embodiments, the insulating spacer 456 may be made of silicon oxide, and the sacrificial plug 458 may be made of polysilicon, but embodiments of the inventive concept are not limited thereto.

Figure 27A:
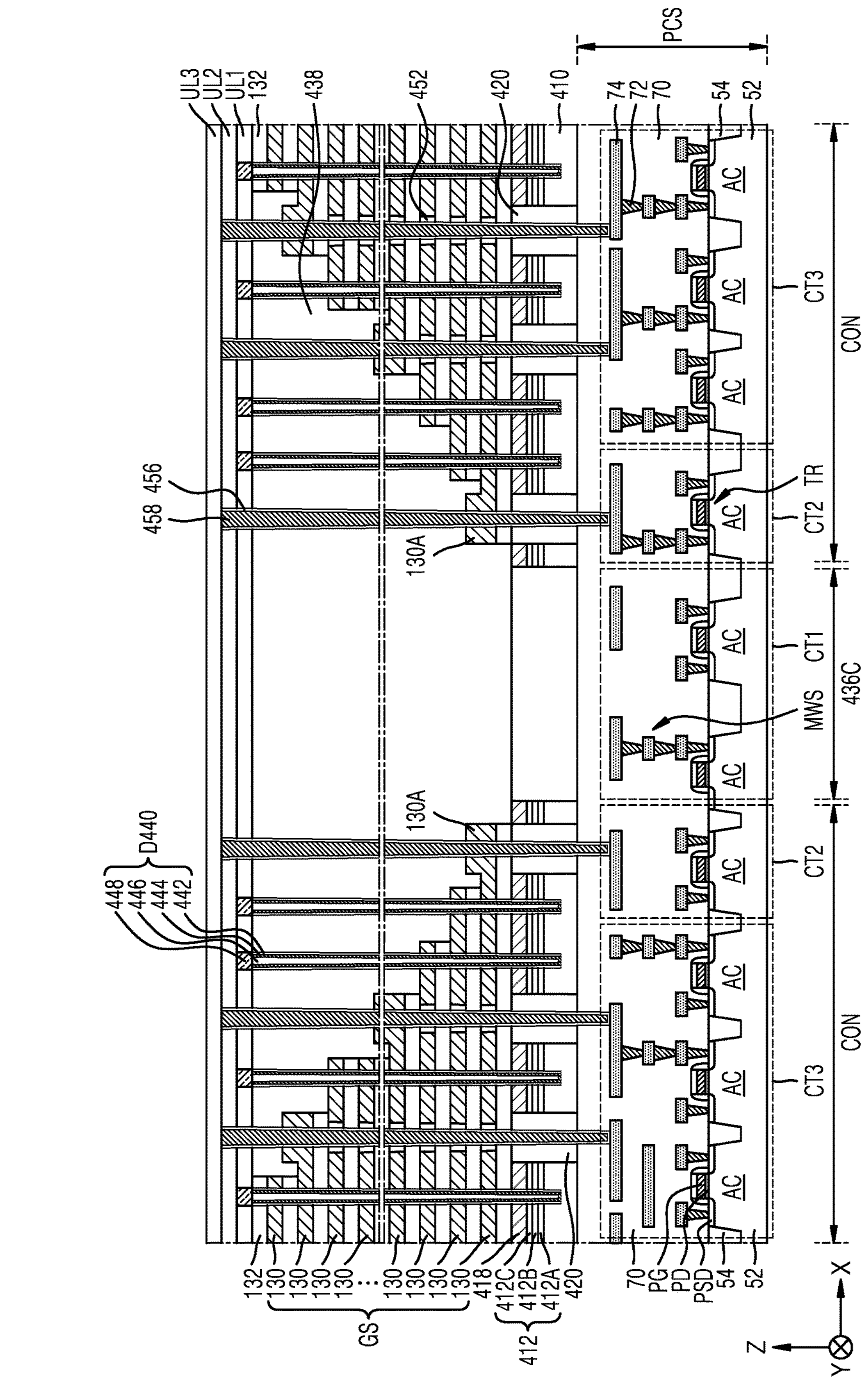
Figure 27B:
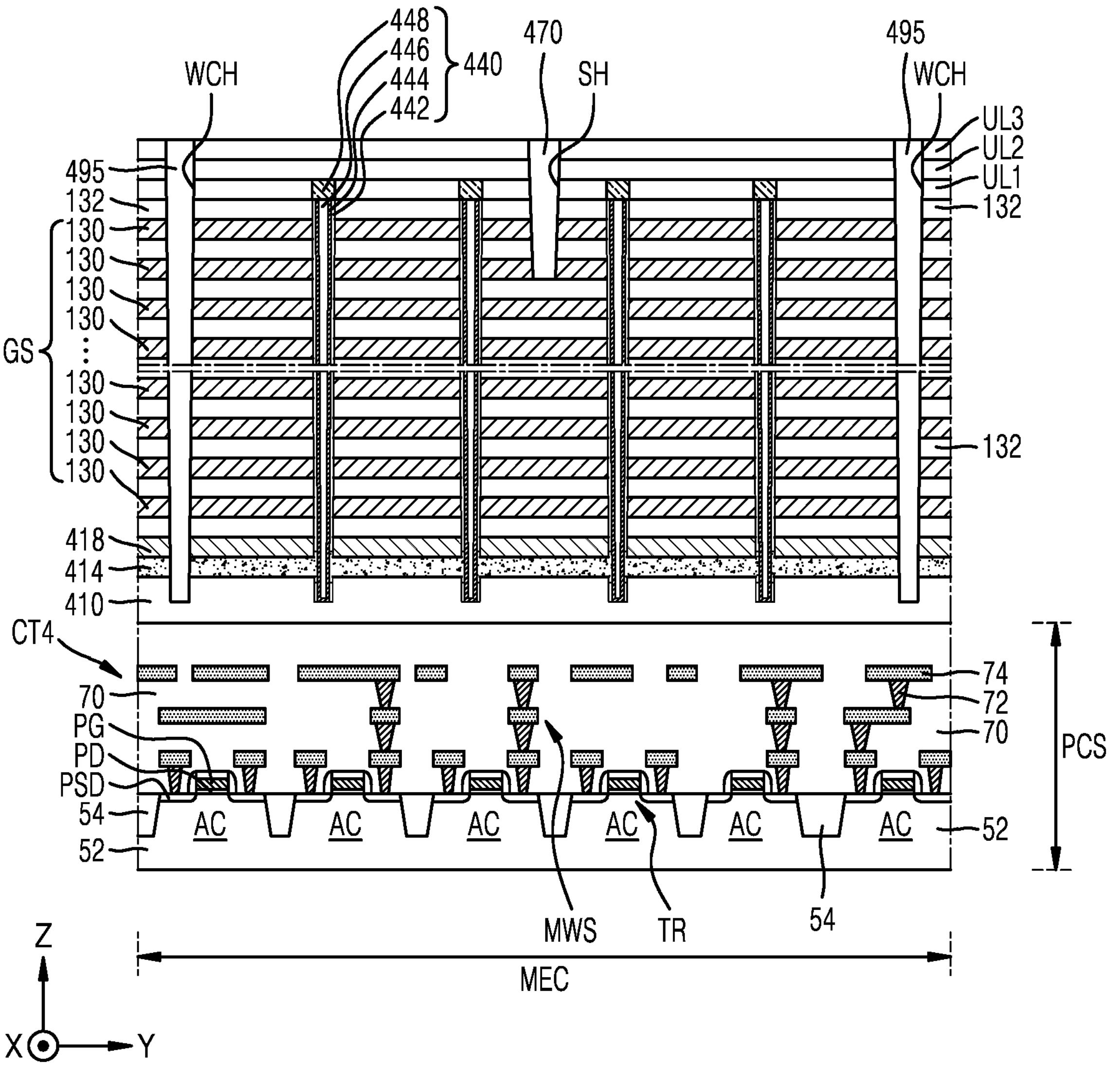

Referring to FIGS. 27A and 27B, a third upper insulating film UL3 at least partially covering upper surfaces of each of the insulating spacer 456, the sacrificial plug 458, and the second upper insulating film UL2 may be formed in the memory cell area MEC, the connection area CON, and the peripheral circuit connection area 436C.

Among the features formed with the third upper insulating film UL3, in the memory cell area MEC, the third upper insulating film UL3, the second upper insulating film UL2, the first upper insulating film UL1, a portion of the plurality of insulating films 132, and a portion of the plurality of sacrificial insulating films 134 may be etched to form a hole SH, and a string select line cut structure 470 at least partially filling the hole SH may be formed.

In the memory cell area MEC and the connection area CON, a plurality of word line cut holes WCH penetrating or extending into the third upper insulating film UL3, the second upper insulating film UL2, the first upper insulating film UL1, the interlayer insulating film 438, the plurality of insulating films 132, the plurality of sacrificial insulating films 134, the second conductive plate 418, and the insulating plate 412 to expose the cell substrate 410 may be formed.

The insulating plate 412 may be selectively removed from the memory cell area MEC among the memory cell area MEC and the connection area CON through the inner space of each of the plurality of word line cut holes WCH, and the empty space formed as a result may be at least partially filled with the first conductive plate 414. While removing the insulating plate 412 from the memory cell area MEC, in the memory cell area MEC, portions of the gate dielectric film 442 included in the channel structure 180 adjacent to the insulating plate 412 may be removed together with the insulating plate 412, and as a result, the first conductive plate 414 may pass or extend through the partial region of the gate dielectric film 442 in a horizontal direction and come into contact with the channel region 444.

In the memory cell area MEC and the connection area CON, a plurality of sacrificial insulating films 134 and sacrificial pad parts 134S (see FIG. 29) may be replaced with a plurality of gate lines 130 through internal spaces of each of the plurality of word line cut holes WCH. A relatively thick end portion obtained by replacing the sacrificial pad part 134S in each of the plurality of gate lines 130 may constitute the gate pad part 130A.

After the first conductive plate 414 and the plurality of gate lines 130 are formed, the plurality of word line cut holes WCH may be at least partially filled with a plurality of word line cut structures 495.

Figure 28:
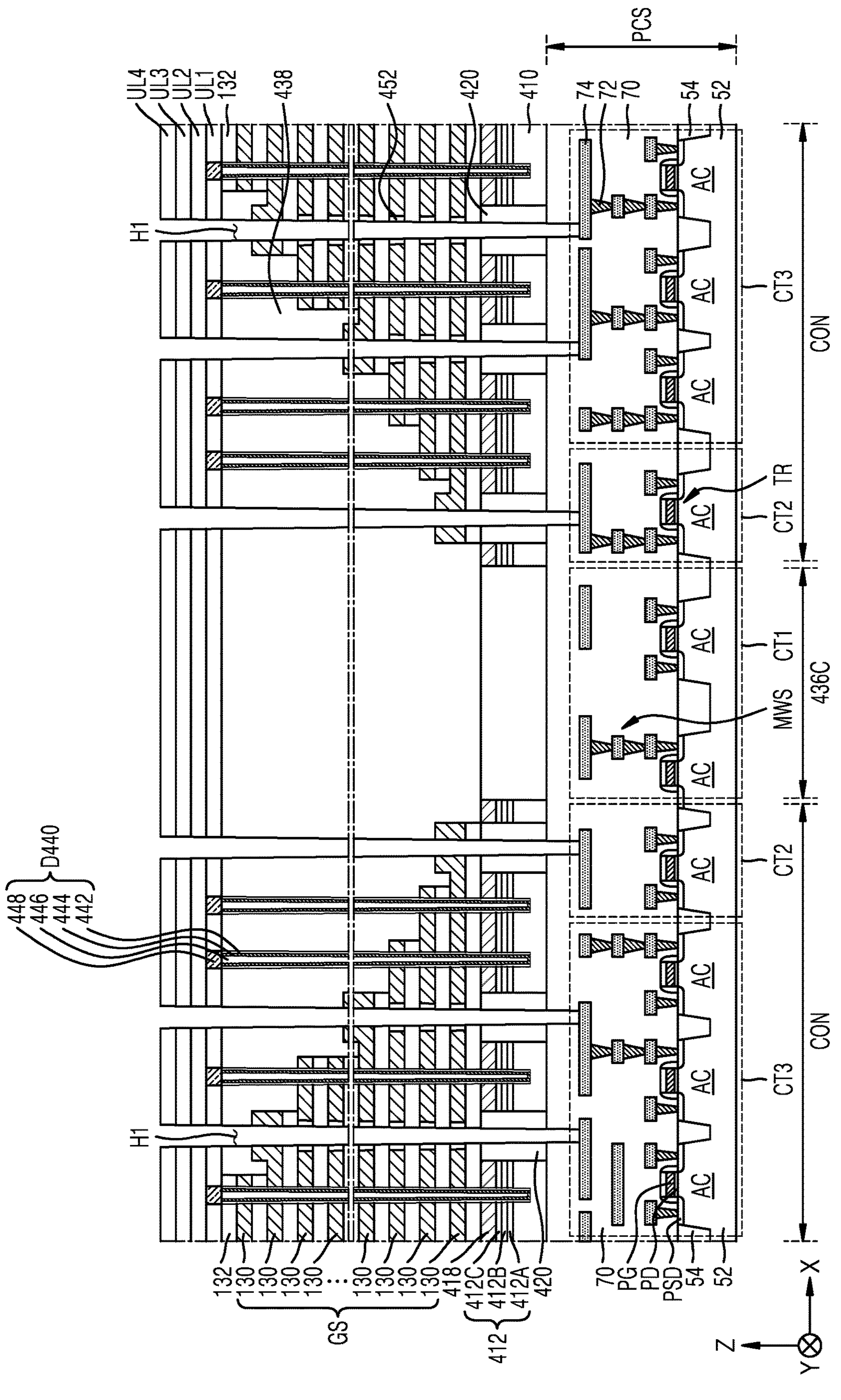

Referring to FIG. 28, after forming a fourth upper insulating film UL4 on the resulting structure of FIGS. 27A and 27B, a portion of each of the fourth upper insulating film UL4 and the third upper insulating film UL3 may be removed to expose the insulating spacer 456 and the sacrificial plug 458. Thereafter, the exposed insulating spacer 456 and the sacrificial plug 458 may be removed, and the plurality of conductive lines 74 included in the peripheral circuit structure PCS may be exposed through the plurality of vertical holes H1.

Figure 29:
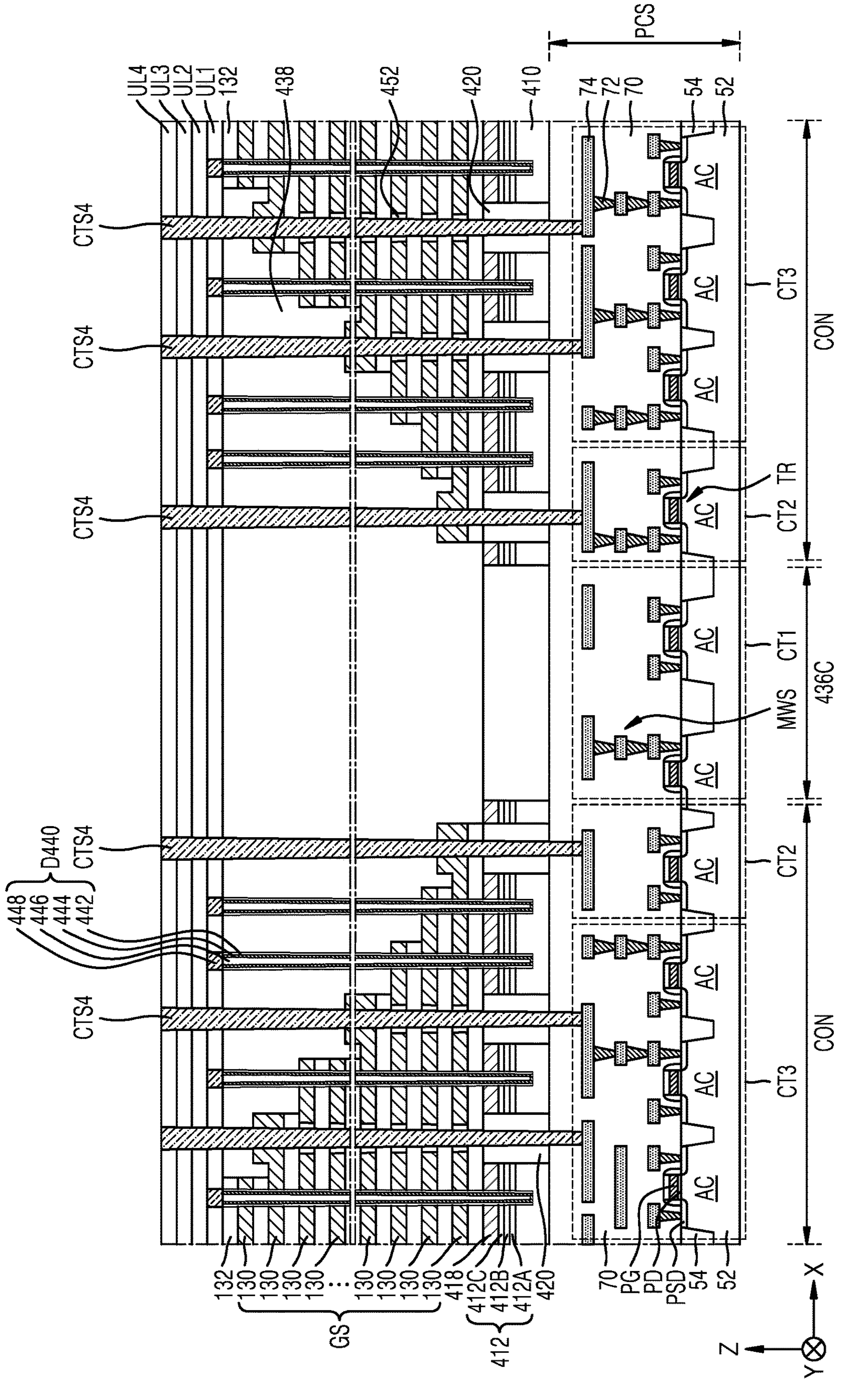

Referring to FIG. 29, a plurality of contact structures CTS4 at least partially filling the plurality of vertical holes H1 (see FIG. 28) may be formed in the connection area CON.

Figure 30:
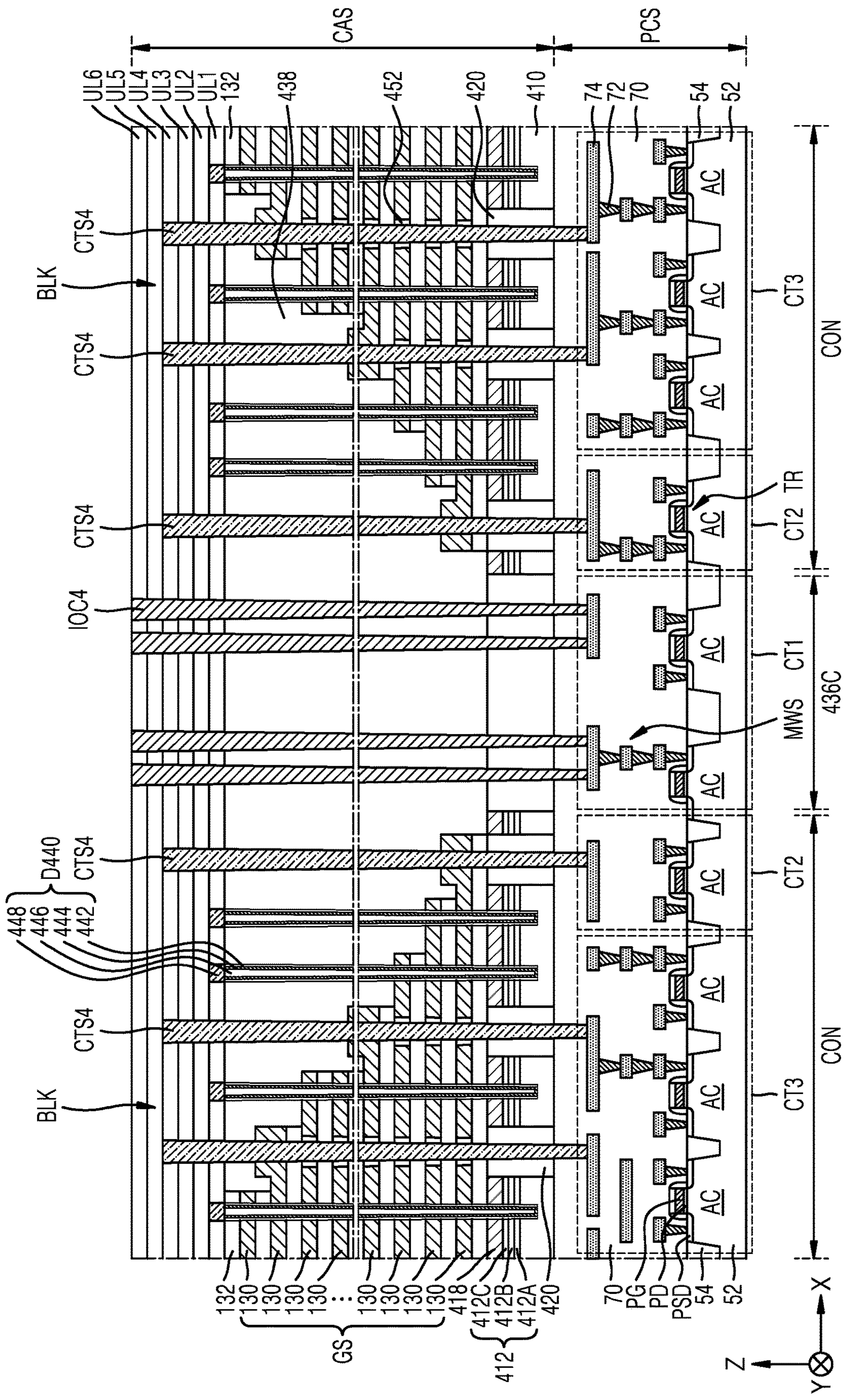

Referring to FIG. 30, a fifth upper insulating film UL5 at least partially covering the memory cell area MEC, the connection area CON, and the peripheral circuit connection area 436C may be formed from the result of FIG. 29, and as illustrated in FIG. 16B, a plurality of contact plugs 476 connected to the drain region 448 of the plurality of channel structures 440 may be formed by penetrating or extending into through the fifth upper insulating film UL5, the fourth upper insulating film UL4, the third upper insulating film UL3, and the second upper insulating film UL2 in the memory cell area MEC.

After that, a plurality of bit lines BL may be formed on the fifth upper insulating film UL5 in the memory cell area MEC, and a sixth upper insulating film UL6 may be formed to at least partially fill a space between each of the plurality of phase bit lines BL.

After that, in the peripheral circuit connection area 436C, insulating structures in the peripheral circuit connection area 436C are etched to form a plurality of contact holes, such that some conductive lines 74 among the plurality of conductive lines 74 included in the peripheral circuit structure PCS may be exposed and a plurality of contact plugs IOC4 at least partially filling the plurality of contact holes may be formed.

Then, as illustrated in FIG. 16A, a plurality of connection pads 492 connected to the plurality of contact plugs IOC4 may be formed in the peripheral circuit connection area 436C.

The manufacturing method of the semiconductor device 100 illustrated in FIGS. 4 to 10 and the semiconductor device 400 illustrated in FIGS. 16A and 16B has been described above with reference to FIGS. 20A to 20K and 21A to 30, and by applying various modifications and changes from the processes described with reference to FIGS. 20A to 20K and 21A to 30 within the scope of various embodiments of the inventive concept. Those skilled in the art will appreciate that the semiconductor devices 100A, 200, and 300 described with reference to FIGS. 13, 14, 15A, and 15B and the semiconductor devices having various structures with various modifications and changes applied thereto may be manufactured from these elements within the scope of various embodiments of the inventive concept.

While the inventive concept has been particularly shown and described with reference to embodiments thereof, it will be understood that various changes in form and details may be made therein without departing from the spirit and scope of the following claims.

What is claimed is:

1. A semiconductor device comprising:

a peripheral circuit structure including a plurality of circuit areas;

a cell array structure including:

a pair of memory cell blocks overlapping the peripheral circuit structure in a first direction and spaced apart in a second direction, perpendicular to the first direction, with a peripheral circuit connection area therebetween in the second direction, wherein the pair of memory cell blocks comprises:

a memory cell area including a plurality of gate lines sequentially stacked along the first direction; and a connection area between the memory cell area and the peripheral circuit connection area in the second direction, the connection area including a plurality of conductive pad areas integrally connected to the plurality of gate lines, wherein the plurality of conductive pad areas have a stepped structure with steps at different positions in the second direction, wherein the plurality of circuit areas comprises a first circuit area that overlaps the peripheral circuit connection area in the first direction; and at least one contact plug extending in the first direction from the peripheral circuit connection area, and including a first end portion configured to connect to at least one circuit included in the first circuit area and facing the first circuit area and a second end portion configured to connect to an external connection terminal, wherein the plurality of conductive pad areas of each of the pair of memory cell blocks decrease in planar area with decreasing distance from the peripheral circuit structure, such that a limited cell connection area is formed between the peripheral circuit structure and the plurality of conductive pad areas, wherein, in each of the pair of memory cell blocks, the memory cell area is spaced apart from the peripheral circuit connection area with the connection area therebetween.

2. The semiconductor device of claim 1, wherein the at least one circuit included in the first circuit area comprises a data input/output circuit.

3. The semiconductor device of claim 1, wherein the plurality of circuit areas further comprise:

a second circuit area adjacent to the first circuit area in the second direction; and a third circuit area adjacent to the second circuit area in the second direction and spaced apart from the first circuit area in the second direction with the second circuit area therebetween, wherein the second circuit area and the third circuit area overlap the connection area of one memory cell block of the pair of memory cell blocks in the first direction, wherein a first one of the second circuit area and the third circuit area comprises a row decoder area, and a second one of the second circuit area and the third circuit area comprises a pass circuit area including a plurality of pass transistors.

4. The semiconductor device of claim 1, wherein the peripheral circuit structure and the pair of memory cell blocks are included in one chip, wherein the first circuit area and the peripheral circuit connection area each extend along a third direction orthogonal to the second direction, from a center area in the second direction of the one chip.

5. The semiconductor device of claim 1, wherein the cell array structure further comprises a first bonding metal pad, wherein the peripheral circuit structure further comprises a second bonding metal pad, wherein the at least one contact plug is configured to connect to the at least one circuit included in the first circuit area through a bonding structure including the first bonding metal pad and the second bonding metal pad.

6. The semiconductor device of claim 1, further comprising:

a pair of common source lines spaced apart from the peripheral circuit structure in the first direction with a memory cell area of each of the pair of memory cell blocks therebetween and spaced apart in the second direction with the peripheral circuit connection area therebetween; and at least one connection pad between the pair of common source lines in the peripheral circuit connection area and connected to the second end portion of the at least one contact plug.

7. The semiconductor device of claim 1, wherein the plurality of circuit areas further comprise a second circuit area on a same level in the first direction as the first circuit area and overlapping the connection area in the first direction, wherein the cell array structure further comprises a plurality of first bonding metal pads, wherein the peripheral circuit structure further comprises a plurality of second bonding metal pads, wherein the at least one contact plug is configured to connect to the at least one circuit included in the first circuit area through a first bonding structure including a first bonding metal pad of the plurality of first bonding metal pads and a first bonding metal pad of the plurality of second bonding metal pads, wherein each of the plurality of gate lines is configured to connect to a circuit in the second circuit area through a second bonding structure including a second bonding metal pad of the plurality of first bonding metal pads and a second bonding metal pad of the plurality of second bonding metal pads.

8. The semiconductor device of claim 1, further comprising at least one through electrode extending in the first direction from the peripheral circuit connection area and extending into the cell array structure and the peripheral circuit structure in the first direction.

9. The semiconductor device of claim 1, wherein the cell array structure further comprises a cell substrate between the pair of memory cell blocks and the peripheral circuit structure, wherein the at least one contact plug is configured to extend through the cell substrate and connect to the at least one circuit included in the first circuit area, wherein the first end portion of the at least one contact plug is in contact with a conductive line included in the first circuit area.

10. A semiconductor device comprising:

a peripheral circuit structure; and a cell array structure overlapping the peripheral circuit structure in a first direction, wherein the peripheral circuit structure comprises a data input/output circuit area extending, from a center area in a second direction of the peripheral circuit structure, along a third direction orthogonal to the second direction, the first direction being orthogonal to the first and second directions, wherein the cell array structure comprises:

a peripheral circuit connection area overlapping the data input/output circuit area in the first direction;

a first memory cell block and a second memory cell block spaced apart in the second direction with the peripheral circuit connection area therebetween in the second direction, wherein the first memory cell block comprises:

a memory cell area including a plurality of gate lines sequentially stacked along the first direction; and a connection area between the memory cell area and the peripheral circuit connection area in the second direction, the connection area including a plurality of conductive pad areas integrally connected to the plurality of gate lines, wherein the plurality of conductive pad areas have a stepped structure with steps at different positions in the second direction; and a plurality of contact plugs extending in the first direction from the peripheral circuit connection area, and each including a first end portion configured to connect to at least one circuit included in the data input/output circuit area and facing the data input/output circuit area and a second end portion configured to connect to an external connection terminal, wherein the data input/output circuit area is a first circuit area, wherein the peripheral circuit structure further comprises:

a pair of second circuit areas spaced apart in the second direction with the data input/output circuit area therebetween; and a pair of third circuit areas spaced apart in the second direction with the data input/output circuit area and the pair of second circuit areas therebetween, wherein the pair of second circuit areas comprise row decoder areas, and wherein the pair of third circuit areas comprise pass circuit areas including a plurality of pass transistors.

11. The semiconductor device of claim 10, wherein the cell array structure further comprises a third memory cell block adjacent to the first memory cell block in the third direction and a fourth memory cell block spaced apart from the third memory cell block in the second direction with the peripheral circuit connection area therebetween, wherein the peripheral circuit connection area extends along the first direction to extend between the first memory cell block and the second memory cell block and between the third memory cell block and the fourth memory cell block.

12. The semiconductor device of claim 10, wherein the second memory cell block comprises: a memory cell area including a plurality of gate lines sequentially stacked in the first direction; and a connection area including a plurality of conductive pad areas integrally connected to the plurality of gate lines, wherein the pair of second circuit areas overlap connection areas of each of the first memory cell block and the second memory cell block in the first direction, wherein the pair of third circuit areas and overlap connection areas of each of the first memory cell block and the second memory cell block in the first direction, wherein the peripheral circuit structure further comprises:

a pair of fourth circuit areas spaced apart in the second direction with the data input/output circuit area, the pair of second circuit areas, and the pair of third circuit areas therebetween and overlapping each of the memory cell areas of the first memory cell block and the second memory cell block in the first direction, and wherein the pair of fourth circuit areas comprise page buffer areas.

13. The semiconductor device of claim 10, wherein the cell array structure further comprises a plurality of first bonding metal pads, wherein the peripheral circuit structure further comprises a plurality of second bonding metal pads constituting a plurality of bonding structures together with the plurality of first bonding metal pads, wherein the plurality of contact plugs are configured to connect to the at least one circuit included in the data input/output circuit area through one bonding structure of the plurality of bonding structures.

14. The semiconductor device of claim 10, wherein the second memory cell block comprises: a memory cell area including a plurality of gate lines sequentially stacked along the first direction; and a connection area including a plurality of conductive pad areas integrally connected to the plurality of gate lines, wherein the plurality of conductive pad areas of each of the first and second memory cell blocks decrease in planar area with decreasing distance from the peripheral circuit structure so that a limited cell connection area is formed between the peripheral circuit structure and the plurality of conductive pad areas, wherein, in each of the first memory cell block and the second memory cell block, the memory cell area is spaced apart from the peripheral circuit connection area with the connection area therebetween.

15. The semiconductor device of claim 10, further comprising:

a first common source line and a second common source line, spaced apart from the peripheral circuit structure in the first direction with a memory cell area of each of the first memory cell block and the second memory cell block therebetween and spaced apart in the second direction with the peripheral circuit connection area therebetween; and a plurality of connection pads between the first common source line and the second common source line in the peripheral circuit connection area and connected to the second end portion of each of the plurality of contact plugs, wherein the plurality of connection pads are arranged at positions spaced apart from the first common source line and the second common source line in the second direction.

16. The semiconductor device of claim 10, further comprising at least one through electrode extending in the first direction from the peripheral circuit connection area and extending into the cell array structure and the peripheral circuit structure in the first direction.

17. The semiconductor device of claim 10, wherein the cell array structure further comprises a cell substrate between the first and second memory cell blocks and the peripheral circuit structure, wherein the plurality of contact plugs are configured to extend through the cell substrate and connect to at least one circuit included in a first circuit area of the peripheral circuit structure, wherein the first end portion of each of the plurality of contact plugs is in contact with a conductive line included in the first circuit area.

18. An electronic system comprising:

a main board;

a semiconductor device on the main board; and a controller electrically connected to the semiconductor device on the main board, wherein the semiconductor device comprises:

a peripheral circuit structure including a plurality of circuit areas;

a cell array structure including a pair of memory cell blocks overlapping the peripheral circuit structure in a first direction and spaced apart in a second direction, perpendicular to the first direction, with a peripheral circuit connection area therebetween, wherein the plurality of circuit areas comprises:

a first circuit area that overlaps the peripheral circuit connection area in the first direction;

a pair of second circuit areas adjacent the first circuit area in the second direction with the first circuit area therebetween in the second direction, each of the pair of second circuit areas including a row decoder area; and a pair of third circuit areas separated from the first circuit area by the pair of second circuit areas, respectively, each of the pair of third circuit areas comprising a pass circuit area comprising a plurality of pass transistors; and at least one contact plug extending in the first direction from the peripheral circuit connection area, and including: a first end portion configured to connect to at least one circuit included in the first circuit area and facing the first circuit area; and a second end portion configured to connect to an external connection terminal.

19. The electronic system of claim 18, wherein the main board further comprises wiring patterns electrically connecting the semiconductor device and the controller to each other, wherein, in the semiconductor device, the peripheral circuit structure and the pair of memory cell blocks are included in one chip, wherein the first circuit area and the peripheral circuit connection area each extend, from a center area in the second direction of the one chip, along a third direction orthogonal to the second direction.

* * * * *